US012363942B2

(12) United States Patent
Fukunishi

(10) Patent No.: US 12,363,942 B2
(45) Date of Patent: Jul. 15, 2025

(54) SEMICONDUCTOR DEVICE AND METHOD FOR MANUFACTURING SEMICONDUCTOR DEVICE

(71) Applicant: ROHM CO., LTD., Kyoto (JP)

(72) Inventor: Junya Fukunishi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 792 days.

(21) Appl. No.: 17/696,278

(22) Filed: Mar. 16, 2022

(65) Prior Publication Data

US 2022/0302301 A1 Sep. 22, 2022

(30) Foreign Application Priority Data

Mar. 22, 2021 (JP) ................................ 2021-047911
Mar. 22, 2021 (JP) ................................ 2021-047912
Mar. 1, 2022 (JP) ................................ 2022-030839

(51) Int. Cl.

| | |
|---|---|
| ***H10D 30/00*** | (2025.01) |
| ***H10D 30/01*** | (2025.01) |
| ***H10D 30/66*** | (2025.01) |

(52) U.S. Cl.
CPC ....... *H10D 30/665* (2025.01); *H10D 30/0297* (2025.01); *H10D 30/668* (2025.01)

(58) Field of Classification Search
CPC ............. H10D 30/668; H10D 30/0297; H10D 30/665; H10D 64/117; H10D 64/513; H10D 64/516; H10D 64/518; H10D 64/519
See application file for complete search history.

(56) References Cited

U.S. PATENT DOCUMENTS

2007/0059887 A1* 3/2007 Poelzl .................. H10D 64/117
438/270
2018/0226480 A1 8/2018 Okuda et al.

FOREIGN PATENT DOCUMENTS

JP 2018129378 8/2018

* cited by examiner

*Primary Examiner* — Reema Patel
(74) *Attorney, Agent, or Firm* — XSENSUS LLP

(57) ABSTRACT

A semiconductor device includes a semiconductor layer, a trench formed in the semiconductor layer and having a side wall and a bottom wall, a field plate electrode formed in the trench, a gate electrode formed in the trench, and an insulation layer that isolates the field plate electrode and the gate electrode from each other and covers the side wall and the bottom wall in the trench. The semiconductor layer includes a drift region and a body region formed on the drift region. An interface of the drift region and the body region lies between a lower end position of the gate electrode and a reference position that is located upward from the lower end position by ⅓ the thickness of the gate electrode in the depth direction.

12 Claims, 40 Drawing Sheets

SEMICONDUCTOR DEVICE AND METHOD FOR MANUFACTURING SEMICONDUCTOR DEVICE

BACKGROUND

1. Field

The following description relates to a semiconductor device and a method for manufacturing a semiconductor device.

2. Description of Related Art

Japanese Laid-Open Patent Publication No. 2018-129378 describes a metal insulator semiconductor field effect transistor (MISFET) having a split-gate structure.

The split-gate structure described in Japanese Laid-Open Patent Publication No. 2018-129378 includes a gate trench formed in a semiconductor layer, an embedded electrode serving as a field plate electrode embedded in the bottom of the gate trench, a gate electrode formed in an upper portion of the gate trench, and an insulation layer isolating the two electrodes in the gate trench. The semiconductor layer of Japanese Laid-Open Patent Publication No. 2018-129378 includes an n+ source region, a p body region, and an n− drift region.

SUMMARY

In a semiconductor device having a split gate structure, a relatively high electric field stress acts on the insulation layer located between the gate electrode and the drift region. Such electric field stress lowers the breakdown voltage of the semiconductor device. Further, the region where the gate electrode and the drift region face each other causes the gate-drain capacitance $C_{gd}$ to become relatively large.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a semiconductor layer, a trench, a filed plate electrode, a gate electrode, and an insulation layer. The semiconductor layer includes a first surface and a second surface opposite to the first surface. The trench is formed in the second surface of the semiconductor layer, includes a side wall and a bottom wall, and extends in a first direction in plan view. The field plate electrode is formed in the trench. The gate electrode is formed in the trench. The gate electrode includes a bottom surface at least partially facing the field plate electrode and having a thickness in a depth direction of the trench. The insulation layer isolates the field plate electrode and the gate electrode from each other and covers the side wall and the bottom wall of the trench. The semiconductor layer includes a drift region of a first conductive type and a body region of a second conductive type formed on the drift region. An interface of the drift region and the body region lies between a lower end position of the gate electrode and a reference position that is located upward from the lower end position by ⅓ the thickness of the gate electrode in the depth direction.

In another general aspect, a method for manufacturing a semiconductor device includes forming a semiconductor layer including a first surface and a second surface opposite to the first surface, forming a trench in the second surface of the semiconductor layer that includes a side wall and a bottom wall and extends in a first direction in plan view, forming a field plate electrode in the trench, forming a gate electrode in the trench that includes a bottom surface at least partially facing the field plate electrode and has a thickness in a depth direction of the trench, and forming an insulation layer that isolates the field plate electrode and the gate electrode from each other and covers the side wall and the bottom wall in the trench. The forming the semiconductor layer includes forming a drift region of a first conductive type and forming a body region of a second conductive type on the drift region. The forming the body region includes forming the body region so that an interface of the drift region and the body region lies between a lower end position of the gate electrode and a reference position that is located upward from the lower end position by ⅓ the thickness of the gate electrode in the depth direction.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art In this specification, "at least one of A and B" should be understood to mean "only A, only B, or both A and B."

Several embodiments of a semiconductor device in accordance with the present disclosure will now be described with reference to the accompanying drawings. Elements in the figures are illustrated for simplicity and clarity and have not necessarily been drawn to scale. To facilitate understanding, hatching lines may not be shown in the cross-sectional drawings. The accompanying drawings illustrate exemplary embodiments in accordance with the present disclosure and are not intended to limit the present disclosure.

First Embodiment

Figure 1:
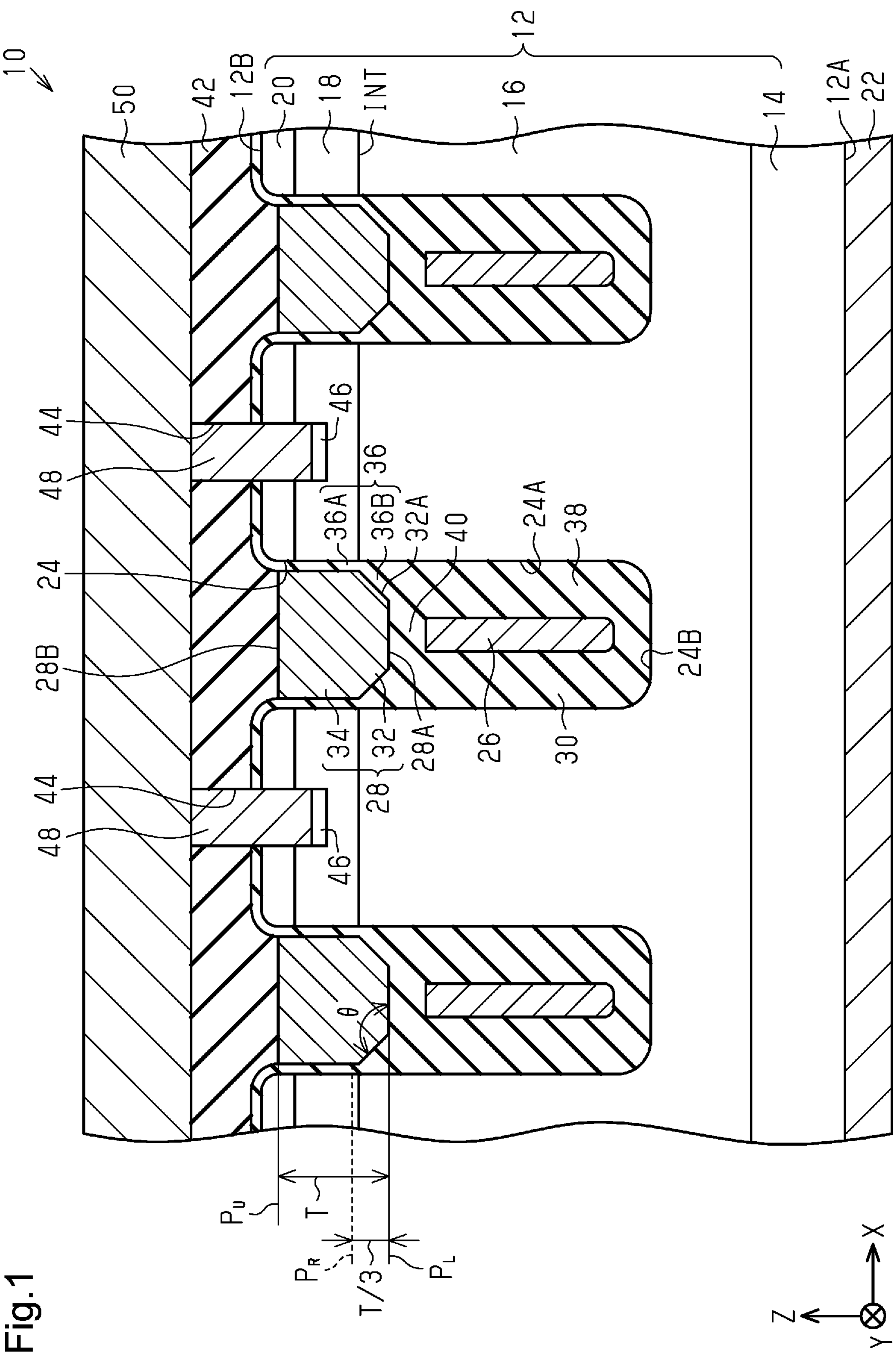
FIG. 1 is a schematic cross-sectional view of an exemplary semiconductor device in accordance with a first embodiment.

FIG. 1 is a schematic cross-sectional view showing an exemplary semiconductor device 10 in accordance with a first embodiment. In this specification, the X-axis, Y-axis, and Z-axis are orthogonal to one another as shown in FIG. 1. The term "plan view" as used in this specification is a view of the semiconductor device 10 taken in the Z-axis direction. Further, in FIG. 1 showing the semiconductor device 10, the +Z-axis direction corresponds to the upward direction, the −Z-axis direction corresponds to the downward direction, the +X-axis direction corresponds to the rightward direction, and the −X-axis direction corresponds to the leftward direction. Unless otherwise indicated, the term "plan view" will refer to a view taken from above along the Z-axis of the semiconductor device 10.

The semiconductor device 10 is, for example, a MISFET having a split-gate structure. The semiconductor device 10 includes a semiconductor layer 12. In the present embodiment, the semiconductor layer 12 is formed from silicon (Si). The semiconductor layer 12 includes a first surface 12A and a second surface 12B opposite to the first surface 12A. Further, the semiconductor layer 12 has a thickness in a direction orthogonal to the first surface 12A (i.e., Z-axis direction in FIG. 1).

The semiconductor layer 12 includes a drain region 14 that includes the first surface 12A, a drift region 16 formed on the drain region 14, a body region 18 formed on the drift region 16, and a source region 20 formed on the body region 18 and including the second surface 12B.

In the present embodiment, the drain region 14 is formed by a Si substrate. Further, the drift region 16, the body region 18, and the source region 20 are formed by a Si epitaxial layer.

The drain region 14 is an n-type region including an n-type impurity. The drain region 14 may have an n-type impurity concentration of $1\times10^{18}$ $cm^{-3}$ or greater and $1\times10^{20}$ $cm^{-3}$ or less. The drain region 14 may have a thickness of 50 μm or greater and 450 μm or less.

The drift region 16 is an n-type region including an n-type impurity at a lower concentration than the drain region 14. The drift region 16 may have an n-type impurity concentration of $1\times10^{15}$ $cm^{-3}$ or greater and $1\times10^{18}$ $cm^{-3}$ or less. The drift region 16 may have a thickness of 1 μm or greater and 25 μm or less.

The body region 18 is a p-type region including a p-type impurity. The body region 18 may have a p-type impurity concentration of $1\times10^{16}$ $cm^{-3}$ or greater and $1\times10^{18}$ $cm^{-3}$ or less. The body region 18 may have a thickness of 0.5 μm or greater and 1.5 μm or less.

The source region 20 is an n-type region including an n-type impurity at a higher concentration than the drift region 16. The source region 20 may have an n-type impurity concentration of $1\times10^{19}$ $cm^{-3}$ or greater and $1\times10^{21}$ $cm^{-3}$ or less. The source region 20 may have a thickness of 0.1 μm or greater and 1 μm or less.

In the present disclosure, n-type is referred to as a first conductive type and p-type is referred to as a second conductive type. The n-type impurity may be, for example, phosphorus (P), arsenic (As), or the like. The p-type impurity may be, for example, boron (B), aluminum (Al), or the like.

The semiconductor device 10 further includes a drain electrode 22 formed on the first surface 12A of the semiconductor layer 12. The drain electrode 22 is electrically connected to the drain region 14. The drain electrode 22 may be formed from at least one of titanium (Ti), nickel (Ni), gold (Au), silver (Ag), copper (Cu), Al, a Cu alloy, and an Al alloy.

The semiconductor device 10 further includes a trench 24 formed in the second surface 12B of the semiconductor layer 12. Each trench 24 includes a side wall 24A and a bottom wall 24B and extends in a first direction (Y-axis direction in FIG. 1) in plan view. The trench 24 has a width in a second direction (X-axis direction in FIG. 1) that is orthogonal to the first direction in plan view. The trench 24 extends through the source region 20 and the body region 18 to the drift region 16 in the semiconductor layer 12. Accordingly, the bottom wall 24B of the trench 24 is adjacent to the drift region 16. The trench 24 may have a depth of 1 μm or greater and 10 μm or less. In FIG. 1, the depth direction of the trench 24 corresponds to the Z-axis direction. The second direction (X-axis direction) is orthogonal to both of the first direction (Y-axis direction) and the depth direction of the trench 24 (Z-axis direction).

FIG. 1 shows the side wall 24A of the trench 24 extending in a direction substantially orthogonal to the first surface 12A and the second surface 12B of the semiconductor layer 12. Nevertheless, the side wall 24A does not have to extend in a direction substantially orthogonal to the first surface 12A and the second surface 12B of the semiconductor layer 12. For example, the trench 24 may be narrowed toward the bottom wall 24B. Further, FIG. 1 shows the bottom wall 24B of the trench 24 extending in a direction substantially parallel to the first surface 12A and the second surface 12B of the semiconductor layer 12. However, the bottom wall 24B does not necessarily have to be flat and may be, for example, partially or entirely curved.

The trench 24 may be one of a plurality of trenches formed in the second surface 12B of the semiconductor layer 12. The trenches may be arranged in a striped array in plan view. Although the description hereafter will focus on the structure of a single trench 24, the description will be applicable to the structure of each one of the trenches.

The semiconductor device 10 includes a field plate electrode 26 formed in the trench 24, a gate electrode 28 formed in the trench 24, and an insulation layer 30 that isolates the field plate electrode 26 and the gate electrode 28 from each other and covers the side wall 24A and the bottom wall 24B in the trench 24. The gate electrode 28 is located upward from the field plate electrode 26 in the trench 24.

The field plate electrode 26 is located between the bottom wall 24B of the trench 24 and a bottom surface 28A of the gate electrode 28 in the trench 24. The field plate electrode 26 is surrounded by the insulation layer 30. As shown in the example of FIG. 1, the field plate electrode 26 may have a dimension in the X-axis direction that is smaller than that of the gate electrode 28. Source voltage may be applied to the field plate electrode 26 to reduce electric field concentration in the trench 24 and increase the breakdown voltage of the semiconductor device 10. Accordingly, the potential at the field plate electrode 26 may be the same as that at the source region 20.

The gate electrode 28 includes the bottom surface 28A that at least partially faces the field plate electrode 26. The gate electrode 28 includes an upper surface 28B opposite to the bottom surface 28A. The upper surface 28B of the gate electrode 28 may be located downward from the second surface 12B of the semiconductor layer 12.

The gate electrode 28 has a thickness T in the depth direction of the trench 24 (Z-axis direction in FIG. 1). The thickness T of the gate electrode 28 may be defined as the distance between a lower end position $P_L$ and an upper end position Pu of the gate electrode 28 in the depth direction of the trench 24. When the bottom surface 28A of the gate electrode 28 is a flat surface that is orthogonal to the depth direction of the trench 24, the lower end position $P_L$ of the gate electrode 28 is located substantially along the same plane as the bottom surface 28A of the gate electrode 28. That is, the lower end position $P_L$ of the gate electrode 28 is where the bottom surface 28A of the gate electrode 28 is located.

In the same manner, when the upper surface 28B of the gate electrode 28 is a flat surface that is orthogonal to the Z-axis direction, the upper end position Pu of the gate electrode 28 is located substantially along the same plane as the upper surface 28B of the gate electrode 28. That is, the upper end position Pu of the gate electrode 28 is where the upper surface 28B of the gate electrode 28 is located. Accordingly, as shown in the example of FIG. 1, when the bottom surface 28A and the upper surface 28B of the gate electrode 28 are substantially flat, the thickness T corresponds to the distance between the bottom surface 28A and the upper surface 28B.

In another example, at least one of the bottom surface 28A and the upper surface 28B of the gate electrode 28 may be curved. When the bottom surface 28A is curved, the lower end position $P_L$ is where the bottom surface 28A is the closest to the field plate electrode 26 or the bottom wall 24B of the trench 24 in the depth direction of the trench 24. When the upper surface 28B is curved, the upper end position Pu is where the upper surface 28B is the closest to the second surface 12B of the semiconductor layer 12 in the depth direction of the trench 24.

Regardless of how the bottom surface 28A and the upper surface 28B are shaped, the upper end position Pu of the gate electrode 28 is where the lower end position $P_L$ is the farthest in the depth direction of the trench 24. In the same manner, the lower end position $P_L$ of the gate electrode 28 is where the upper end position Pu is the farthest in the depth direction of the trench 24.

The gate electrode 28 includes a bottom portion 32 including the bottom surface 28A and a main portion 34 formed on the bottom portion 32. The gate electrode 28 has a width in the second direction (X-axis direction in FIG. 1) that is orthogonal to the depth direction of the trench 24 and the first direction. The bottom portion 32 is narrower than the main portion 34. In the present embodiment, the main portion 34 may have a substantially constant width in the depth direction of the trench 24. In contrast, the bottom portion 32 may be narrowed in the second direction toward the bottom wall 24B of the trench 24.

The bottom portion 32 of the gate electrode 28 includes side surfaces 32A that are continuous with the bottom surface 28A. Each side surface 32A may be angled by more than 90° from the bottom surface 28A (refer to angle θ in FIG. 1). Preferably, the side surface 32A is angled by 115° or greater and 155° or less from the bottom surface 28A, and, further preferably, approximately 135° as shown in the example of FIG. 1. In this manner, when the side surfaces 32A of the bottom portion 32 are angled by more than 90° from the bottom surface 28A, the bottom portion 32 of the gate electrode 28 is narrowed toward the bottom wall 24B of the trench 24.

In one example, the field plate electrode 26 and the gate electrode 28 are formed from conductive polysilicon.

The insulation layer 30 includes a gate insulator 36 that is located between the gate electrode 28 and the semiconductor layer 12 and covers the side wall 24A in the trench 24. As shown in FIG. 1, the gate insulator 36 isolates the gate electrode 28 and the semiconductor layer 12 in the X-axis direction. A predetermined voltage is applied to the gate electrode 28 to form a channel in the p-type body region 18 that is adjacent to the gate insulator 36. The semiconductor device 10 allows for control of the flow of electrons in the Z-axis direction through the channel between the n-type source region 20 and the n-type drift region 16.

The gate insulator 36 includes a first portion 36A, formed between the body region 18 and the main portion 34 of the gate electrode 28, and a second portion 36B, adjacent to the bottom portion 32 of the gate electrode 28. The second portion 36B is thicker than the first portion 36A on the side wall 24A of the trench 24. As shown in the example of FIG. 1, the first portion 36A may have a substantially constant thickness on the side wall 24A of the trench 24. In contrast, the second portion 36B may be thicker than the first portion 36A on the side wall 24A of the trench 24 and thicken toward the bottom wall 24B of the trench 24. In this specification, the thickness of the insulation layer 30 on the side wall 24A refers to the dimension of the insulation layer 30 in a direction that is substantially orthogonal to the side wall 24A. When the side wall 24A of the trench 24 extends in a direction substantially orthogonal to the first surface 12A and the second surface 12B of the semiconductor layer 12, the thickness of the insulation layer 30 on the side wall 24A corresponds to the dimension of the insulation layer 30 in the second direction. Accordingly, the second portion 36B is thicker than the first portion 36A in the second direction.

The insulation layer 30 further includes a lower insulator 38, located between the field plate electrode 26 and the semiconductor layer 12 and covering the side wall 24A and the bottom wall 24B in the trench 24, and an intermediate insulator 40, located between the field plate electrode 26 and the gate electrode 28 in the depth direction of the trench 24. The lower insulator 38 may be thicker than the gate insulator 36 on the side wall 24A of the trench 24. In one example, the insulation layer 30 may be formed by a film of silicon oxide ($SiO_2$).

With further reference to FIG. 1, the location of an interface INT of the drift region 16 and the body region 18 with respect to the gate electrode 28 will now be described.

The interface INT of the drift region 16 and the body region 18 lies between the lower end position $P_L$ of the gate electrode 28 and a reference position PR that is located upward from the lower end position $P_L$ by ⅓ the thickness T of the gate electrode 28 in the depth direction of the trench 24 (Z-axis direction).

In this manner, the interface INT of the drift region 16 and the body region 18 is located at a relatively low position within the range of the thickness T of the gate electrode 28. Thus, the interface of the drift region 16 and the gate insulator 36 has a relatively small area. In contrast, the interface of the body region 18 and the gate insulator 36 has a relatively large area.

As shown in the example of FIG. 1, the second portion 36B of the gate insulator 36 is adjacent to the drift region 16 but does not have to be adjacent to the body region 18. In this case, the interface INT of the drift region 16 and the body region 18 is located at substantially the same position as an upper end of the side surface 32A of the bottom portion 32 of the gate electrode 28 in the depth direction of the trench 24. The upper end of the side surface 32A corresponds to where the lower end of the side surface of the main portion 34 is connected. In this case, the body region 18 is adjacent to the first portion 36A of the gate insulator 36, which has a substantially constant thickness, but is not adjacent to the second portion 36B, which is thicker than the first portion 36A.

The semiconductor device 10 further includes an interlayer insulation layer 42 that covers the second surface 12B of the semiconductor layer 12 and the upper surface 28B of the gate electrode 28. Although not shown in the drawings, a cap insulation layer may be formed between the interlayer insulation layer 42 and the upper surface 28B of the gate electrode 28.

The semiconductor device 10 further includes contact trenches 44, a contact region 46 that is adjacent to the bottom wall of each contact trench 44, a source contact 48 embedded in each contact trench 44, and a source interconnect 50. The contact trench 44 extends through the interlayer insulation layer 42, the insulation layer 30, and the source region 20 to the body region 18. The contact region 46 is formed by performing selective ion implantation of a p-type impurity in the body region 18 from the bottom wall of the contact trench 44. The contact region 46 is a p-type region including a p-type impurity. The contact region 46 may have a p-type impurity concentration of $1\times10^{19}$ $cm^{-3}$ or greater and $1\times10^{21}$ $cm^{-3}$ or less, which is higher than that of the body region 18. The source interconnect 50, which covers the interlayer insulation layer 42, is electrically connected to the source contact 48.

Figure 2:
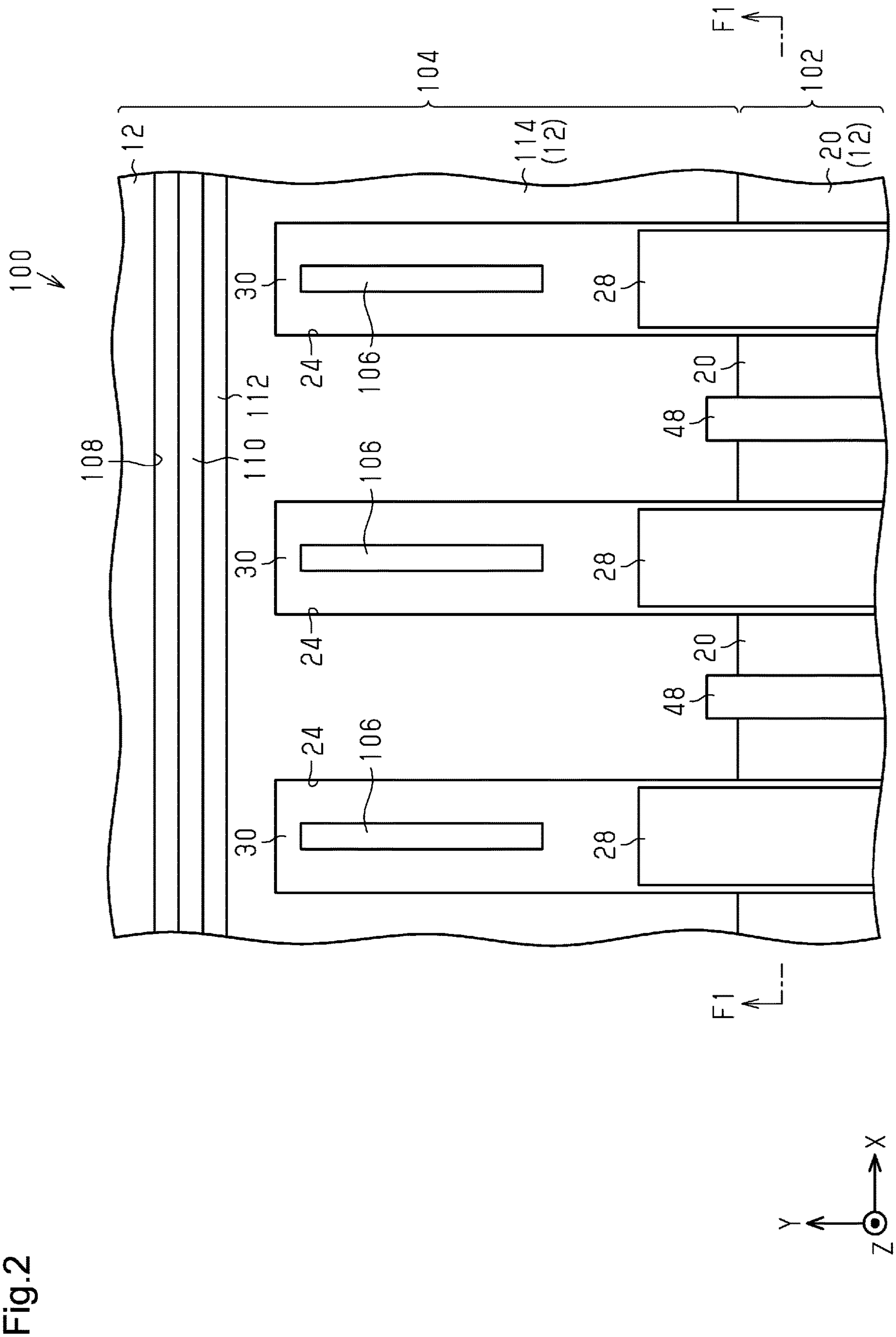
FIG. 2 is a schematic plan view showing an exemplary formation pattern of the semiconductor device shown in FIG. 1.

FIG. 2 is a schematic plan view showing an exemplary formation pattern 100 of the semiconductor device 10 illustrated in FIG. 1. The formation pattern 100 corresponds to the semiconductor device 10 and is taken along a plane including the upper surface 28B of the gate electrode 28 shown in FIG. 1. To facilitate understanding, in FIG. 2, same reference characters are given to those elements that are the same as the corresponding elements shown in FIG. 1.

The formation pattern 100 includes an active region 102, which forms a MISFET having a split-gate structure, and a non-active region 104. FIG. 1 is a cross-sectional view of the semiconductor device 10 taken along the active region 102 on line F1-F1. Each trench 24 in the non-active region 104 has an end in the Y-axis direction where a first electrode 106, which is connected to the field plate electrode 26 of the active region 102, extends from the bottom part to the open part of the trench 24. Source voltage may be applied to the field plate electrode 26 by the first electrode 106. A trench 108 is formed in the edge of the non-active region 104. A second electrode 110 and an insulation layer 112 are embedded in the trench 108. In the non-active region 104, the semiconductor layer 12 located between the trench 108 and the trenches 24 includes a p-type region 114.

Figure 3:
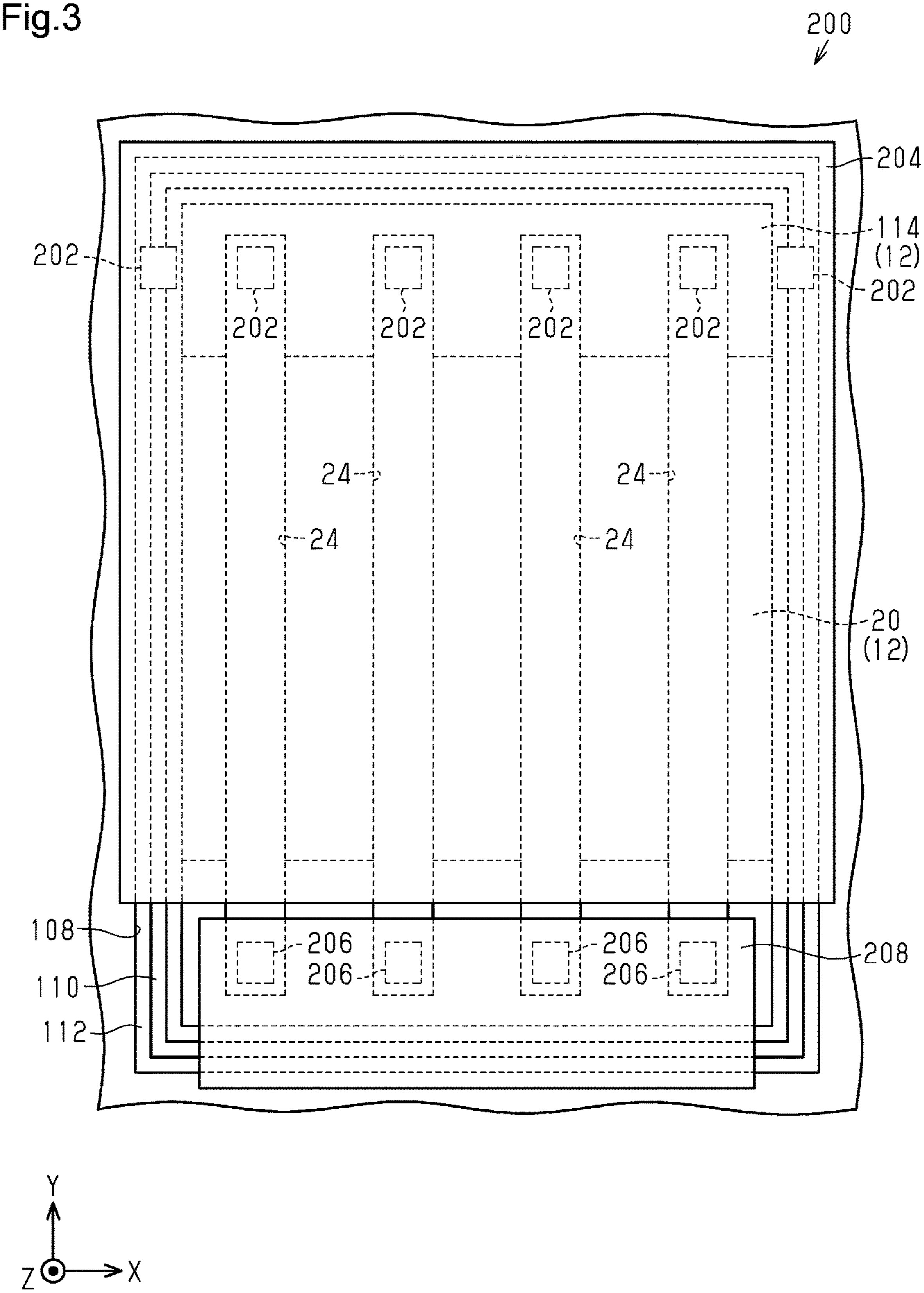
FIG. 3 is a schematic top view of an exemplary formation pattern of the semiconductor device shown in FIG. 1.

FIG. 3 is a schematic top view of an exemplary formation pattern 200 of the semiconductor device 10 shown in FIG. 1. To facilitate understanding, in FIG. 3, same reference characters are given to those elements that are the same as the corresponding elements shown in FIGS. 1 and 2. Further, elements located below a source interconnect 204 and a gate interconnect 208 and an interconnect insulation layer formed between the source interconnect 204 and the gate interconnect 208 are not shown in the drawings for the sake of brevity.

FIG. 3 shows a formation pattern 200 including the trenches 24, which are in a striped array, and the trench 108, which surrounds the trenches 24. The trench 108 may have the form of a rectangular frame surrounding the trenches 24 in plan view. In this case, the trench 108 may include two portions that extend in the X-axis direction and two portions that extend in the Y-axis direction and connect the two portions extending in the X-axis direction. The trenches 24 and the trench 108 are partially covered by the source interconnect 204 and the gate interconnect 208, which is separated from the source interconnect 204. The source interconnect 204 may be arranged to at least cover the entire source region 20. The first electrode 106 (refer to FIG. 2), which is located toward one of the ends in each trench 24, is connected by a source contact 202 to the source interconnect 204. In the same manner, the second electrode 110 in the trench 108 is also connected by source contacts 202 to the source interconnect 204. The gate electrode 28 (refer to FIGS. 1 and 2) that is located toward the other one of the ends in each trench 24 is connected by a gate contact 206 to the gate interconnect 208.

One example of a method for manufacturing the semiconductor device 10 of FIG. 1 will now be described.

FIGS. 4 to 18 are schematic cross-sectional views illustrating exemplary manufacturing steps of the semiconductor device 10. To facilitate understanding, in FIGS. 4 to 18, same reference characters are given to those elements that are the same as the corresponding elements shown in FIG. 1.

The method for manufacturing the semiconductor device 10 includes forming the semiconductor layer 12 that includes the first surface 12A and the second surface 12B opposite to the first surface 12A.

Figure 4:
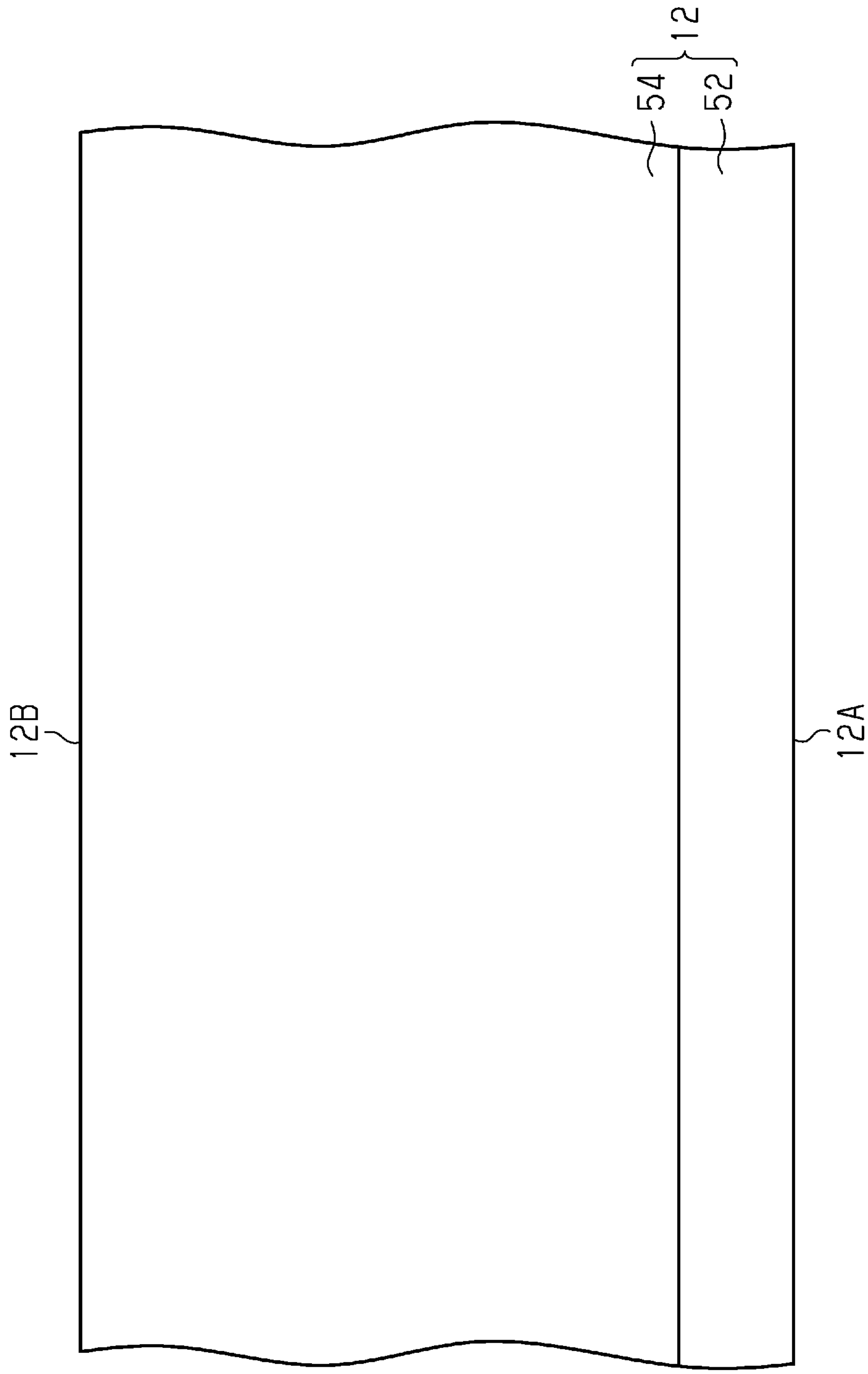
FIG. 4 is a schematic cross-sectional view illustrating an exemplary manufacturing step of the semiconductor device shown in FIG. 1.

As shown in FIG. 4, the semiconductor layer 12 is formed including, for example, a semiconductor substrate 52, which is, for example, a Si substrate, and an epitaxial layer 54, which is formed on the semiconductor substrate 52. The semiconductor substrate 52 may be a Si substrate including an n-type impurity. The epitaxial layer 54 may be an n-type Si layer obtained through epitaxial growth on the semiconductor substrate 52 by doping an n-type impurity. The semiconductor layer 12 includes the first surface 12A and the second surface 12B opposite to the first surface 12A. The semiconductor substrate 52 includes the first surface 12A of the semiconductor layer 12, and the epitaxial layer 54 includes the second surface 12B of the semiconductor layer 12.

The method for manufacturing the semiconductor device 10 further includes forming the trench 24 in the second surface 12B of the semiconductor layer 12 that includes the side wall 24A and the bottom wall 24B and extends in the first direction in plan view.

Figure 5:
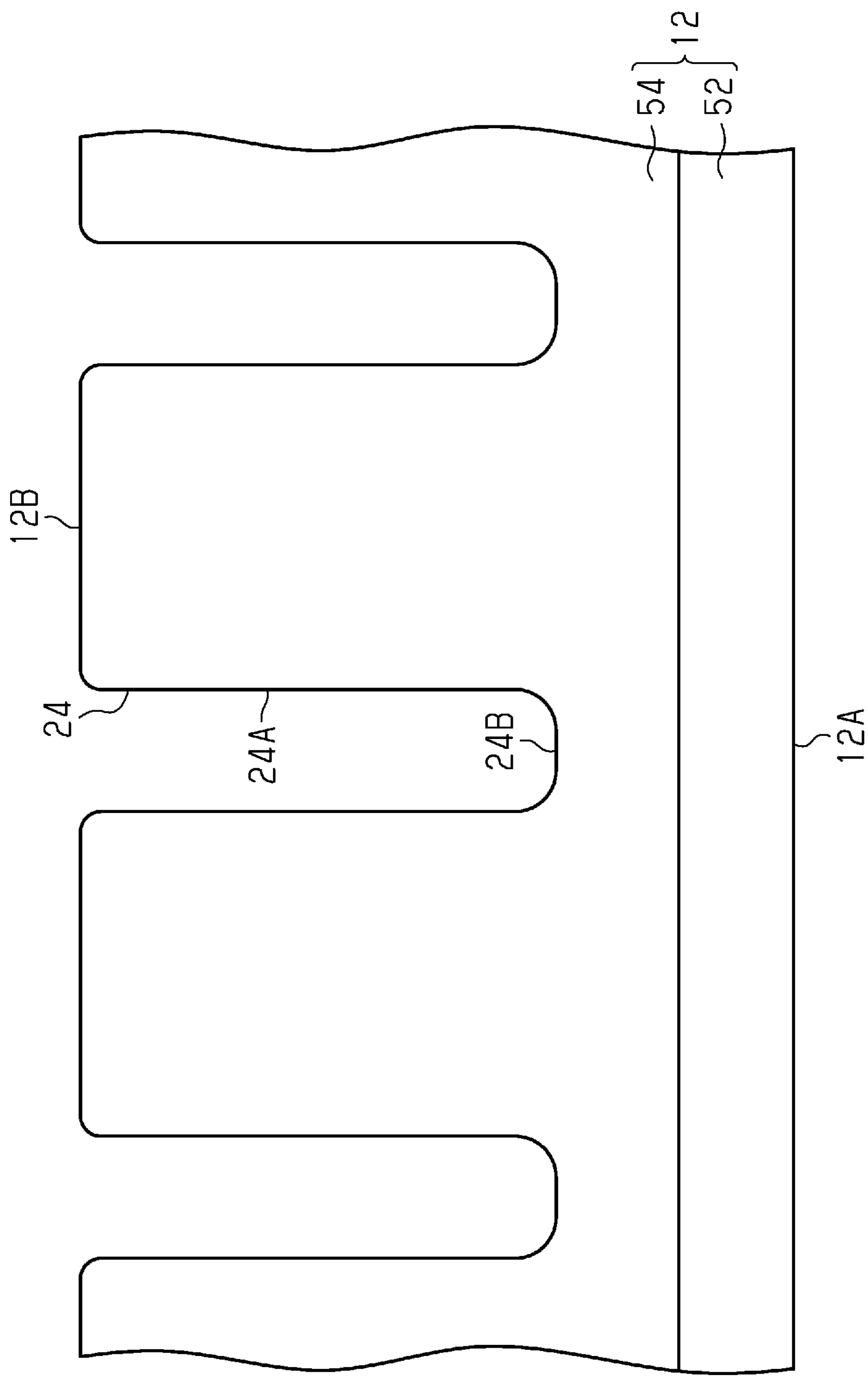
FIG. 5 is a schematic cross-sectional view illustrating a manufacturing step following the step of FIG. 4.

FIG. 5 is a schematic cross-sectional view illustrating a manufacturing step following the step of FIG. 4. As shown in FIG. 5, parts of the epitaxial layer 54 are selectively removed to form the trenches 24 in the second surface 12B of the semiconductor layer 12. In further detail, a mask (not shown) having a predetermined pattern is formed on the second surface 12B of the semiconductor layer 12, and etching is performed through the mask to selectively remove parts of the epitaxial layer 54. Each trench 24 includes the side wall 24A and the bottom wall 24B and extends in the first direction in plan view.

The method for manufacturing the semiconductor device 10 further includes forming the field plate electrode 26 in the trench 24, forming the gate electrode 28 in the trench 24 that includes the bottom surface 28A at least partially facing the field plate electrode 26 and has the thickness T in the depth direction of the trench 24, and forming the insulation layer 30 that isolates the field plate electrode 26 and the gate electrode 28 and covers the side wall 24A and the bottom wall 24B in the trench 24.

Figure 6:
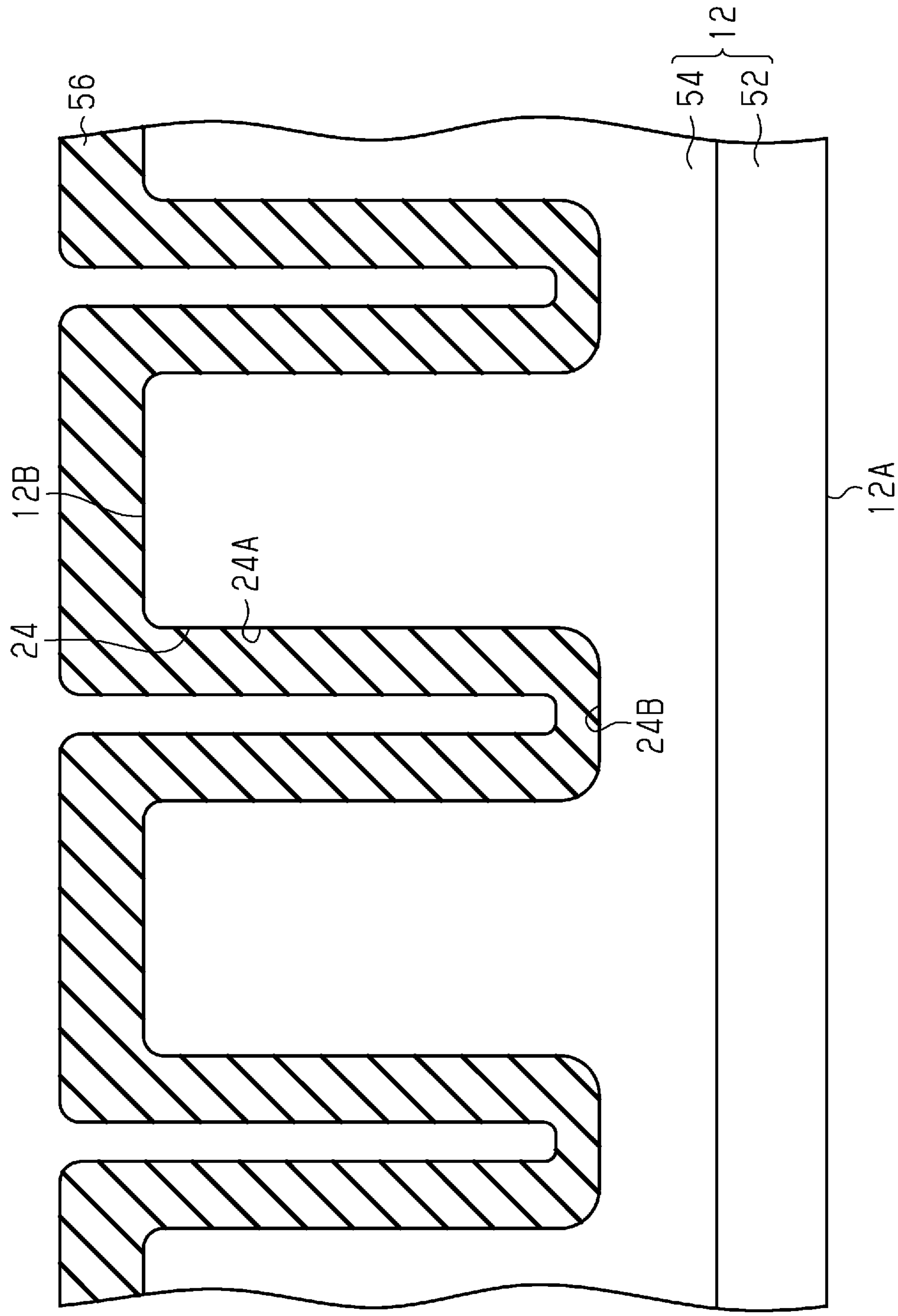
FIG. 6 is a schematic cross-sectional view illustrating a manufacturing step following the step of FIG. 5.

FIG. 6 is a schematic cross-sectional view illustrating a manufacturing step following the step of FIG. 5. As shown in FIG. 6, a first insulation layer 56 is formed on the second surface 12B of the semiconductor layer 12 and the trenches 24. The first insulation layer 56 is formed along the second surface 12B of the semiconductor layer 12 and the side wall 24A and the bottom wall 24B of each trench 24. In one example, the first insulation layer 56 is formed from Sift through thermal oxidation. In a further example, the first insulation layer 56 may be formed through chemical vapor deposition (CVD).

Figure 7:
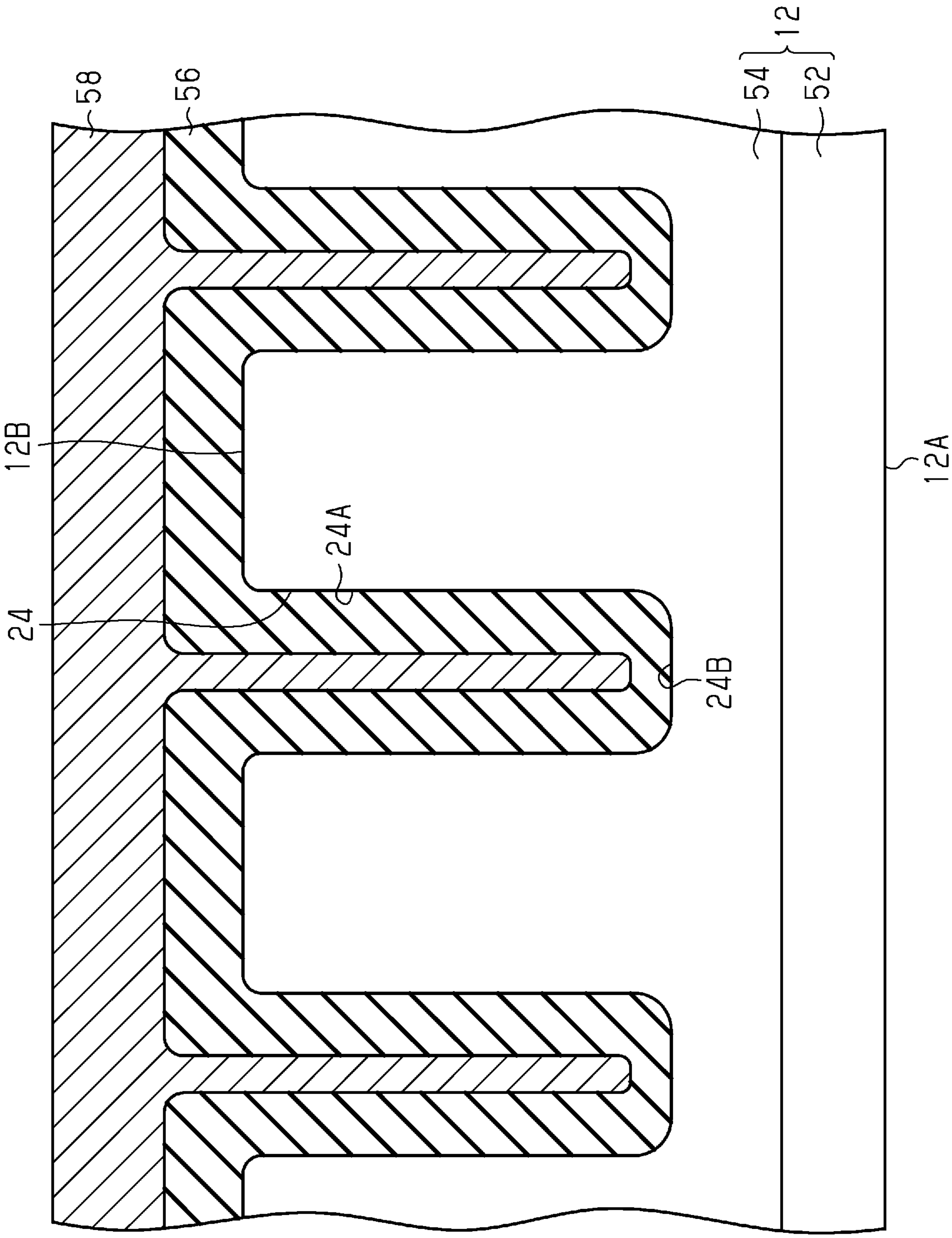
FIG. 7 is a schematic cross-sectional view illustrating a manufacturing step following the step of FIG. 6.

FIG. 7 is a schematic cross-sectional view illustrating a manufacturing step following the step of FIG. 6. As shown in FIG. 7, a first conductive layer 58 is formed on the first insulation layer 56. The first conductive layer 58 may be formed from, for example, polysilicon, which is conductive. The trenches 24 are filled with the first insulation layer 56 and the first conductive layer 58, which is formed on the first insulation layer 56.

Figure 8:
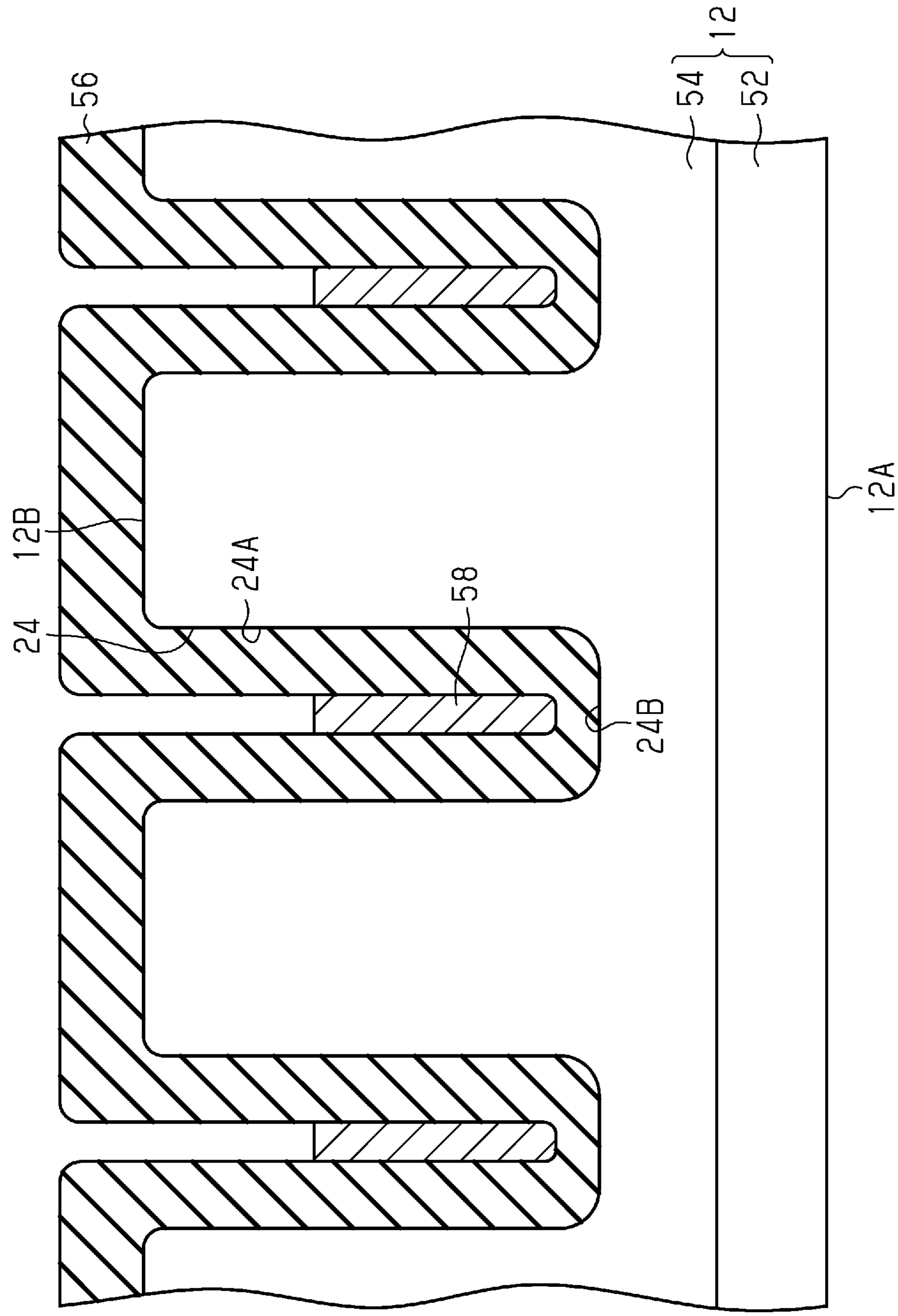
FIG. 8 is a schematic cross-sectional view illustrating a manufacturing step following the step of FIG. 7.

FIG. 8 is a schematic cross-sectional view illustrating a manufacturing step following the step of FIG. 7. As shown in FIG. 8, parts of the first conductive layer 58 are removed. The first conductive layer 58 is etched to expose the first insulation layer 56 that covers the second surface 12B of the semiconductor layer 12, and arrange the surface of the first conductive layer 58 in each trench 24 at a given position in the trench 24 in the depth direction.

Figure 9:
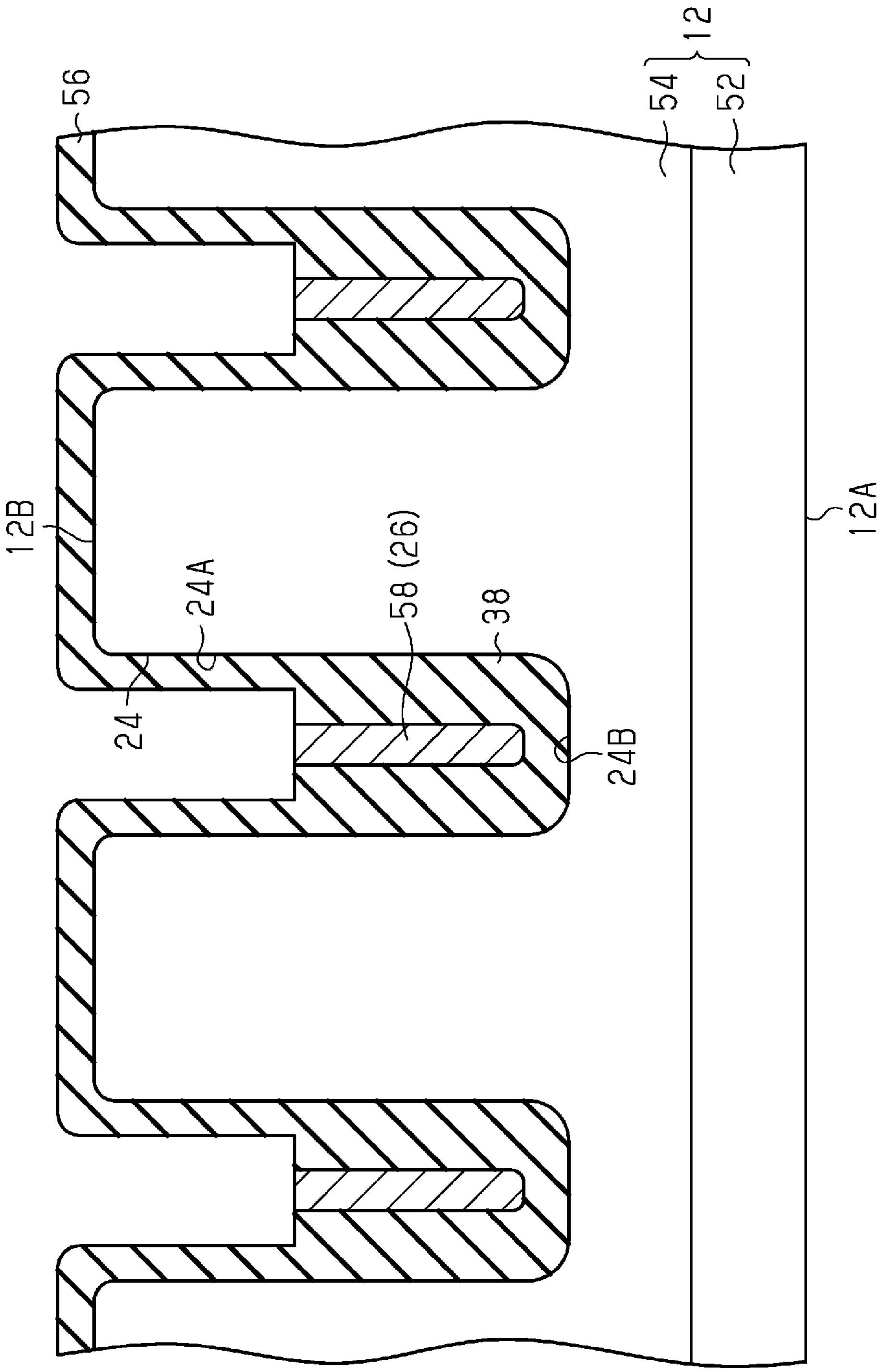
FIG. 9 is a schematic cross-sectional view illustrating a manufacturing step following the step of FIG. 8.

FIG. 9 is a schematic cross-sectional view illustrating a manufacturing step following the step of FIG. 8. As shown in FIG. 9, parts of the first insulation layer 56 and the first conductive layer 58 are removed. In further detail, etching is performed so that the first insulation layer 56 remains on the second surface 12B of the semiconductor layer 12, on the side wall 24A of each trench 24, and in a lower portion of the trench 24. Then, an upper portion of the first conductive layer 58 projecting out of the first insulation layer 56 is removed. As a result, the exposed surface of the first insulation layer 56 becomes flush with the exposed surface of the first conductive layer 58 in each trench 24. This forms the field plate electrode 26 and the lower insulator 38.

Figure 10:
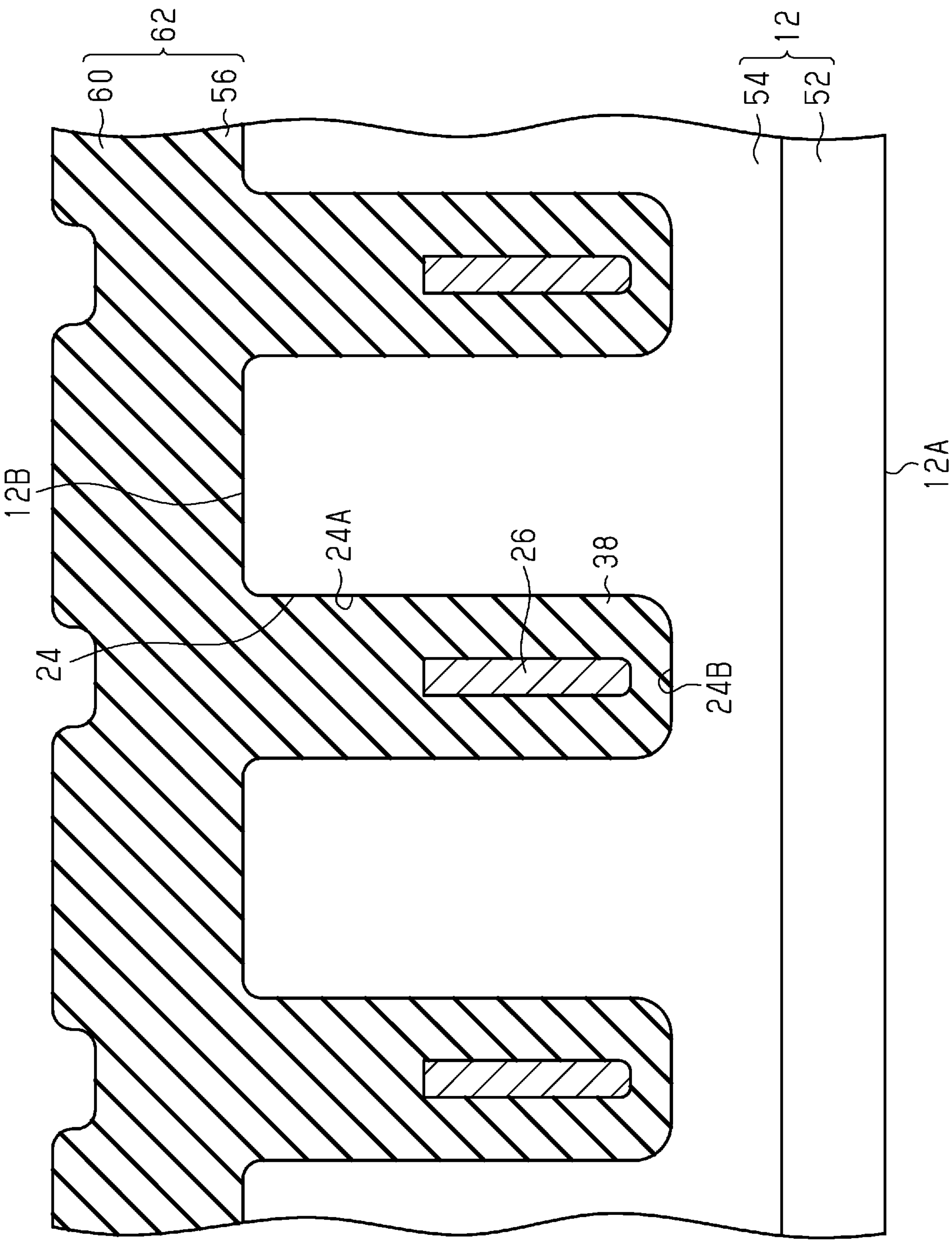
FIG. 10 is a schematic cross-sectional view illustrating a manufacturing step following the step of FIG. 9.

FIG. 10 is a schematic cross-sectional view illustrating a manufacturing step following the step of FIG. 9. As shown in FIG. 10, a second insulation layer 60 is formed on the first insulation layer 56 and the first conductive layer 58. The second insulation layer 60, which covers the first insulation layer 56 and the field plate electrode 26, is embedded in the trench 24. The second insulation layer 60 is formed from $SiO_2$ in the same manner as the first insulation layer 56. In one example, the second insulation layer 60 is formed from $SiO_2$ through CVD. This fills the trenches 24 with a composite insulation layer 62 including the first insulation layer 56 and the second insulation layer 60 that are formed through different film formation processes.

Figure 11:
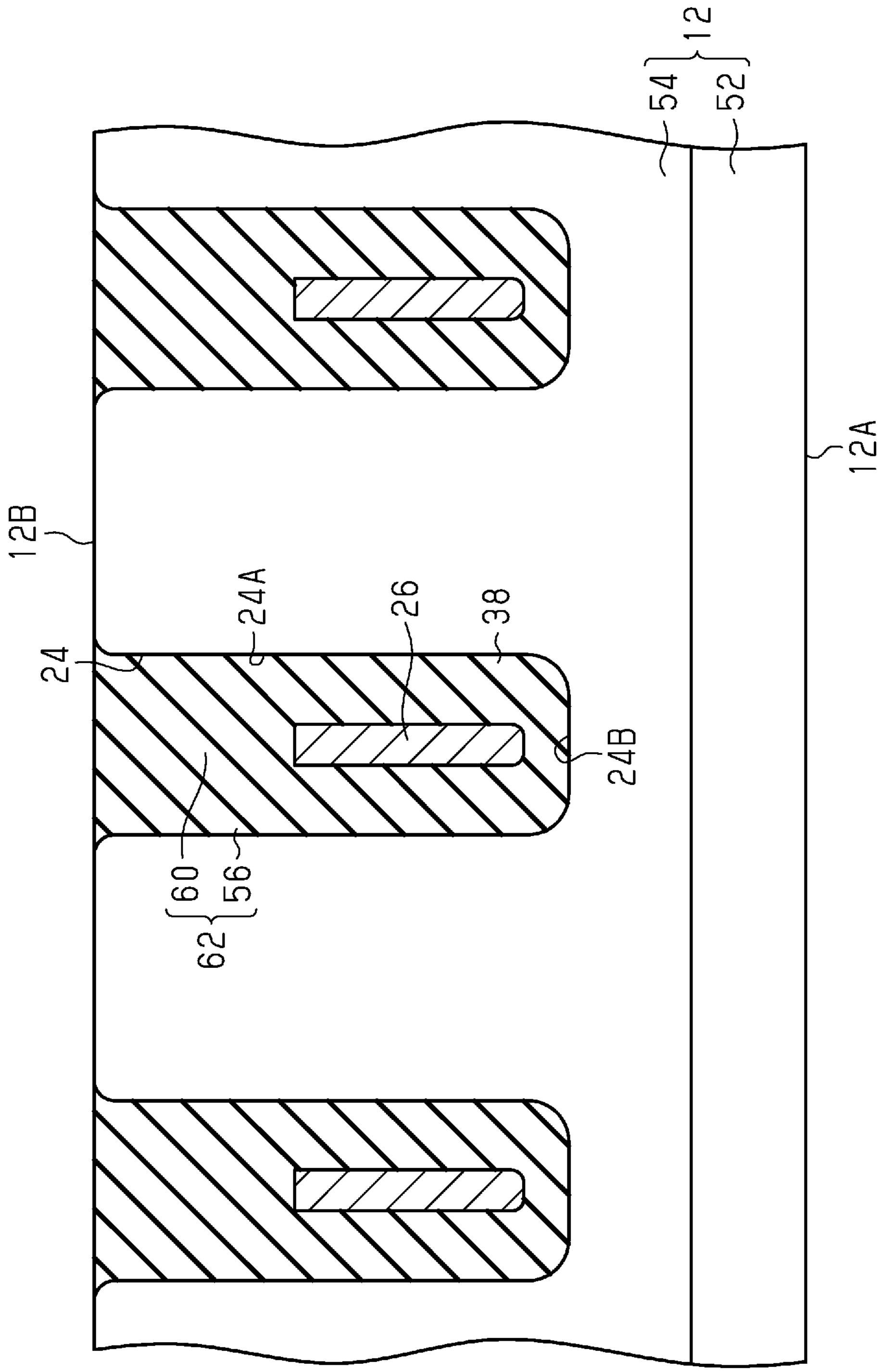
FIG. 11 is a schematic cross-sectional view illustrating a manufacturing step following the step of FIG. 10.

FIG. 11 is a schematic cross-sectional view illustrating a manufacturing step following the step of FIG. 10. As shown in FIG. 11, the composite insulation layer 62 outside the trenches 24 is removed. In further detail, the composite insulation layer 62 is flattened through chemical-mechanical polishing and then etched to expose the second surface 12B of the semiconductor layer 12.

Figure 12:
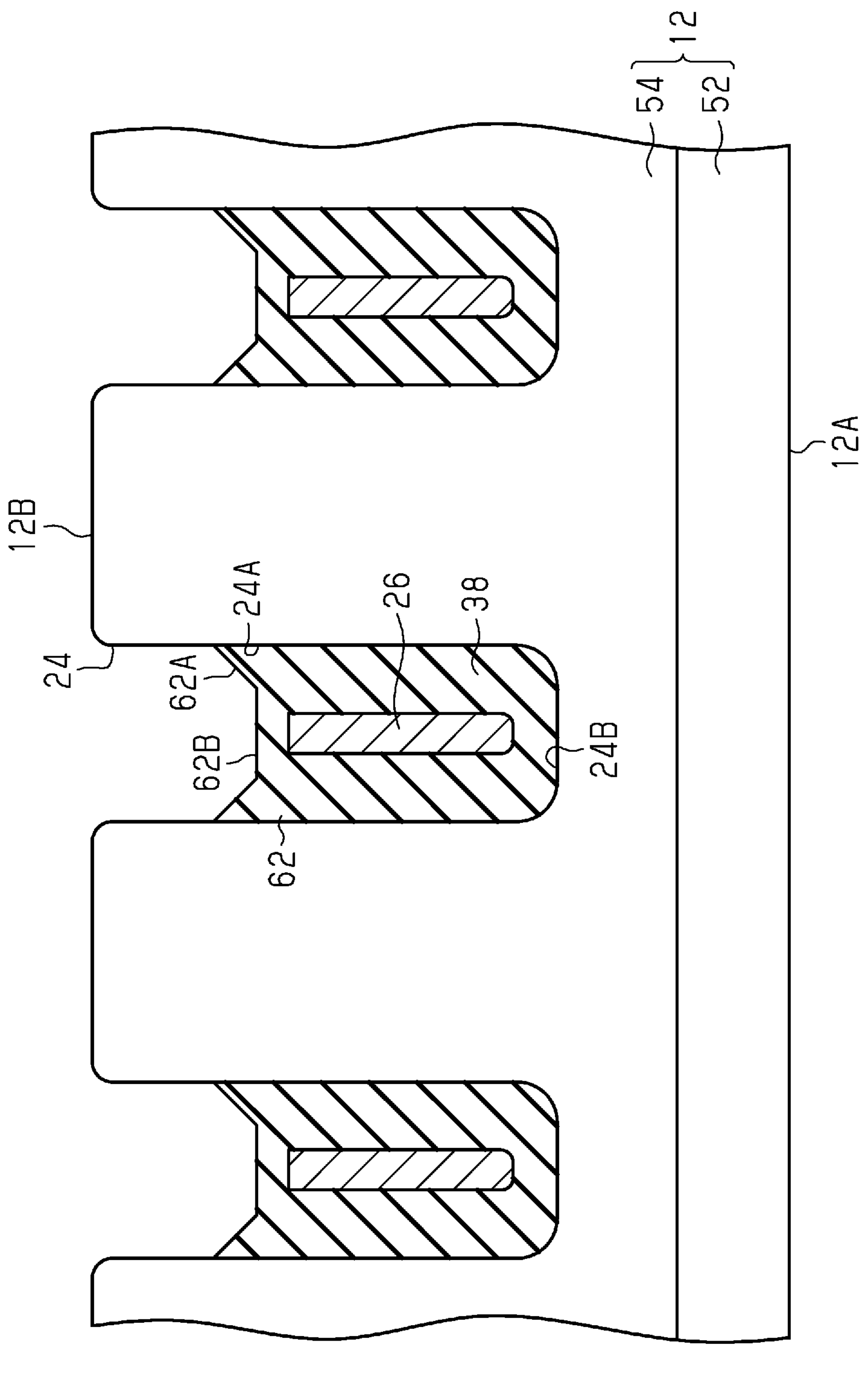
FIG. 12 is a schematic cross-sectional view illustrating a manufacturing step following the step of FIG. 11.

FIG. 12 is a schematic cross-sectional view illustrating a manufacturing step following the step of FIG. 11. As shown in FIG. 12, parts of the composite insulation layer 62 are removed. The composite insulation layer 62 is partially removed by performing, for example, wet etching with hydrofluoric acid. The first insulation layer 56 and the second insulation layer 60, which are included in the composite insulation layer 62, are formed through different processes, as described above. Accordingly, the first insulation layer 56 and the second insulation layer 60 differ in etch rate. More specifically, the etch rate of the second insulation layer 60 formed through CVD has a greater etch rate than the first insulation layer 56 formed through thermal oxidation. Prior to etching, the side wall 24A of each trench 24 is covered by the first insulation layer 56 (refer to FIG. 9), which is formed through thermal oxidation and has a relatively low etch rate. The second insulation layer 60 (refer to FIG. 10), which has a relatively high etch rate, is formed in the middle part, with respect to the width direction, of each trench 24 upward from the first conductive layer 58. Accordingly, when etching the composite insulation layer 62 that include the first insulation layer 56 and the second insulation layer 60, the etching speed is higher at the middle portion than in the vicinity of the side wall 24A in each trench 24. As a result, as shown in FIG. 12, the exposed surface of the composite insulation layer 62 in each trench 24 includes a sloped surface 62A that is adjacent to the side wall 24A of the trench 24 and a flat surface 62B that is continuous with the sloped surface 62A.

Figure 13:
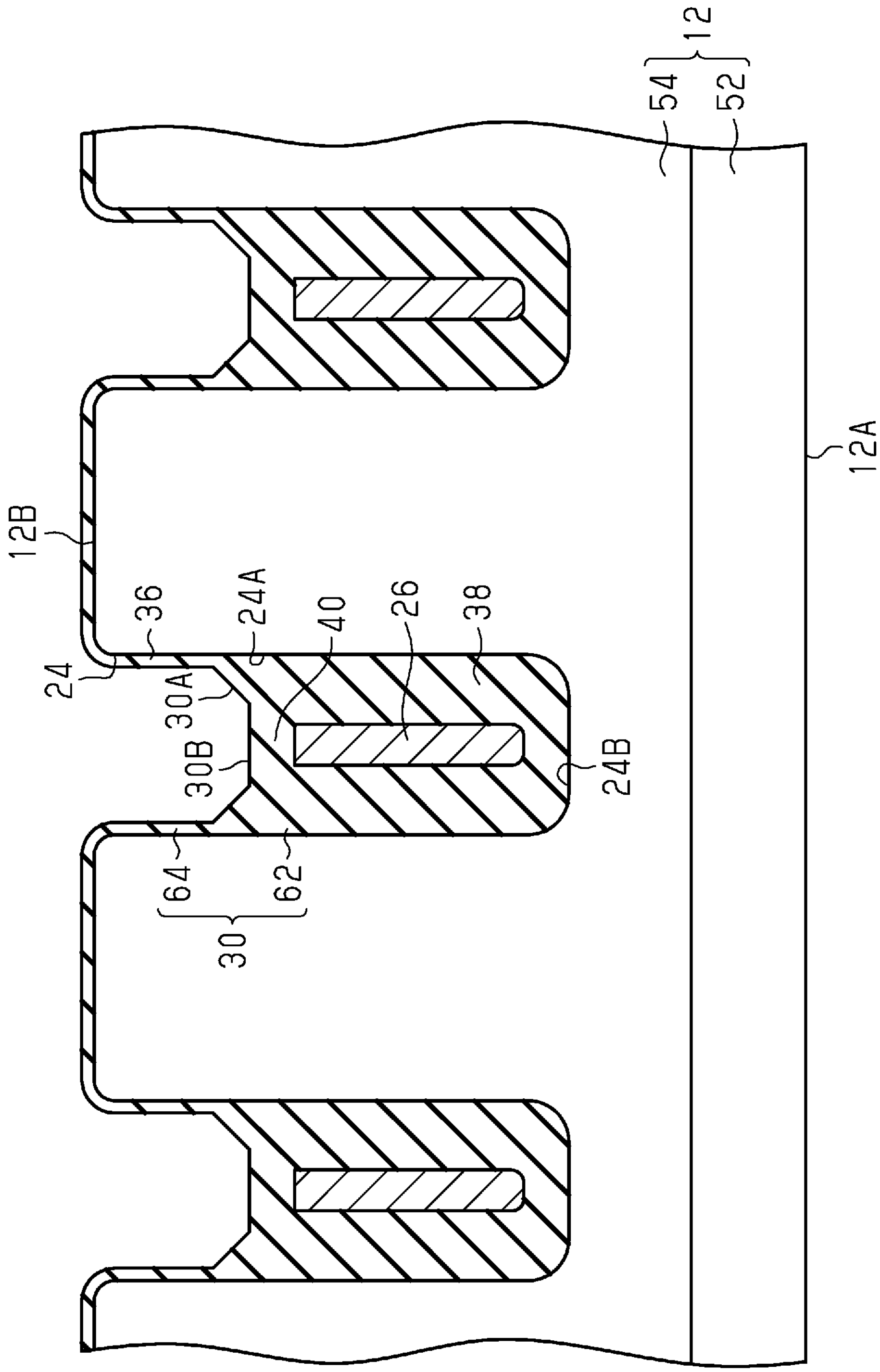
FIG. 13 is a schematic cross-sectional view illustrating a manufacturing step following the step of FIG. 12.

FIG. 13 is a schematic cross-sectional view illustrating a manufacturing step following the step of FIG. 12. As shown in FIG. 13, a third insulation layer 64 is formed on the semiconductor layer 12 and the composite insulation layer 62 in each trench 24. In one example, the third insulation layer 64 is formed from $SiO_2$ through thermal oxidation. In another example, the third insulation layer 64 may be formed through CVD. The composite insulation layer 62 and the third insulation layer 64 form the insulation layer 30. The third insulation layer 64 is formed along the sloped surface 62A and the flat surface 62B of the composite insulation layer 62 (refer to FIG. 12). Thus, the insulation layer 30 also includes a sloped surface 30A and a flat surface 30B in each trench 24. The sloped surface 30A results in the second portion 36B of the gate insulator 36 being thicker than the first portion 36A.

In this manner, in the method for manufacturing the semiconductor device 10, the forming the insulation layer 30 includes embedding the first insulation layer 56 and the second insulation layer 60 that differ in etch rate in the trench 24, and etching the first insulation layer 56 and the second insulation layer 60 so that the second portion 36B of the gate insulator 36 is thicker than the first portion 36A on the side wall 24A of the trench 24.

Figure 14:
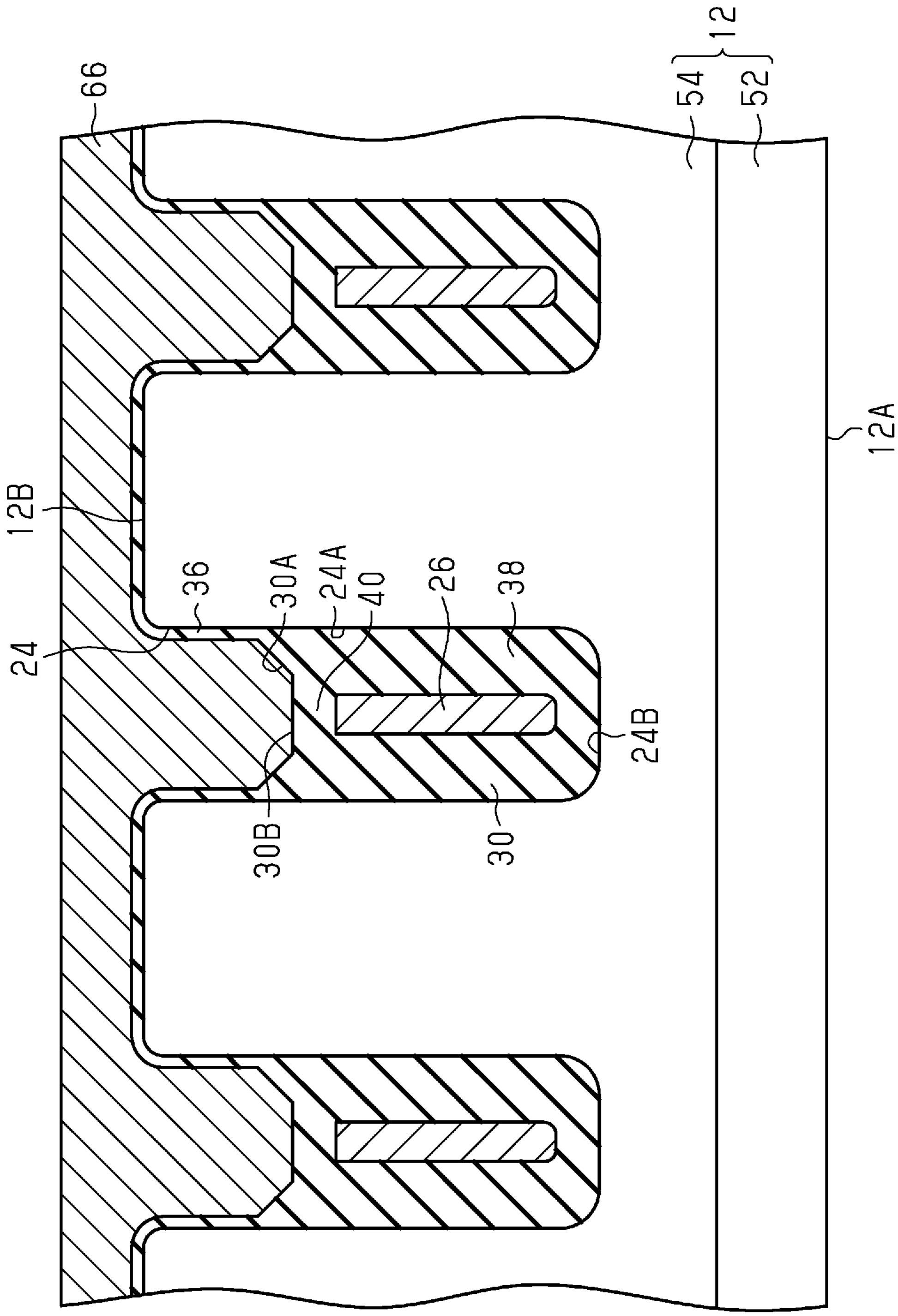
FIG. 14 is a schematic cross-sectional view illustrating a manufacturing step following the step of FIG. 13.

FIG. 14 is a schematic cross-sectional view illustrating a manufacturing step following the step of FIG. 13. As shown in FIG. 14, a second conductive layer 66 is formed on the insulation layer 30. The second conductive layer 66 may be formed from, for example, polysilicon, which is conductive. The second conductive layer 66 is embedded in each trench 24 on the insulation layer 30, which includes the sloped surface 30A and the flat surface 30B.

Figure 15:
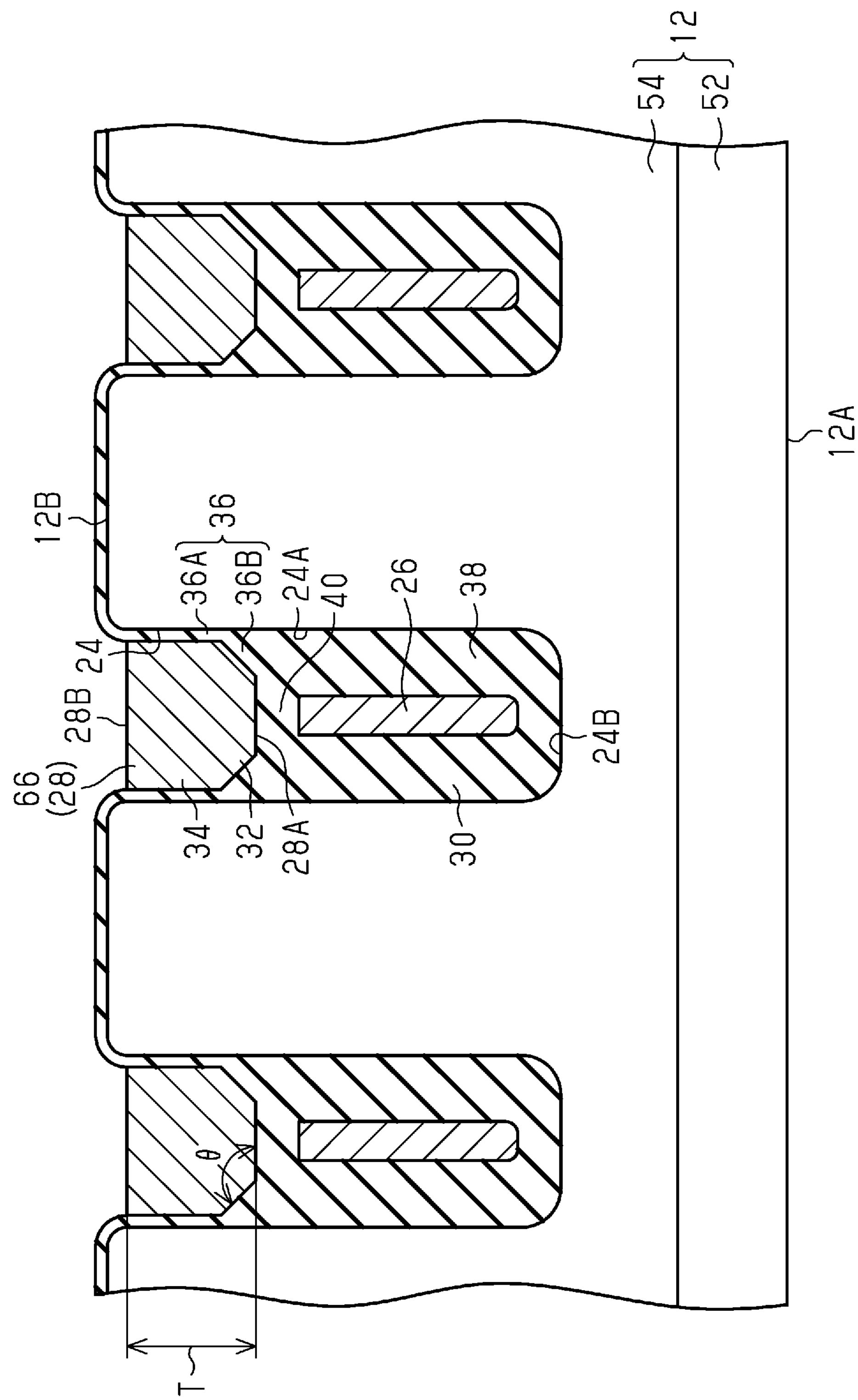
FIG. 15 is a schematic cross-sectional view illustrating a manufacturing step following the step of FIG. 14.

FIG. 15 is a schematic cross-sectional view illustrating a manufacturing step following the step of FIG. 14. As shown in FIG. 15, parts of the second conductive layer 66 are removed. The second conductive layer 66 is etched to expose the insulation layer 30 that covers the second surface 12B of the semiconductor layer 12, and arrange the upper surface 28B of the gate electrode 28 downward from the second surface 12B of the semiconductor layer 12. As a result, the gate electrode 28 is formed in each trench 24. As described above, the insulation layer 30 includes the sloped surface 30A and the flat surface 30B in each trench 24 (refer to FIG. 14). Thus, the gate electrode 28 is formed so that the bottom portion 32 is narrower than the main portion 34.

In this manner, in the method for manufacturing the semiconductor device 10, the forming the gate electrode 28 includes forming the gate electrode 28 that includes the bottom portion 32 including the bottom surface 28A of the gate electrode 28 and the main portion 34 formed on the bottom portion 32. The gate electrode 28 has a width in the second direction that is orthogonal to both of the depth direction of the trench 24 and the first direction. Further, the forming the insulation layer 30 includes forming the gate insulator 36 that is located between the gate electrode 28 and the semiconductor layer 12 and covers the side wall 24A in the trench 24. The gate insulator 36 includes the first portion 36A, formed between the body region 18 and the main portion 34 of the gate electrode 28, and the second portion 36B, adjacent to the bottom portion 32 of the gate electrode 28. The bottom portion 32 is narrower than the main portion 34, and the second portion 36B is thicker than the first portion 36A on the side wall 24A of the trench 24.

Figure 16:
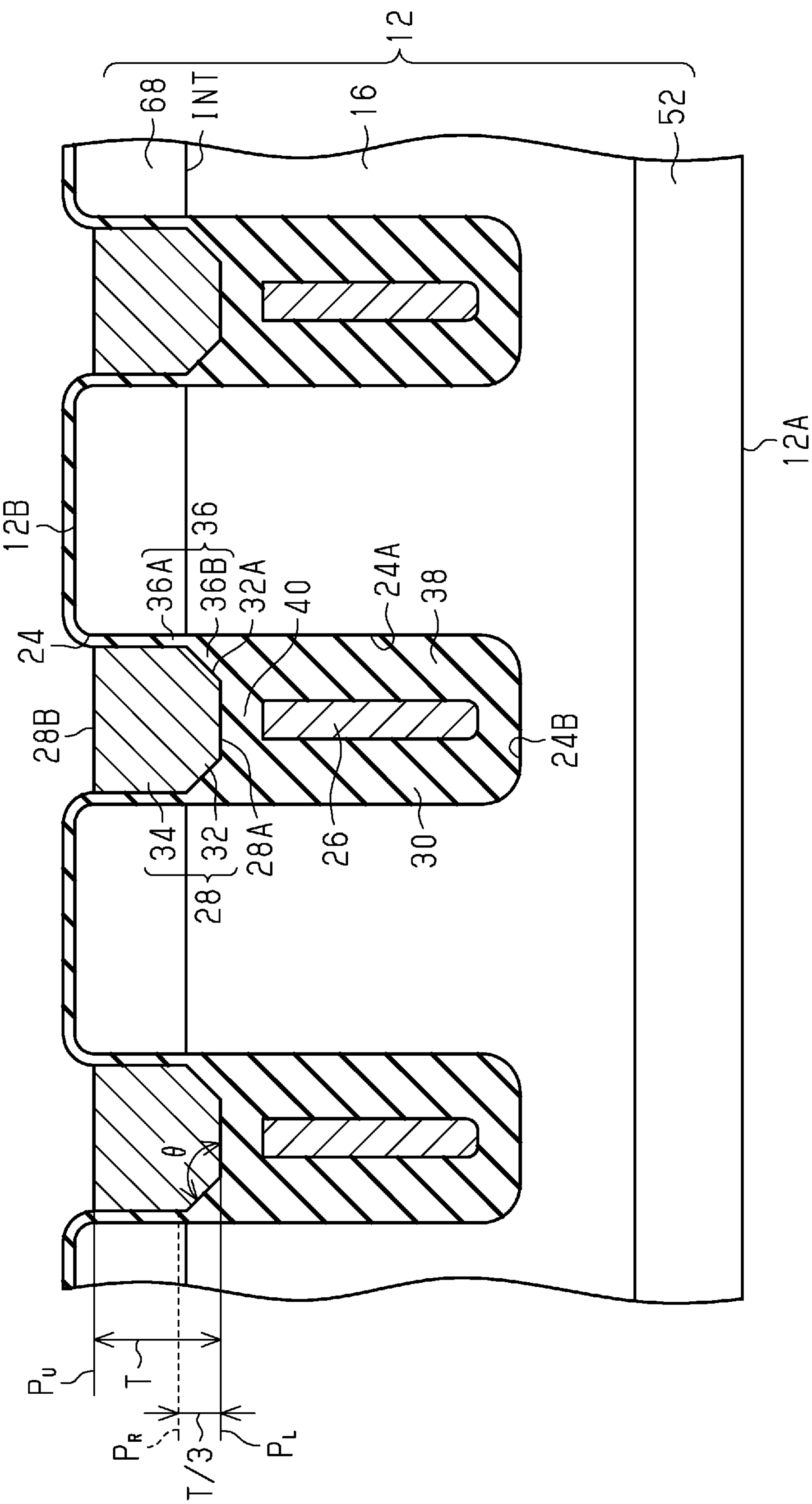
FIG. 16 is a schematic cross-sectional view illustrating a manufacturing step following the step of FIG. 15.

FIG. 16 is a schematic cross-sectional view illustrating a manufacturing step following the step of FIG. 15. As shown in FIG. 16, a p-type region 68 is formed in the drift region 16 and the epitaxial layer 54. In further detail, ion implantation is performed with an ion implantation mask (not shown) to implant a p-type impurity from the surface of the epitaxial layer 54 (n-type Si layer), or the second surface 12B of semiconductor layer 12, to form the p-type region 68 in an outer portion of the epitaxial layer 54. The remaining portion of the epitaxial layer 54 forms the n-type drift region 16. The ion implantation that forms the p-type region 68 is performed in steps by varying the acceleration energy.

The p-type region 68 ultimately becomes the body region 18 (refer to FIG. 1). The interface of the drift region 16 and the p-type region 68 corresponds to the interface INT of the drift region 16 and the body region 18 shown in FIG. 1. Accordingly, in this step, the p-type region 68 (body region 18) is formed so that the interface of the drift region 16 and the p-type region 68 (body region 18) lies between the lower end position $P_L$ of the gate electrode 28 and the reference position PR that is located upward from the lower end position $P_L$ by ⅓ the thickness T of the gate electrode 28 in the depth direction of the trench 24.

Figure 17:
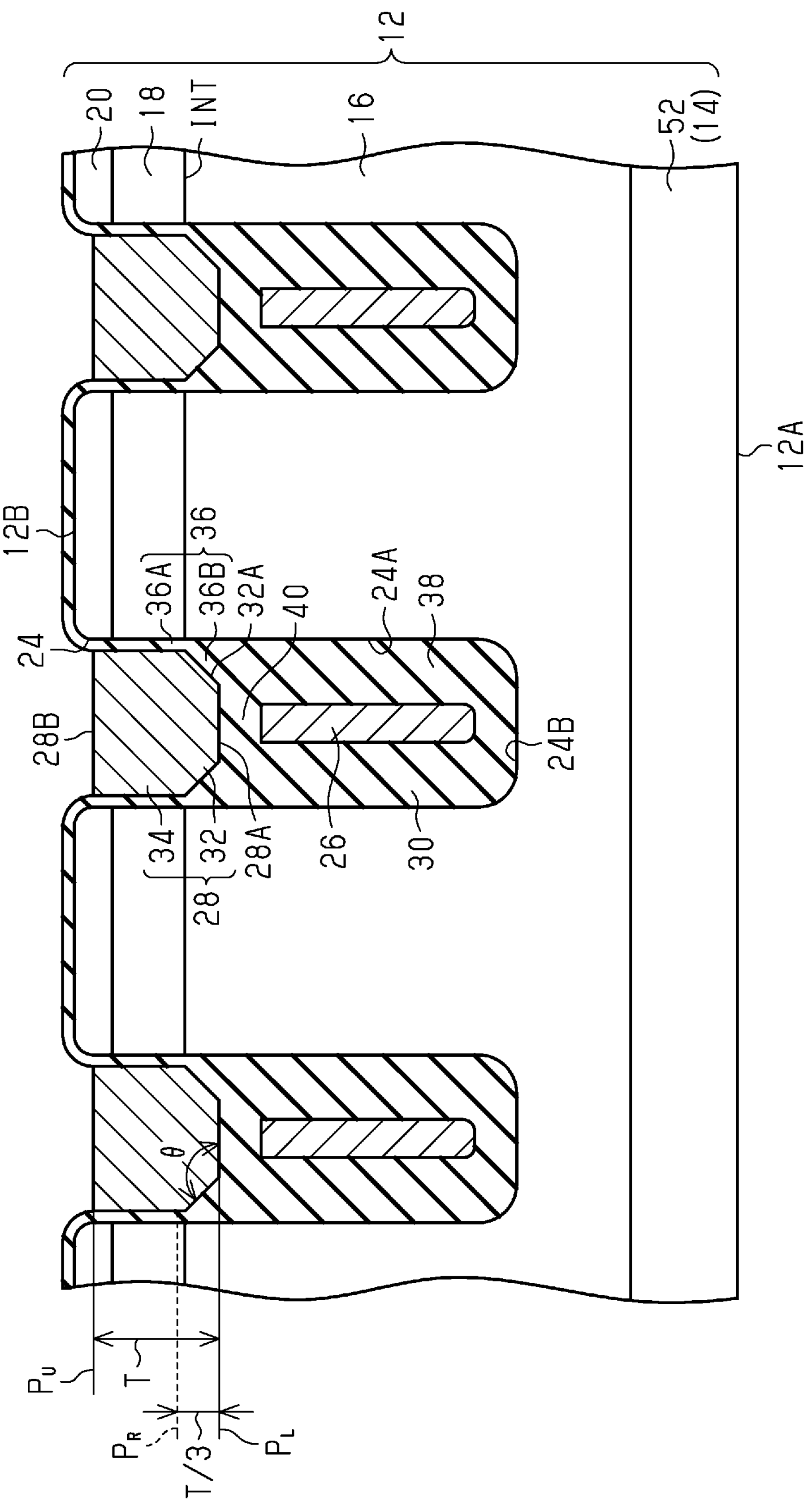
FIG. 17 is a schematic cross-sectional view illustrating a manufacturing step following the step of FIG. 16.

FIG. 17 is a schematic cross-sectional view illustrating a manufacturing step following the step of FIG. 16. As shown in FIG. 17, the source region 20 and the body region 18 are formed in the p-type region 68. In further detail, ion implantation is performed with an ion implantation mask (not shown) to implant an n-type impurity from the surface of the p-type region 68, or the second surface 12B of the semiconductor layer 12, to form the n-type source region 20 in the outer portion of the p-type region 68. The remaining portion of the p-type region 68 forms the p-type body region 18. The semiconductor substrate 52 corresponds to the drain region 14 of FIG. 1.

In this manner, in the method for manufacturing the semiconductor device 10, forming the semiconductor layer 12 includes forming the drift region 16 of the first conductive type, forming the body region 18 of the second conductive type on the drift region 16, and forming the source region 20 of the first conductive type including the second surface 12B of the semiconductor layer 12 on the body region 18. Further, forming the body region 18 includes forming the body region 18 so that the interface INT of the drift region 16 and the body region 18 lies between the lower end position $P_L$ of the gate electrode 28 and the reference position PR that is located upward from the lower end position $P_L$ by ⅓ the thickness T of the gate electrode 28 in the depth direction of the trench 24.

Figure 18:
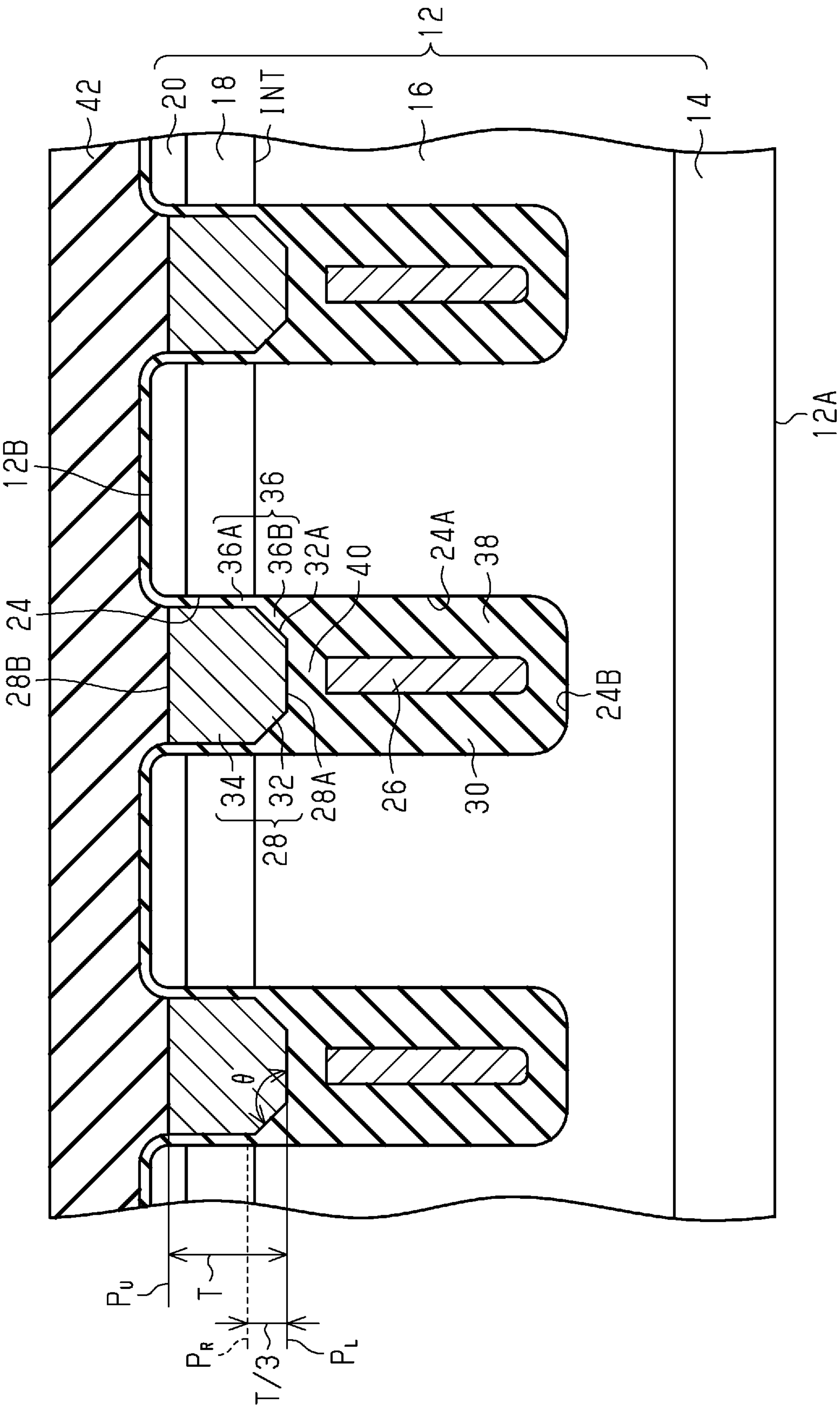
FIG. 18 is a schematic cross-sectional view illustrating a manufacturing step following the step of FIG. 17.

FIG. 18 is a schematic cross-sectional view illustrating a manufacturing step following the step of FIG. 17. As shown in FIG. 18, the interlayer insulation layer 42 is formed covering the insulation layer 30 and each gate electrode 28. In one example, the interlayer insulation layer 42 may be formed through CVD.

Then, the contact trenches 44, the contact region 46, the source contacts 48, the source interconnect 50, and the drain electrode 22 shown in FIG. 1 are formed. First, parts of the interlayer insulation layer 42 are selectively removed to form the contact trenches 44. Then, ion implantation is performed to implant a p-type impurity from the bottom surface of each contact trench 44 and form the contact region 46. The source contact 48 is embedded in each contact trench 44 in contact with the contact region 46. The source interconnect 50 is formed on the interlayer insulation layer 42 and electrically connected to the source contacts 48. The drain electrode 22 is formed on the first surface 12A of the semiconductor layer 12. Consequently, the semiconductor device 10 is obtained.

Operation

The operation of the semiconductor device 10 in accordance with the present embodiment will now be described.

In the semiconductor device 10 in accordance with the present embodiment, the interface INT of the drift region 16 and the body region 18 lies between the lower end position $P_L$ of the gate electrode 28 and the reference position PR that is located upward from the lower end position $P_L$ by ⅓ the thickness T of the gate electrode 28 in the depth direction of the trench 24. In this manner, the interface INT of the drift region 16 and the body region 18 is located near the lower end position $P_L$ of the gate electrode 28 to decrease the area of the region where the gate electrode 28 and the drift region 16 face each other. The region where the gate electrode 28 and the drift region 16 face each other through the gate insulator 36 has a relatively large effect on the gate-drain capacitance $C_{gd}$. Accordingly, the interface INT of the drift region 16 and the body region 18 located between the lower end position $P_L$ and the reference position PR reduces the gate-drain capacitance $C_{gd}$. Additionally, the electric field applied to the insulation layer 30 is reduced between the gate electrode 28 and the drift region 16.

Figure 19:
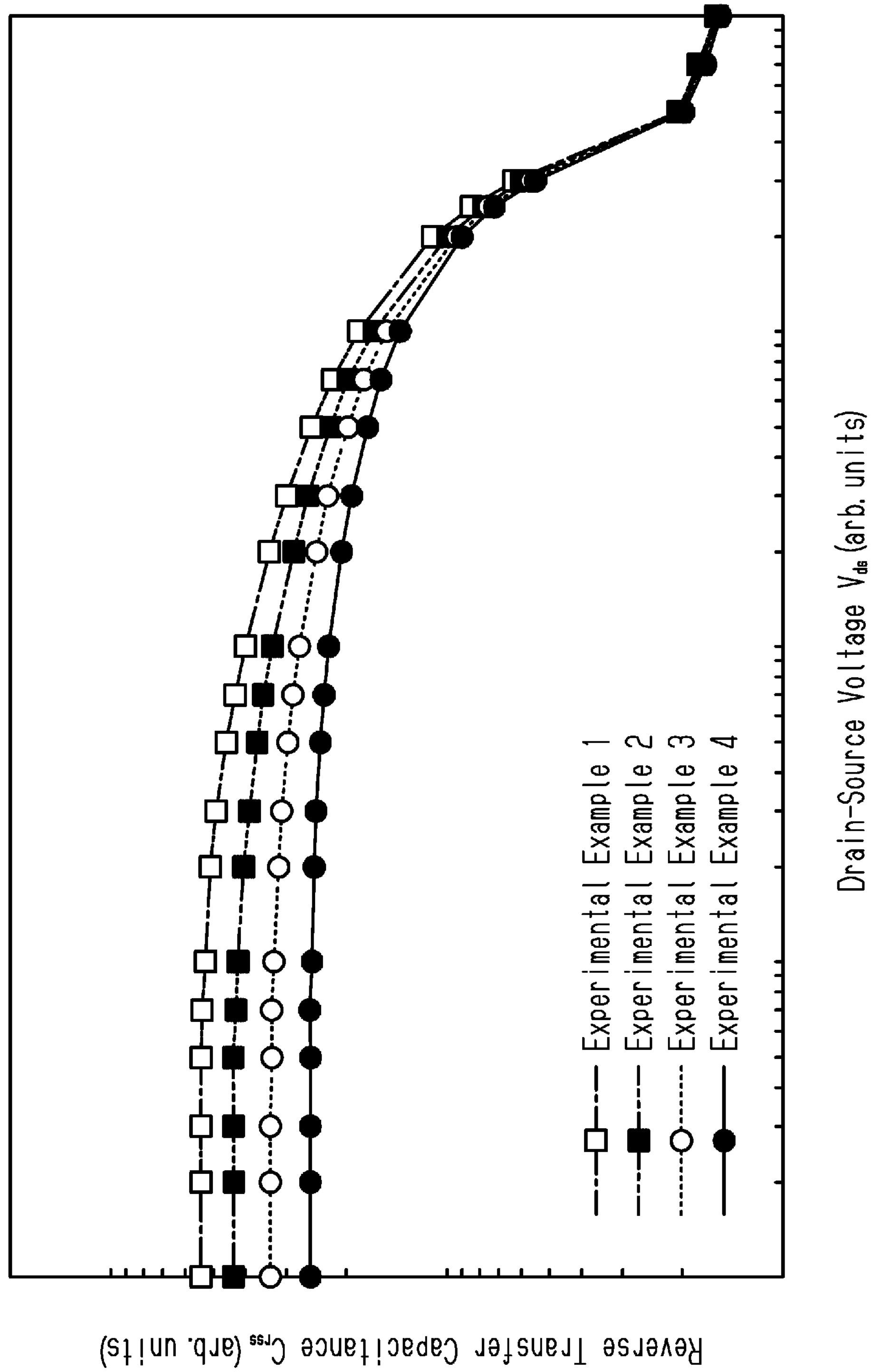
FIG. 19 is a graph illustrating measurement results of the reverse transfer capacitance $C_{rss}$ for the semiconductor devices of experimental examples 1 to 4.

With reference to FIG. 19, changes in the gate-drain capacitance $C_{gd}$ resulting from where the interface INT of the drift region 16 and the body region 18 is located will now be described.

FIG. 19 is a graph illustrating measurement results of the reverse transfer capacitance $C_{rss}$ for the semiconductor devices of experimental examples 1 to 4. In the graph, the horizontal axis represents the drain-source voltage Vas and the vertical axis represents the reverse transfer capacitance $C_{rss}$. The reverse transfer capacitance $C_{rss}$ corresponds to the gate-drain capacitance $C_{gd}$.

Experimental examples 1 to 4 are samples to which different conditions are applied in an ion implantation process performed to form the p-type region 68 illustrated in FIG. 16. In experimental example 1, ion implantation is performed under conventional processing conditions. In experimental example 1, the interface INT of the drift region 16 and the body region 18 is located upward from the reference position PR.

In experimental examples 2 to 4, additional implantation is performed in addition to the ion implantation performed under the conventional processing conditions. As a result, in experimental examples 2 to 4, the interface INT of the drift region 16 and the body region 18 is located between the lower end position $P_L$ and the reference position PR.

Additional ion implantation is performed with relatively low acceleration energy in experimental example 2, middle-level acceleration energy in experimental example 3, and relatively high acceleration energy in experimental example 4. As the acceleration energy increases in the additional ion implantation, the p-type region 68 is formed at a deeper position in the semiconductor layer 12. Thus, the interface INT of the drift region 16 and the body region 18 becomes closer to the lower end position $P_L$ of the gate electrode 28. The ion implantation conditions in experimental example 4 are similar to the conditions used in the process for manufacturing the semiconductor device 10 in accordance with the present embodiment. In the graph, experimental example 1 is shown by the single-dashed line, experimental example 2 is shown by the double-dashed line, experimental example 3 is shown by the broken line, and experimental example 4 is shown by the solid line.

As shown in FIG. 19, the reverse transfer capacitance $C_{rss}$ decreases as the acceleration energy of additional implantation increases. For example, the reverse transfer capacitance $C_{rss}$ of experimental example 4, in which the additional implantation acceleration energy is the highest, at the left end of the graph (low Vas) is approximately 53% of the reverse transfer capacitance $C_{rss}$ of experimental example 1, which does not undergo additional implantation. This result indicates that as the acceleration energy becomes higher when performing ion implantation, the gate-drain capacitance $C_{gd}$ becomes lower. This is because additional implantation performed with high acceleration energy arranges the interface INT of the drift region 16 and the body region 18 closer to the lower end position $P_L$ of the gate electrode 28 and reduces the area of the region where the gate electrode 28 and the drift region 16 face each other.

Further, in the semiconductor device 10 in accordance with the present embodiment, the gate electrode 28 includes the bottom portion 32 and the main portion 34, which is formed on the bottom portion 32. The bottom portion 32 is narrower than the main portion 34 in the second direction. Accordingly, in the gate insulator 36 that covers the side wall 24A of the trench 24, the second portion 36B, which is adjacent to the bottom portion 32 of the gate electrode 28, is thicker than the first portion 36A, which is located between the main portion 34 of the gate electrode 28 and the body region 18. The second portion 36B of the gate insulator 36 that is adjacent to the bottom portion 32 of the gate electrode 28 and thicker than the first portion 36A increases the distance between the gate electrode 28 and the drift region 16 in the vicinity of the lower end position $P_L$ of the gate electrode 28. As a result, even though the interface INT of the drift region 16 and the body region 18 is located upward from the lower end position $P_L$ of the gate electrode 28, increases in the gate-drain capacitance $C_{gd}$ are limited.

As described above, the gate-drain capacitance $C_{gd}$ becomes lower as the interface INT of the drift region 16 and the body region 18 becomes closer to the lower end position $P_L$ of the gate electrode 28 in the depth direction of the trench 24. However, the on resistance may rise suddenly if, for example, processing variations cause the interface INT of the drift region 16 and the body region 18 to be arranged downward from the lower end position $P_L$ of the gate electrode 28.

To avoid such sudden rise of the on resistance, the interface INT of the drift region 16 and the body region 18 is arranged upward from the lower end position $P_L$, so that the gate electrode 28 and the drift region 16 face each other through at least part of the second portion 36B of the gate insulator 36 (in the example of FIG. 1, the entire second portion 36B), where the gate-drain capacitance $C_{gd}$ increases. In the present embodiment, the second portion 36B of the gate insulator 36, which is adjacent to the bottom portion 32 of the gate electrode 28, is thicker than the first portion 36A. Thus, the increase in the gate-drain capacitance $C_{gd}$ is relatively small. Further, the second portion 36B of the gate insulator 36 becomes thicker on the side wall 24A of the trench 24 as the bottom wall 24B of the trench 24 becomes closer. This limits sudden rises in the on resistance even if processing variations change the location of the interface INT of the drift region 16 and the body region 18. In this manner, the semiconductor device 10 in accordance with the present embodiment limits sudden rises in the on resistance caused by processing variations without excessively increasing the gate-drain capacitance $C_{gd}$.

Advantages

The semiconductor device 10 in accordance with the present embodiment has the advantages described below.

(1-1) The interface INT of the drift region 16 and the body region 18 lies between the lower end position $P_L$ of the gate electrode 28 and the reference position PR that is located upward from the lower end position $P_L$ by ⅓ the thickness T of the gate electrode 28 in the depth direction of the trench 24 (Z-axis direction).

This configuration decreases the area of the region where the gate electrode 28 and the drift region 16 face each other. Accordingly, the gate-drain capacitance $C_{gd}$ is reduced, and the electric field applied to the insulation layer 30, which is located between the gate electrode 28 and the drift region 16, is reduced.

(1-2) The gate electrode 28 includes the bottom portion 32, which includes the bottom surface 28A, and the main portion 34, which is formed on the bottom portion 32. The bottom portion 32 is narrower in the second direction than the main portion 34. The gate insulator 36 includes the first portion 36A, which is located between the body region 18 and the main portion 34 of the gate electrode 28, and the second portion 36B, which is adjacent to the bottom portion 32 of the gate electrode 28. The second portion 36B is thicker than the first portion 36A on the side wall 24A of the trench 24.

This configuration increases the distance between the gate electrode 28 and the drift region 16 in the vicinity of the lower end position $P_L$ of the gate electrode 28. Accordingly, even though the interface INT of the drift region 16 and the body region 18 is located upward from the lower end position $P_L$ of the gate electrode 28, increases in the gate-drain capacitance $C_{gd}$ are limited.

(1-3) The second portion 36B of the gate insulator 36 becomes thicker on the side wall 24A of the trench 24 as the bottom wall 24B of the trench 24 becomes closer.

This configuration limits sudden rises in the on resistance caused by processing variations.

(1-4) The interface INT of the drift region 16 and the body region 18 is located at the same position as the upper end of the side surface 32A of the bottom portion 32 in the depth direction of the trench 24.

In this configuration, the body region 18, in which the channel is formed, is not adjacent to the second portion 36B, which is thicker than the first portion 36A. This limits increases in the on resistance.

(1-5) The side surface 32A of the bottom portion 32 of the gate electrode 28 is angled by 115° or greater and 155° or less from the bottom surface 28A.

In this configuration, even if processing variations change the location of the interface INT of the drift region 16 and the body region 18, increases in the gate-drain capacitance $C_{gd}$ and sudden rises in the on resistance will both be limited.

Modified Example of First Embodiment

Figure 20:
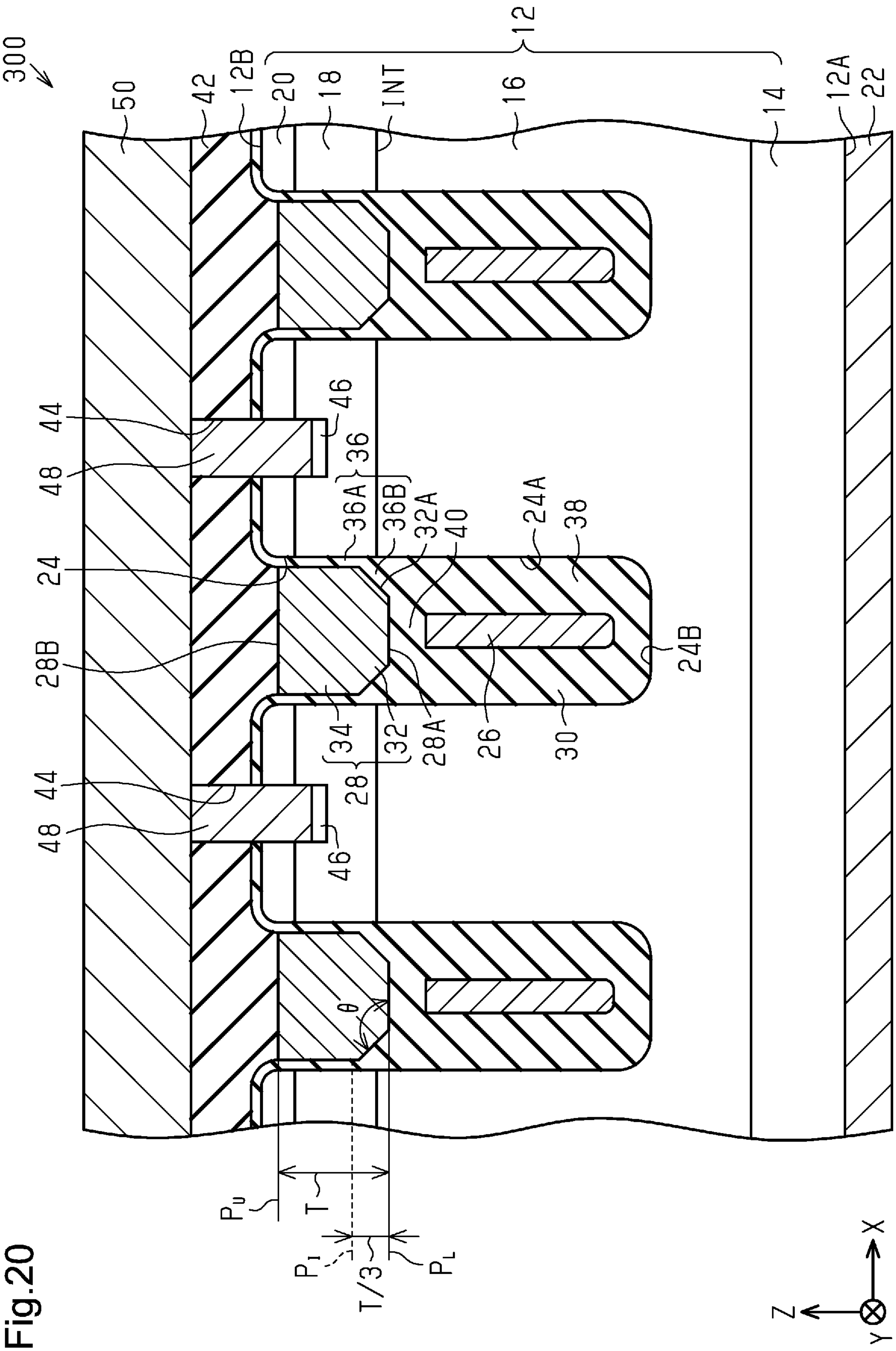
FIG. 20 is a schematic cross-sectional view showing a modified example of the exemplary semiconductor device in accordance with the first embodiment.

FIG. 20 is a schematic cross-sectional view of an exemplary semiconductor device 300 in accordance with a modified example of the first embodiment. In FIG. 20, same reference characters are given to those elements that are the same as the corresponding elements in the semiconductor device 10 of the first embodiment. Components that are the same as the corresponding components of the first embodiment will not be described in detail.

In the semiconductor device 300, the interface INT of the drift region 16 and the body region 18 is located at a lower position than the semiconductor device 10 in the depth direction of the trench 24. The interface INT of the drift region 16 and the body region 18 is located at a lower position than the upper end of the side surface 32A of the bottom portion 32 of the gate electrode 28 in the depth direction of the trench 24. In the semiconductor device 10 in accordance with the first embodiment, the second portion 36B, which is thicker than the first portion 36A, is adjacent to the drift region 16 but not adjacent to the body region 18. In the semiconductor device 300 in accordance with the modified example, the second portion 36B is adjacent to the body region 18 and the drift region 16. As a result, in comparison with the semiconductor device 10, the semiconductor device 300 decreases the area of the region where the gate electrode 28 faces the drift region 16. This further decreases the gate-drain capacitance $C_{gd}$, while limiting sudden rises in the on resistance.

Second Embodiment

Figure 21:
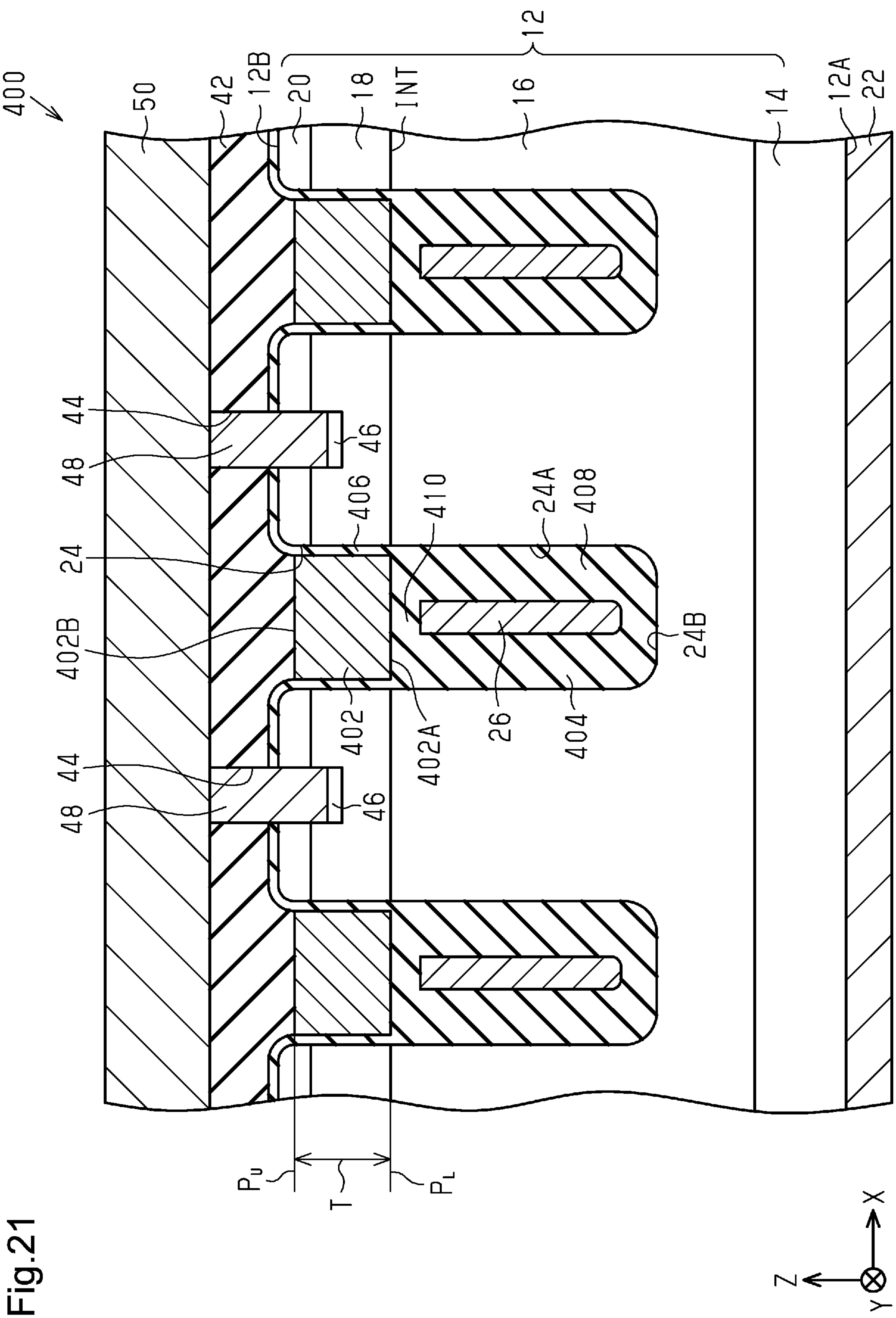
FIG. 21 is a schematic cross-sectional view of an exemplary semiconductor device in accordance with a second embodiment.

FIG. 21 is a schematic cross-sectional view of an exemplary semiconductor device 400 in accordance with a second embodiment. In FIG. 21, same reference characters are given to those elements that are the same as the corresponding elements in the semiconductor device 10 of the first embodiment. Components that are the same as the corresponding components of the first embodiment will not be described in detail.

The semiconductor device 400 includes the field plate electrode 26 formed in each trench 24, a gate electrode 402 formed in each trench 24, and an insulation layer 404 that isolates the field plate electrode 26 and the gate electrode 402 from each other and covers the side wall 24A and the bottom wall 24B in each trench 24. The gate electrode 402 is located upward from the field plate electrode 26 in each trench 24.

The gate electrode 402 includes a bottom surface 402A that at least partially faces the field plate electrode 26. The gate electrode 402 also includes an upper surface 402B opposite to the bottom surface 402A. The upper surface 402B of the gate electrode 402 may be located downward from the second surface 12B of the semiconductor layer 12.

The gate electrode 402 has a thickness T in the depth direction of the trench 24 (Z-axis direction in FIG. 21). The thickness T of the gate electrode 402 may be defined as the distance between the lower end position $P_L$ and the upper end position Pu of the gate electrode 402 in the depth direction of the trench 24. When the bottom surface 402A of the gate electrode 402 is a flat surface that is orthogonal to the depth direction of the trench 24, the lower end position $P_L$ of the gate electrode 402 lies substantially along the same plane as the bottom surface 402A of the gate electrode 402. That is, the lower end position $P_L$ of the gate electrode 402 is where the bottom surface 402A of the gate electrode 402 is located.

In the same manner, when the upper surface 402B of the gate electrode 402 is a flat surface that is orthogonal to the Z-axis direction, the upper end position Pu of the gate electrode 402 lies substantially along the same plane as the upper surface 402B of the gate electrode 402. That is, the upper end position Pu of the gate electrode 402 is where the upper surface 402B of the gate electrode 402 is located. Accordingly, as shown in the example of FIG. 21, when the bottom surface 402A and the upper surface 402B of the gate electrode 402 are substantially flat, the thickness T corresponds to the distance between the bottom surface 402A and the upper surface 402B.

In another example, at least one of the bottom surface 402A and the upper surface 402B of the gate electrode 402 may be curved. When the bottom surface 402A is curved, the lower end position $P_L$ is where the bottom surface 402A is the closest to the field plate electrode 26 or the bottom wall 24B of the trench 24 in the depth direction of the trench 24. When the upper surface 402B is curved, the upper end position Pu is where the upper surface 402B is the closest to the second surface 12B of the semiconductor layer 12 in the depth direction of the trench 24.

Regardless of how the bottom surface 402A and the upper surface 402B are shaped, the upper end position Pu of the gate electrode 402 is where the lower end position $P_L$ is the farthest in the depth direction of the trench 24. In the same manner, the lower end position $P_L$ of the gate electrode 402 is where the upper end position Pu is the farthest in the depth direction of the trench 24.

The gate electrode 402 has a rectangular cross section. Cross section as referred to here is a cross section taken along a direction that is orthogonal to the first direction (Y-axis direction). In the present embodiment, the gate electrode 402 may have a substantially constant width in the depth direction of the trench 24.

The insulation layer 404 includes a gate insulator 406 that is located between the gate electrode 402 and the semiconductor layer 12 and covers the side wall 24A in the trench 24. In the present embodiment, the gate insulator 406 has a substantially constant thickness on the side wall 24A of the trench 24. As shown in FIG. 21, the gate insulator 406 isolates the gate electrode 402 and the semiconductor layer 12 in the X-axis direction. A predetermined voltage is applied to the gate electrode 402 to form a channel in the p-type body region 18 that is adjacent to the gate insulator 406. The semiconductor device 400 allows for control of the flow of electrons in the Z-axis direction through the channel between the n-type source region 20 and the n-type drift region 16.

The insulation layer 404 further includes a lower insulator 408, located between the field plate electrode 26 and the semiconductor layer 12 and covering the side wall 24A and the bottom wall 24B in the trench 24, and an intermediate insulator 410, located between the field plate electrode 26 and the gate electrode 402 in the depth direction of the trench 24. The lower insulator 408 may be thicker than the gate insulator 406 on the side wall 24A of the trench 24. In one example, the insulation layer 404 may be formed from $SiO_2$.

In the present embodiment, the interface INT of the drift region 16 and the body region 18 is aligned with the lower end position $P_L$ of the gate electrode 402 in the depth direction of the trench 24.

One example of a method for manufacturing the semiconductor device 400 of FIG. 21 will now be described with reference to FIGS. 22 to 32. An exemplary method for manufacturing the semiconductor device 400 incudes the series of manufacturing steps illustrated in FIGS. 4 to 8 and the manufacturing steps illustrated in FIGS. 22 to 32 following the step of FIG. 8. To facilitate understanding, in FIGS. 22 to 32, same reference characters are given to those elements that are the same as the corresponding elements shown in FIG. 1.

Figure 22:
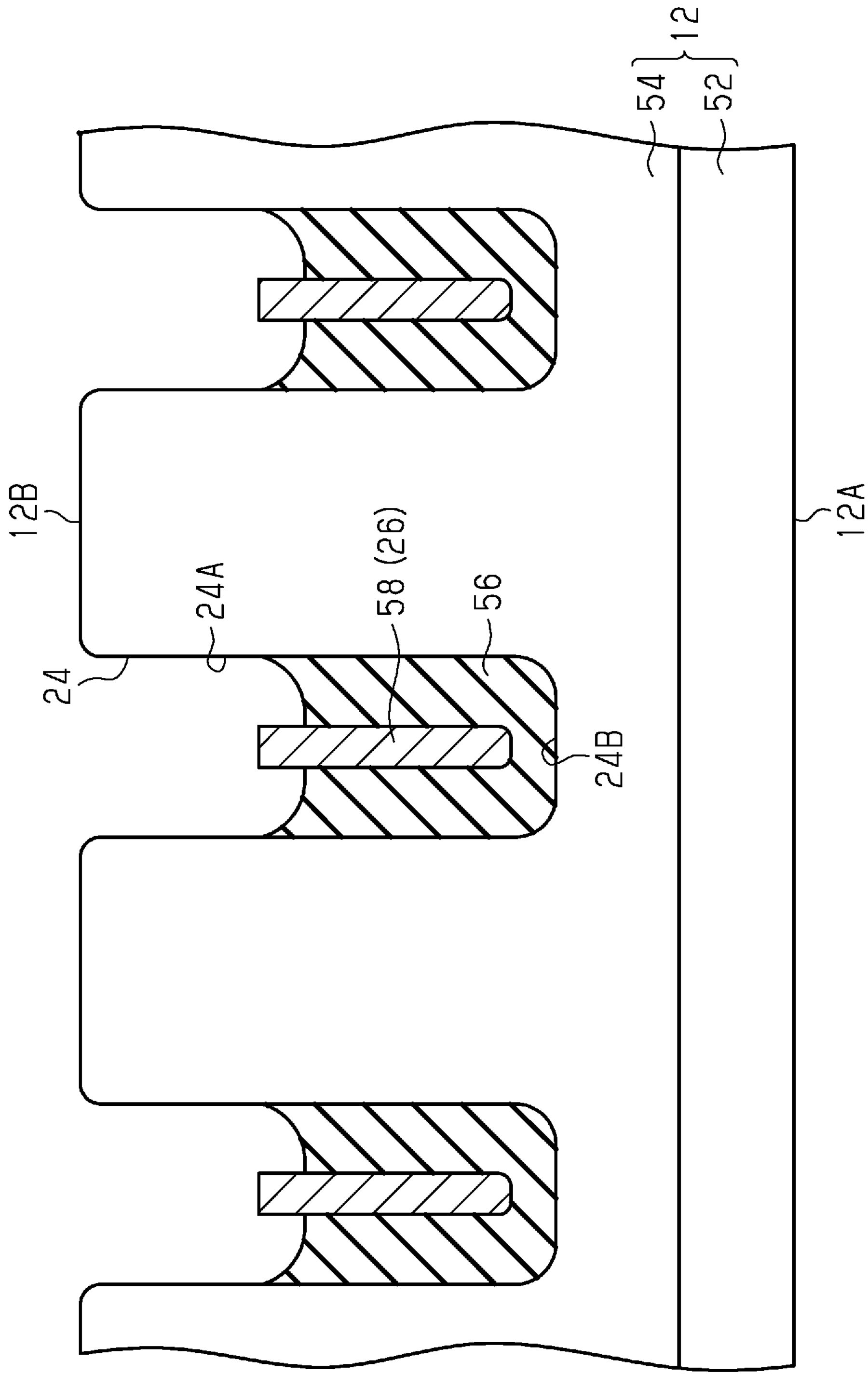
FIG. 22 is a schematic cross-sectional view showing an exemplary manufacturing step of the semiconductor device shown in FIG. 21.

FIG. 22 is a schematic cross-sectional view illustrating a manufacturing step following the step of FIG. 8. As shown in FIG. 22, parts of the first insulation layer 56 are removed. This step differs from the step of FIG. 9 in that etching is performed so that the first insulation layer 56 remains only in the lower portion of the trench 24 and so that the upper portion of the first conductive layer 58 projects out of the first insulation layer 56. The first conductive layer 58 corresponds to the field plate electrode 26 of FIG. 21.

Figure 23:
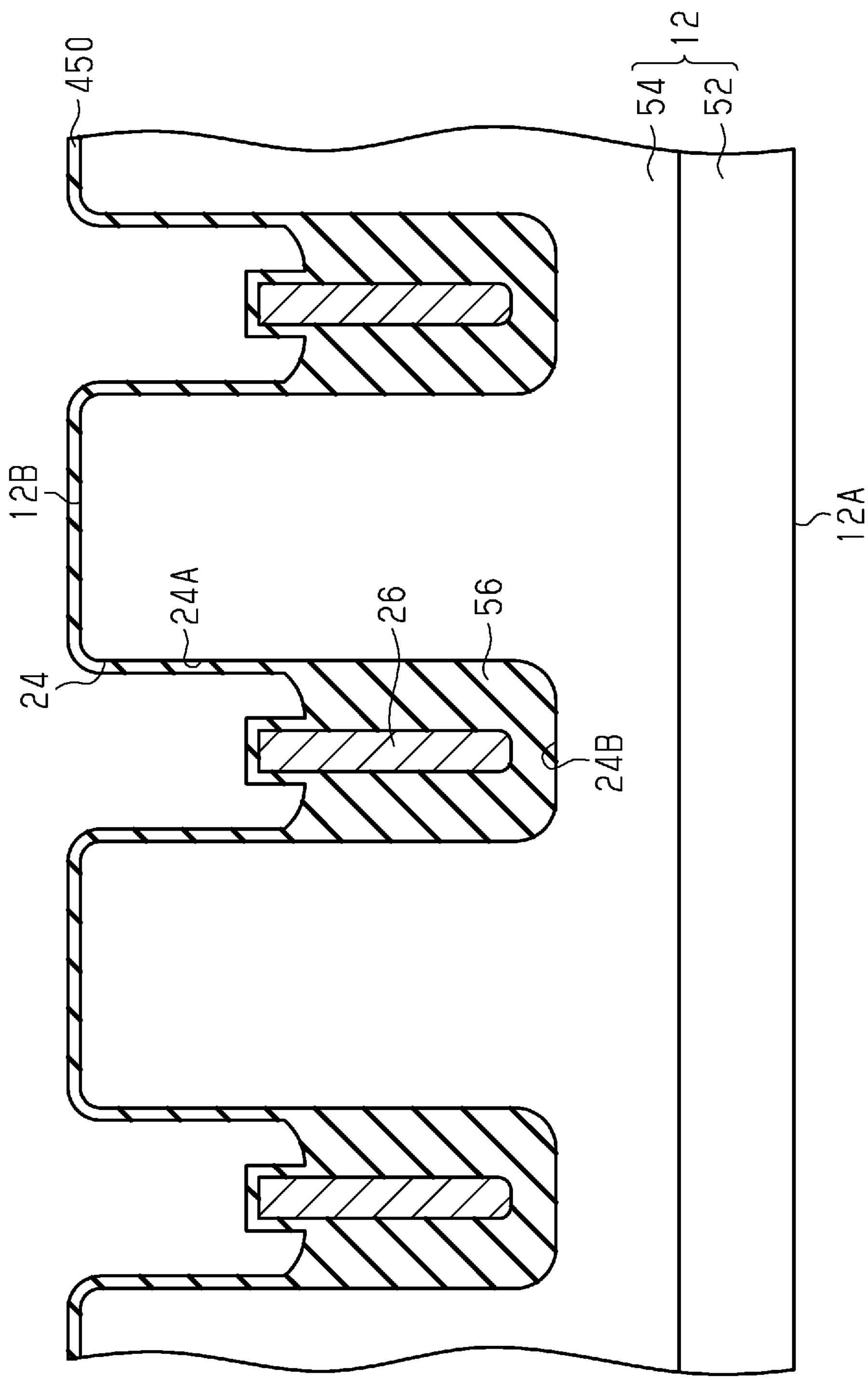
FIG. 23 is a schematic cross-sectional view illustrating a manufacturing step following the step of FIG. 22.

FIG. 23 is a schematic cross-sectional view illustrating a manufacturing step following the step of FIG. 22. As shown in FIG. 23, a second insulation layer 450 is formed along the second surface 12B of the semiconductor layer 12, the side wall 24A of the trench 24, and the exposed surface of the first insulation layer 56. The second insulation layer 450 is a relatively thin liner layer formed so that a third insulation layer 452 (refer to FIG. 24) can be formed in the next step. In one example, the second insulation layer 450 is formed from $SiO_2$ through thermal oxidation.

Figure 24:
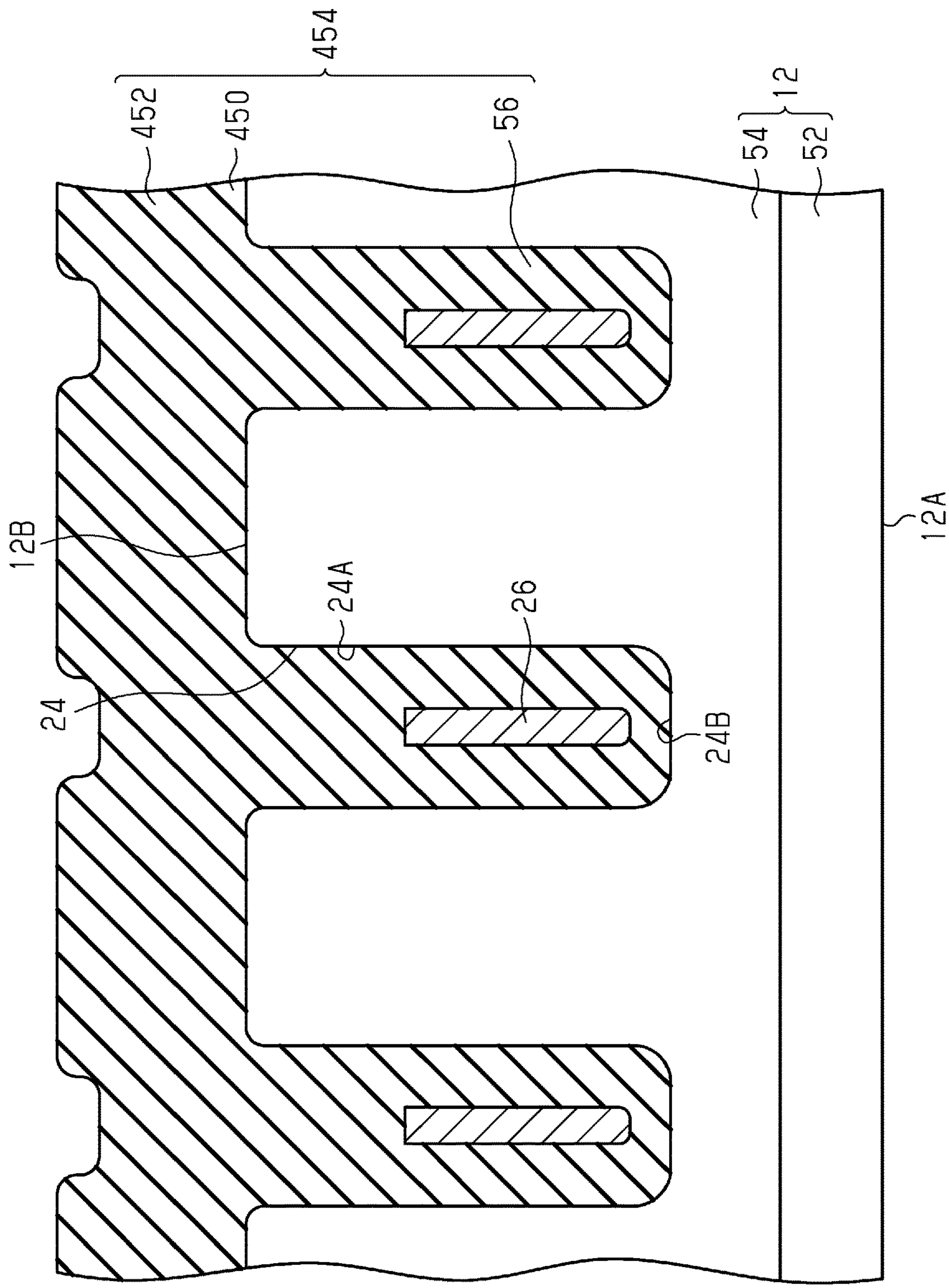
FIG. 24 is a schematic cross-sectional view illustrating a manufacturing step following the step of FIG. 23.

FIG. 24 is a schematic cross-sectional view illustrating a manufacturing step following the step of FIG. 23. As shown in FIG. 24, the third insulation layer 452 is formed on the second insulation layer 450. In the same manner as the second insulation layer 450, the third insulation layer 452 is formed from $SiO_2$. In one example, the third insulation layer 452 may be formed from $SiO_2$ through thermal oxidation. This fills the trenches 24 with a composite insulation layer 454 including the first insulation layer 56, the second insulation layer 450, and the third insulation layer 452.

Figure 25:
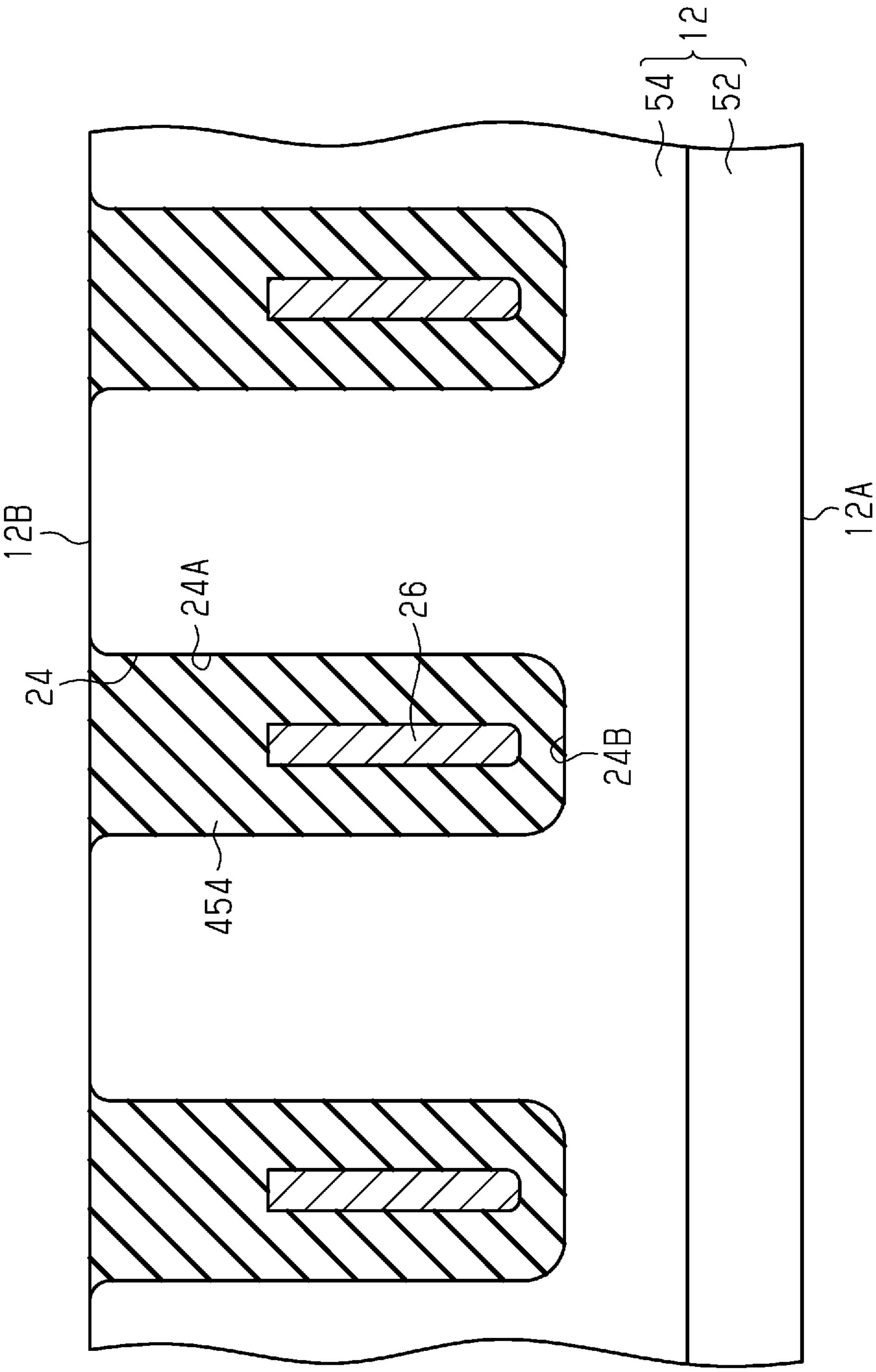
FIG. 25 is a schematic cross-sectional view illustrating a manufacturing step following the step of FIG. 24.

FIG. 25 is a schematic cross-sectional view illustrating a manufacturing step following the step of FIG. 24. As shown in FIG. 25, the composite insulation layer 454 outside the trenches 24 is removed. In further detail, the composite insulation layer 454 is flattened through chemical-mechanical polishing and then etched to expose the second surface 12B of the semiconductor layer 12.

Figure 26:
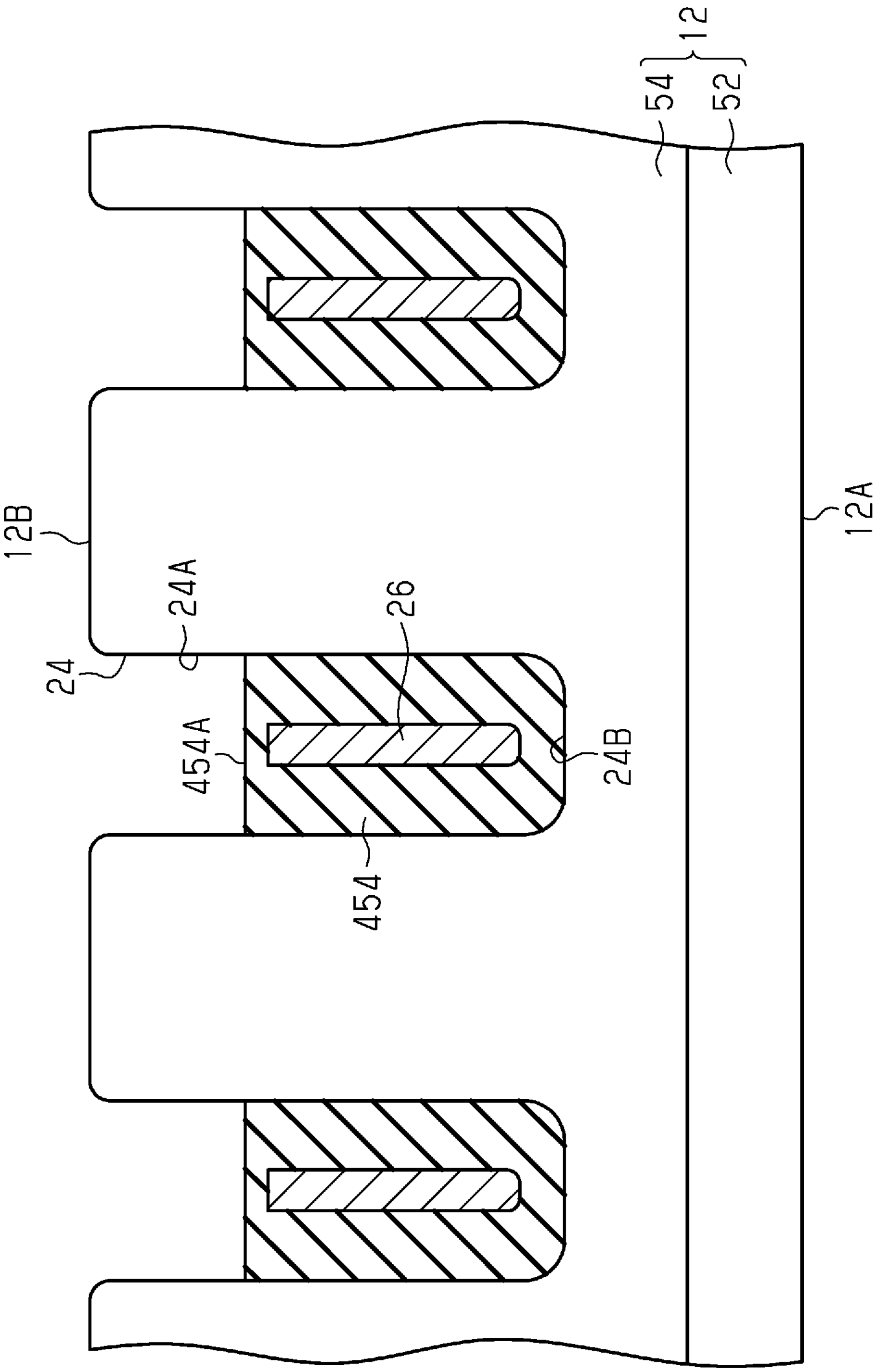
FIG. 26 is a schematic cross-sectional view illustrating a manufacturing step following the step of FIG. 25.

FIG. 26 is a schematic cross-sectional view illustrating a manufacturing step following the step of FIG. 25. As shown in FIG. 26, parts of the composite insulation layer 454 are removed. The composite insulation layer 454 is partially removed by performing, for example, wet etching with hydrofluoric acid. The second insulation layer 450, which is included in the composite insulation layer 454, is a relatively thin layer. Thus, etching of the second insulation layer 450 and the third insulation layer 452 proceeds in a relatively uniform manner in the trenches 24. As a result, the surface 454A of the composite insulation layer 454 exposed in each trench 24 is flat as shown in FIG. 26.

Figure 27:
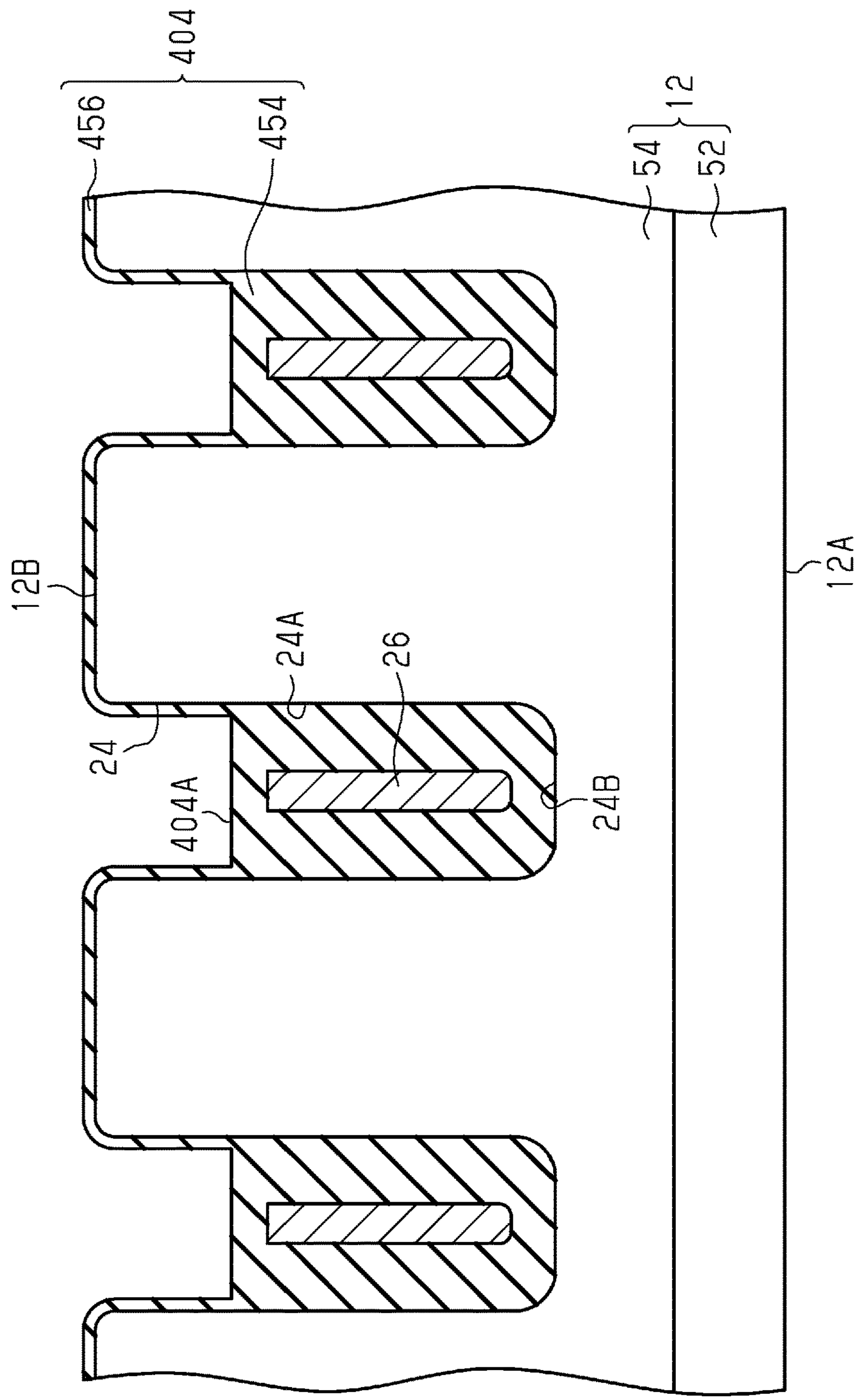
FIG. 27 is a schematic cross-sectional view illustrating a manufacturing step following the step of FIG. 26.

FIG. 27 is a schematic cross-sectional view illustrating a manufacturing step following the step of FIG. 26. As shown in FIG. 27, a fourth insulation layer 456 is formed on the semiconductor layer 12 and the composite insulation layer 454 in each trench 24. In one example, the fourth insulation layer 456 is formed from $SiO_2$ through thermal oxidation. In another example, the fourth insulation layer 456 may be formed through CVD. The composite insulation layer 454 and the fourth insulation layer 456 form the insulation layer 404 (refer to FIG. 21). The fourth insulation layer 456 is formed along the surface 454A of the composite insulation layer 454. Thus, the insulation layer 404 also includes a flat surface 404A in each trench 24.

Figure 28:
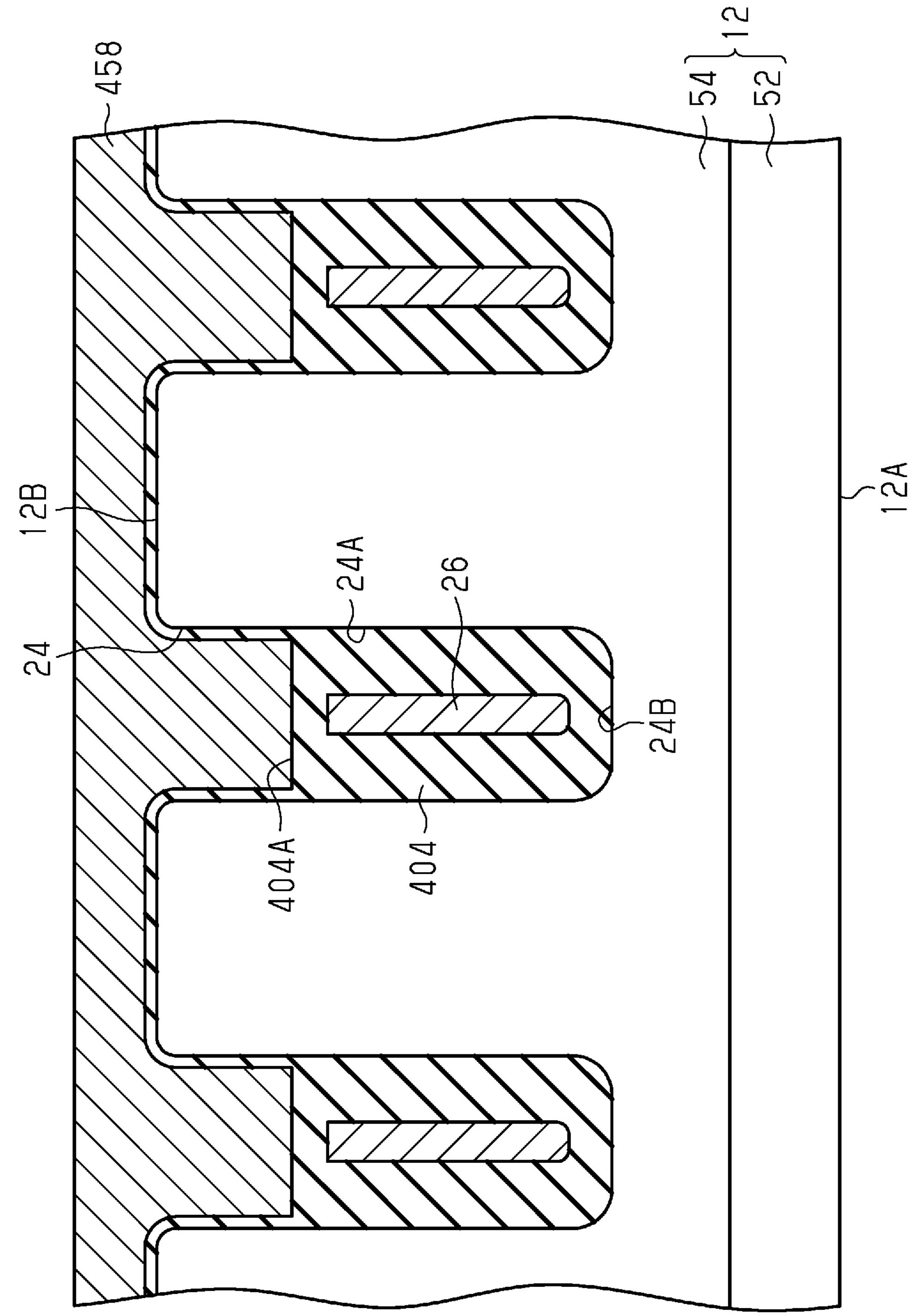
FIG. 28 is a schematic cross-sectional view illustrating a manufacturing step following the step of FIG. 27.

FIG. 28 is a schematic cross-sectional view illustrating a manufacturing step following the step of FIG. 27. As shown in FIG. 28, a second conductive layer 458 is formed on the insulation layer 404. The second conductive layer 458 may be formed from, for example, polysilicon, which is conductive. The second conductive layer 458 is embedded in each trench 24 on the insulation layer 404, which includes the flat surface 404A.

Figure 29:
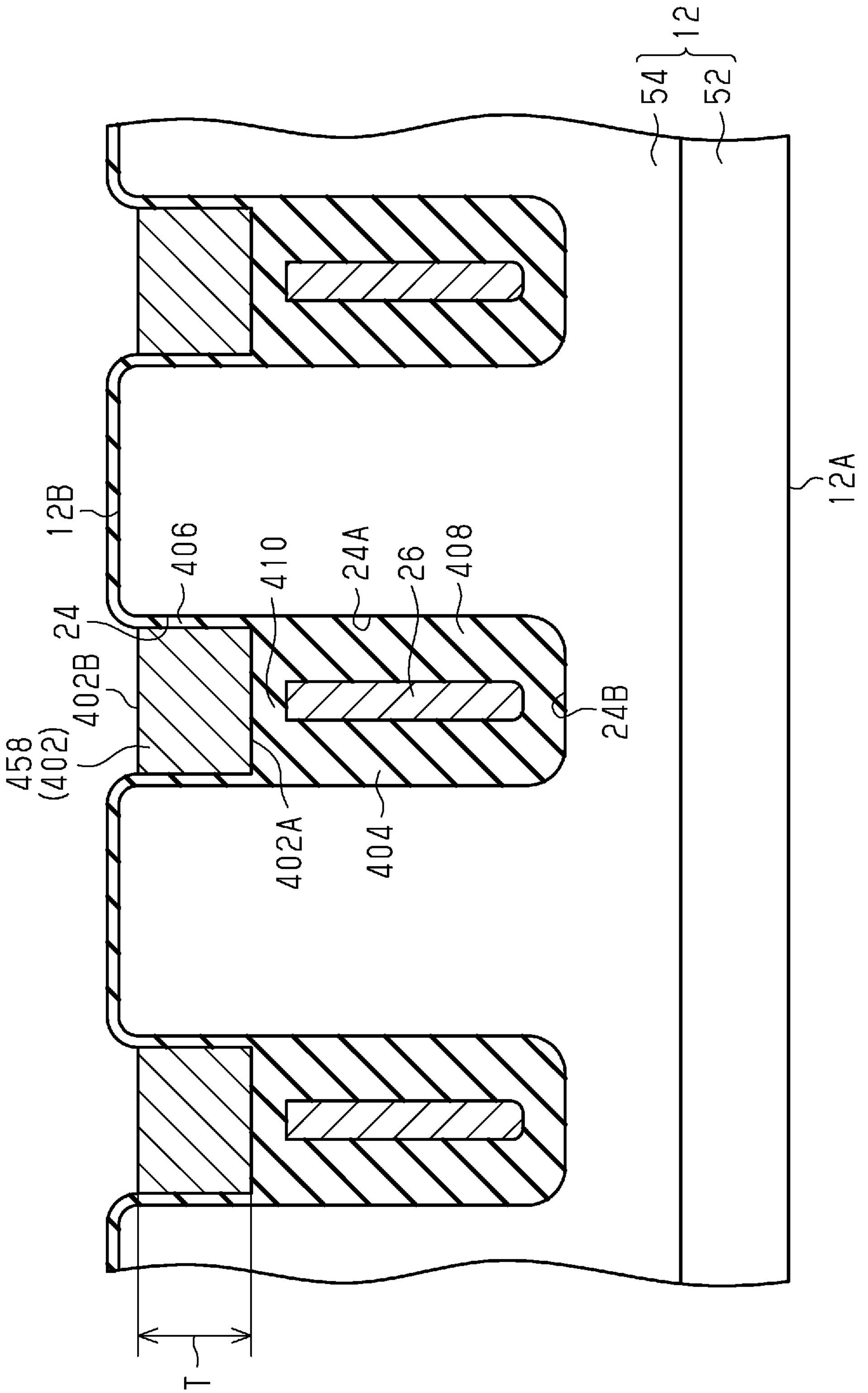
FIG. 29 is a schematic cross-sectional view illustrating a manufacturing step following the step of FIG. 28.

FIG. 29 is a schematic cross-sectional view illustrating a manufacturing step following the step of FIG. 28. As shown in FIG. 29, parts of the second conductive layer 458 are removed. The second conductive layer 458 is etched to expose the insulation layer 404 that covers the second surface 12B of the semiconductor layer 12, and arrange the upper surface 402B of the gate electrode 402 downward from the second surface 12B of the semiconductor layer 12. As a result, the gate electrode 402 is formed in each trench 24. As described above, the insulation layer 404 includes the flat surface 404A in each trench 24 (refer to FIG. 28). Thus, the gate electrode 402 is formed so as to have a rectangular cross section.

Figure 30:
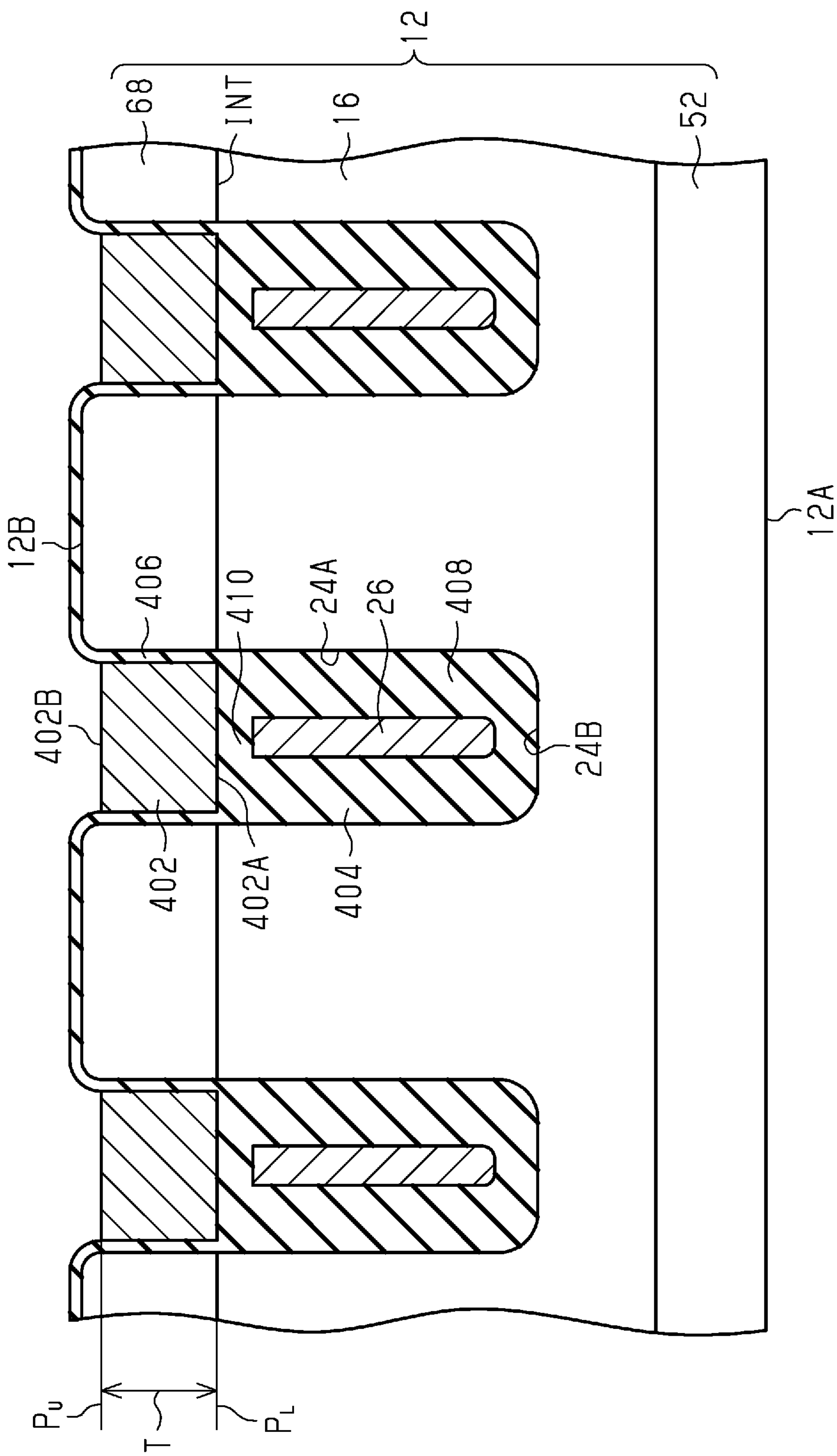
FIG. 30 is a schematic cross-sectional view illustrating a manufacturing step following the step of FIG. 29.

FIG. 30 is a schematic cross-sectional view illustrating a manufacturing step following the step of FIG. 29. As shown in FIG. 30, the p-type region 68 and the drift region 16 are formed in the epitaxial layer 54. In further detail, ion implantation is performed with an ion implantation mask (not shown) to implant a p-type impurity from the surface of the epitaxial layer 54 (n-type Si layer), or the second surface 12B of semiconductor layer 12, to form the p-type region 68 in an outer portion of the epitaxial layer 54. The remaining portion of the epitaxial layer 54 forms the n-type drift region 16. The ion implantation that forms the p-type region 68 is performed in steps by varying the acceleration energy.

The p-type region 68 ultimately becomes the body region 18 (refer to FIG. 21). The interface of the drift region 16 and the p-type region 68 corresponds to the interface INT of the drift region 16 and the body region 18 shown in FIG. 21. Accordingly, in this step, the p-type region 68 (body region 18) is formed so that the interface of the drift region 16 and the p-type region 68 (body region 18) is aligned with the lower end position $P_L$ of the gate electrode 402.

Figure 31:
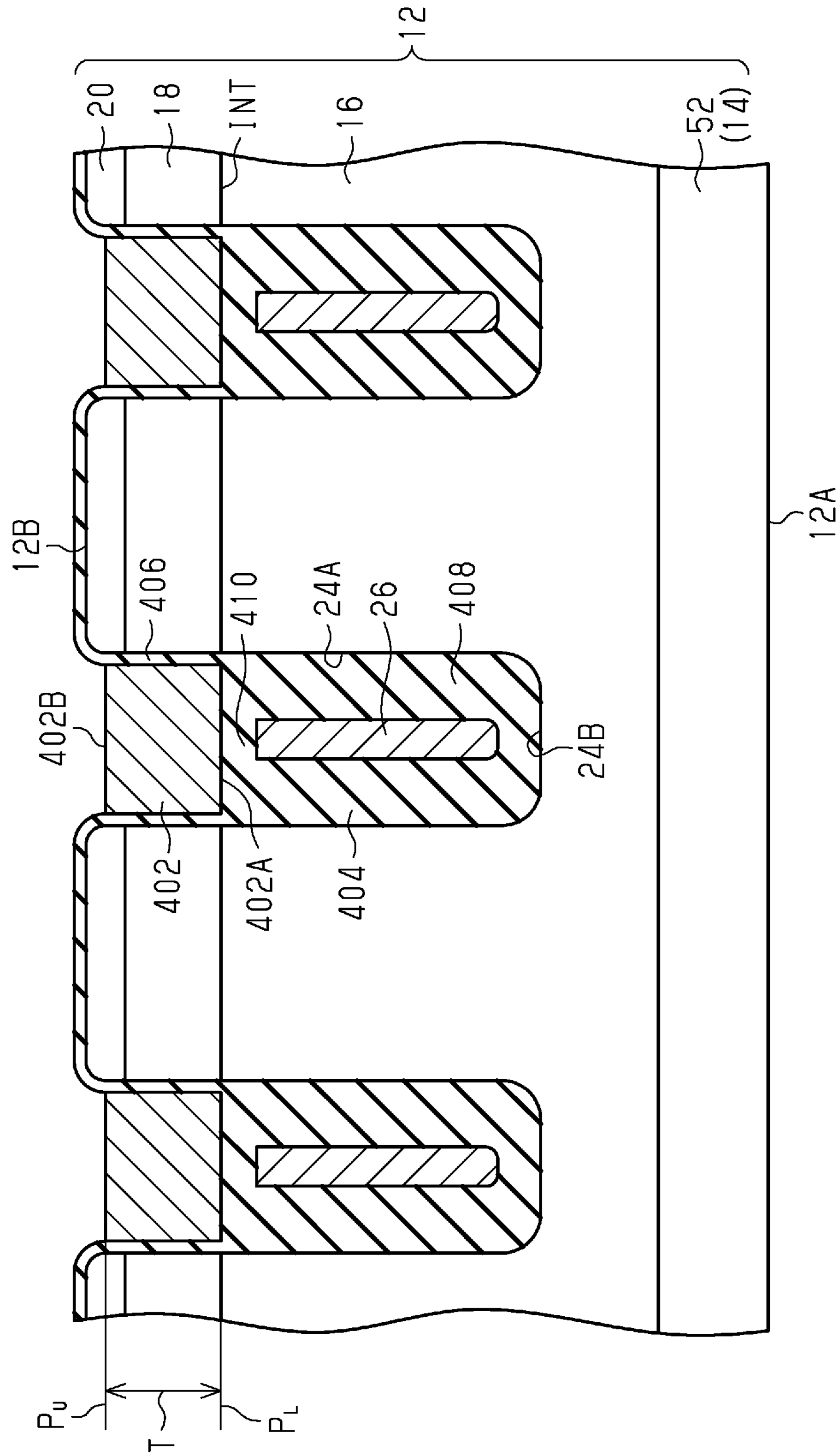
FIG. 31 is a schematic cross-sectional view illustrating a manufacturing step following the step of FIG. 30.

FIG. 31 is a schematic cross-sectional view illustrating a manufacturing step following the step of FIG. 30. As shown in FIG. 31, the source region 20 and the body region 18 are formed in the p-type region 68. In further detail, ion implantation is performed with an ion implantation mask (not shown) to implant an n-type impurity from the surface of the p-type region 68, or the second surface 12B of the semiconductor layer 12, to form the n-type source region 20 in the outer portion of the p-type region 68. The remaining portion of the p-type region 68 forms the p-type body region 18. The semiconductor substrate 52 corresponds to the drain region 14 of FIG. 1.

In this manner, in the method for manufacturing the semiconductor device 400, forming the semiconductor layer 12 includes forming the drift region 16 of the first conductive type, forming the body region 18 of the second conductive type on the drift region 16, and forming the source region 20 of the first conductive type including the second surface 12B of the semiconductor layer 12 on the body region 18. Further, forming the body region 18 includes forming the body region 18 so that the interface INT of the drift region 16 and the body region 18 is aligned with the lower end position $P_L$ of the gate electrode 402.

Figure 32:
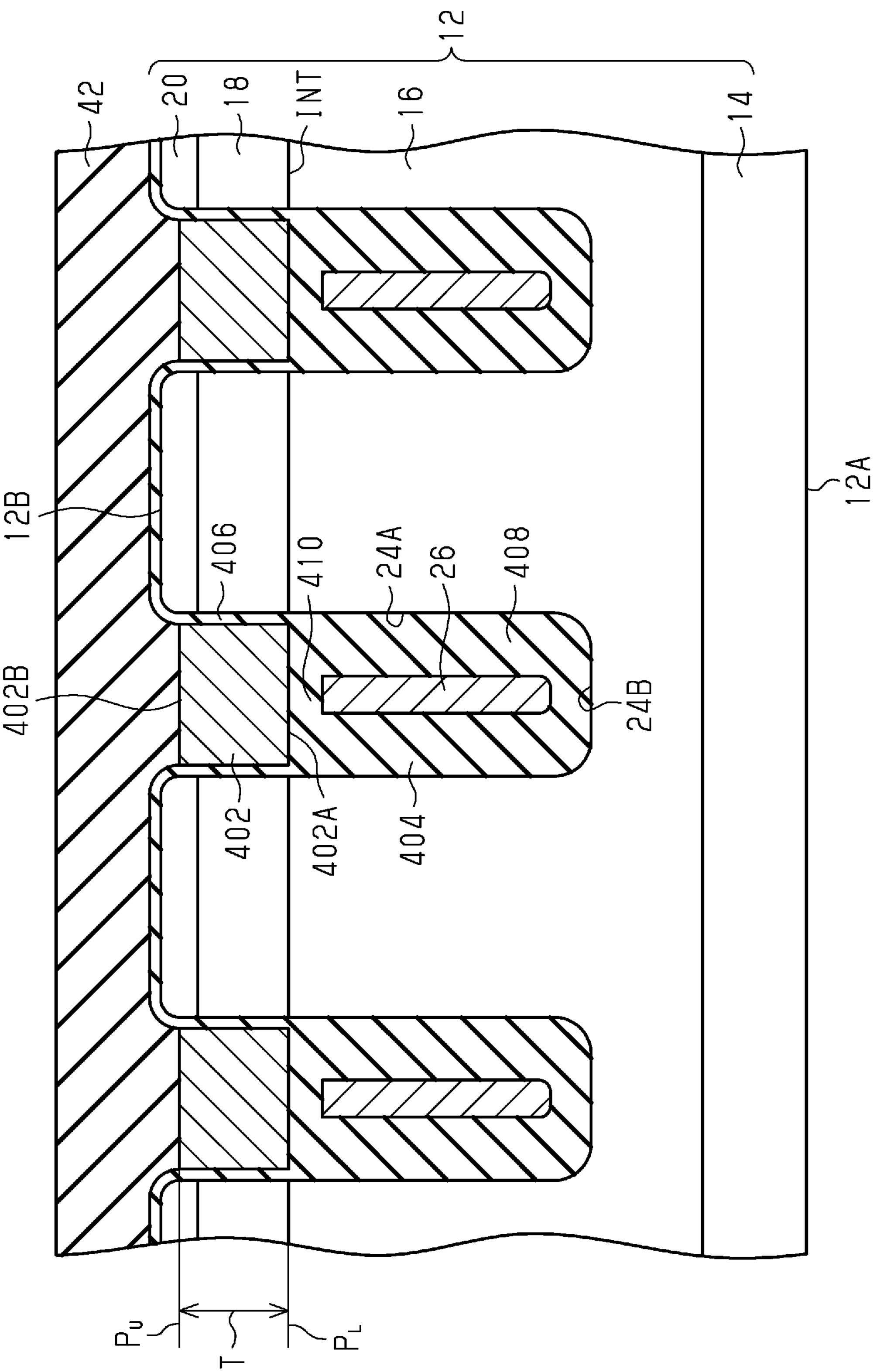
FIG. 32 is a schematic cross-sectional view illustrating a manufacturing step following the step of FIG. 31.

FIG. 32 is a schematic cross-sectional view illustrating a manufacturing step following the step of FIG. 31. As shown in FIG. 32, the interlayer insulation layer 42 is formed covering the insulation layer 404 and the gate electrode 402. In one example, the interlayer insulation layer 42 may be formed through CVD.

Then, the contact trenches 44, the contact region 46, the source contacts 48, the source interconnect 50, and the drain electrode 22 shown in FIG. 21 are formed. First, parts of the interlayer insulation layer 42 are selectively removed to form the contact trenches 44. Then, ion implantation is performed to implant a p-type impurity from the bottom surface of each contact trench 44 and form the contact region 46. The source contact 48 is embedded in each contact trench 44 in contact with the contact region 46. The source interconnect 50 is formed on the interlayer insulation layer 42 and electrically connected to the source contacts 48. The drain electrode 22 is formed on the first surface 12A of the semiconductor layer 12. Consequently, the semiconductor device 400 is obtained.

Advantage

The semiconductor device 400 in accordance with the present embodiment has the advantage described below.

(2-1) The interface INT of the drift region 16 and the body region 18 is aligned with the lower end position $P_L$ of the gate electrode 402 in the depth direction of the trench 24. This configuration eliminates most of the region where the gate electrode 402 and the drift region 16 face each other. Accordingly, the gate-drain capacitance $C_{gd}$ is drastically reduced, and the electric field applied to the insulation layer 404, which is located between the gate electrode 402 and the drift region 16, is reduced.

Third Embodiment

Figure 33:
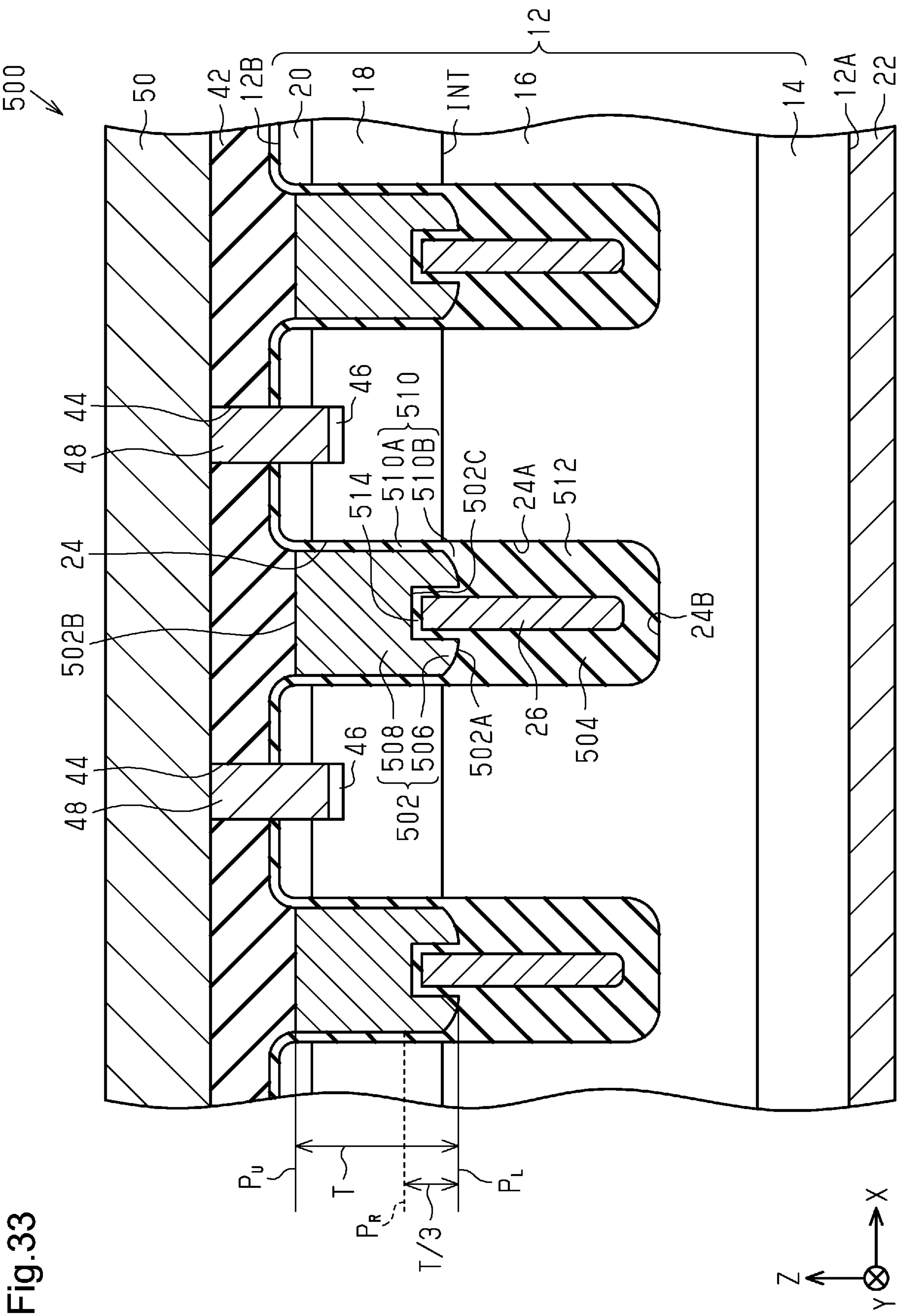
FIG. 33 is a schematic cross-sectional view of an exemplary semiconductor device in accordance with a third embodiment.

FIG. 33 is a schematic cross-sectional view of an exemplary semiconductor device 500 in accordance with a third embodiment. In FIG. 33, same reference characters are given to those elements that are the same as the corresponding elements in the semiconductor device 10 of the first embodiment. Components that are the same as the corresponding components of the first embodiment will not be described in detail.

The semiconductor device 500 includes the field plate electrode 26 formed in each trench 24, a gate electrode 502 formed in each trench 24, and an insulation layer 504 that isolates the field plate electrode 26 and the gate electrode 502 and covers the side wall 24A and the bottom wall 24B in each trench 24. The gate electrode 502 is located upward from the field plate electrode 26 in each trench 24.

The gate electrode 502 includes a bottom surface 502A that at least partially faces the field plate electrode 26. The gate electrode 502 also includes an upper surface 502B opposite to the bottom surface 502A. The upper surface 502B of the gate electrode 502 may be located downward from the second surface 12B of the semiconductor layer 12. The bottom surface 502A of the gate electrode 502 may include a recess 502C formed in the middle portion of the bottom surface 502A, and the field plate electrode 26 may be partially accommodated in the recess 502C.

The gate electrode 502 has a thickness T in the depth direction of the trench 24 (Z-axis direction in FIG. 33). The thickness T of the gate electrode 502 may be defined as the distance between the lower end position $P_L$ and the upper end position Pu of the gate electrode 502 in the depth direction of the trench 24. When the bottom surface 502A of the gate electrode 502 is curved as shown in the example of FIG. 33, the lower end position $P_L$ is where the bottom surface 502A is the closest to the field plate electrode 26 or the bottom wall 24B of the trench 24 in the depth direction of the trench 24. In the present embodiment, the bottom surface 502A is curved so as to be downwardly bulged, and the bottom surface 502A includes the recess 502C formed in the middle portion. Accordingly, the lower end position $P_L$ of the bottom surface 502A is where the edge of the recess 502C is located.

When the upper surface 502B of the gate electrode 502 is a flat surface that is orthogonal to the Z-axis direction as shown in FIG. 33, the upper end position Pu of the gate electrode 502 lies substantially along the same plane as the upper surface 502B of the gate electrode 502. That is, the upper end position Pu of the gate electrode 502 is where the upper surface 502B of the gate electrode 502 is located. In this case, the thickness T corresponds to the distance between the lower end position $P_L$ of the gate electrode 502 and the upper surface 502B in the depth direction of the trench 24.

In another example, the upper surface 502B of the gate electrode 502 may also be curved. When the upper surface 502B is curved, the upper end position Pu is where the upper surface 502B is the closest to the second surface 12B of the semiconductor layer 12 in the depth direction of the trench 24.

Regardless of how the bottom surface 502A and the upper surface 502B are shaped, the upper end position Pu of the gate electrode 502 is where the lower end position $P_L$ is the farthest in the depth direction of the trench 24. In the same manner, the lower end position $P_L$ of the gate electrode 502 is where the upper end position Pu is the farthest in the depth direction of the trench 24.

The gate electrode 502 includes a bottom portion 506 including the bottom surface 502A and a main portion 508 formed on the bottom portion 506. The gate electrode 502 has a width in the second direction (X-axis direction in FIG. 33) that is orthogonal to the depth direction of the trench 24 and the first direction. The bottom portion 506 is narrower than the main portion 508. In the present embodiment, the main portion 508 may have a substantially constant width in the depth direction of the trench 24. In contrast, the bottom portion 506 may be narrowed in the second direction toward the bottom wall 24B of the trench 24 by curving the bottom surface 502A.

The insulation layer 504 includes a gate insulator 510 that is located between the gate electrode 502 and the semiconductor layer 12 and covers the side wall 24A in the trench 24. As shown in FIG. 33, the gate insulator 510 isolates the gate electrode 502 and the semiconductor layer 12 in the X-axis direction. A predetermined voltage is applied to the gate electrode 502 to form a channel in the p-type body region 18 that is adjacent to the gate insulator 510. The semiconductor device 500 allows for control of the flow of electrons in the Z-axis direction between the n-type source region 20 and the n-type drift region 16.

The gate insulator 510 includes a first portion 510A, formed between the body region 18 and the main portion 508 of the gate electrode 502, and a second portion 510B, adjacent to the bottom portion 506 of the gate electrode 502. The second portion 510B is thicker than the first portion 510A on the side wall 24A of the trench 24. As shown in the example of FIG. 33, the first portion 510A may have a substantially constant thickness on the side wall 24A of the trench 24. In contrast, the second portion 510B is thicker than the first portion 510A on the side wall 24A of the trench 24 and thickens toward the bottom wall 24B of the trench 24.

The insulation layer 504 further includes a lower insulator 512, located between the field plate electrode 26 and the semiconductor layer 12 and covering the side wall 24A and the bottom wall 24B in the trench 24, and an intermediate insulator 514, located between the field plate electrode 26 and the gate electrode 502 in the recess 502C. The lower insulator 512 may be thicker than the gate insulator 510 on the side wall 24A of the trench 24. In one example, the insulation layer 504 may be formed from $SiO_2$.

The interface INT of the drift region 16 and the body region 18 lies between the lower end position $P_L$ of the gate electrode 502 and the reference position PR that is located upward from the lower end position $P_L$ by ⅓ the thickness T of the gate electrode 502 in the depth direction of the trench 24.

In this manner, the interface INT of the drift region 16 and the body region 18 is located at a relatively low position within the range of the thickness T of the gate electrode 502. Thus, the interface of the drift region 16 and the gate insulator 510 has a relatively small area. In contrast, the interface of the body region 18 and the gate insulator 510 has a relatively large area.

As shown in the example of FIG. 33, the second portion 510B of the gate insulator 510 is adjacent to the drift region 16 but does not have to be adjacent to the body region 18. In this case, the interface INT of the drift region 16 and the body region 18 is located at substantially the same position as an upper end of the bottom portion 506 (bottom surface 502A) of the gate electrode 502 in the depth direction of the trench 24. The upper end of the bottom surface 502A corresponds to where the lower end of the side surface of the main portion 508 is connected. In this case, the body region 18 is adjacent to the first portion 510A of the gate insulator 510, which has a substantially constant thickness, but is not adjacent to the second portion 510B, which is thicker than the first portion 510A. In another example, the second portion 510B does not have to be adjacent to the body region 18 and the drift region 16.

One example of a method for manufacturing the semiconductor device 500 of FIG. 33 will now be described with reference to FIGS. 34 to 38. An exemplary method for manufacturing the semiconductor device 500 incudes the series of manufacturing steps illustrated in FIGS. 4 to 8 and FIGS. 22 to 25 and the manufacturing steps illustrated in FIGS. 34 to 38 following the step of FIG. 23. To facilitate understanding, in FIGS. 34 to 38, same reference characters are given to those elements that are the same as the corresponding elements shown in FIG. 1.

Figure 34:
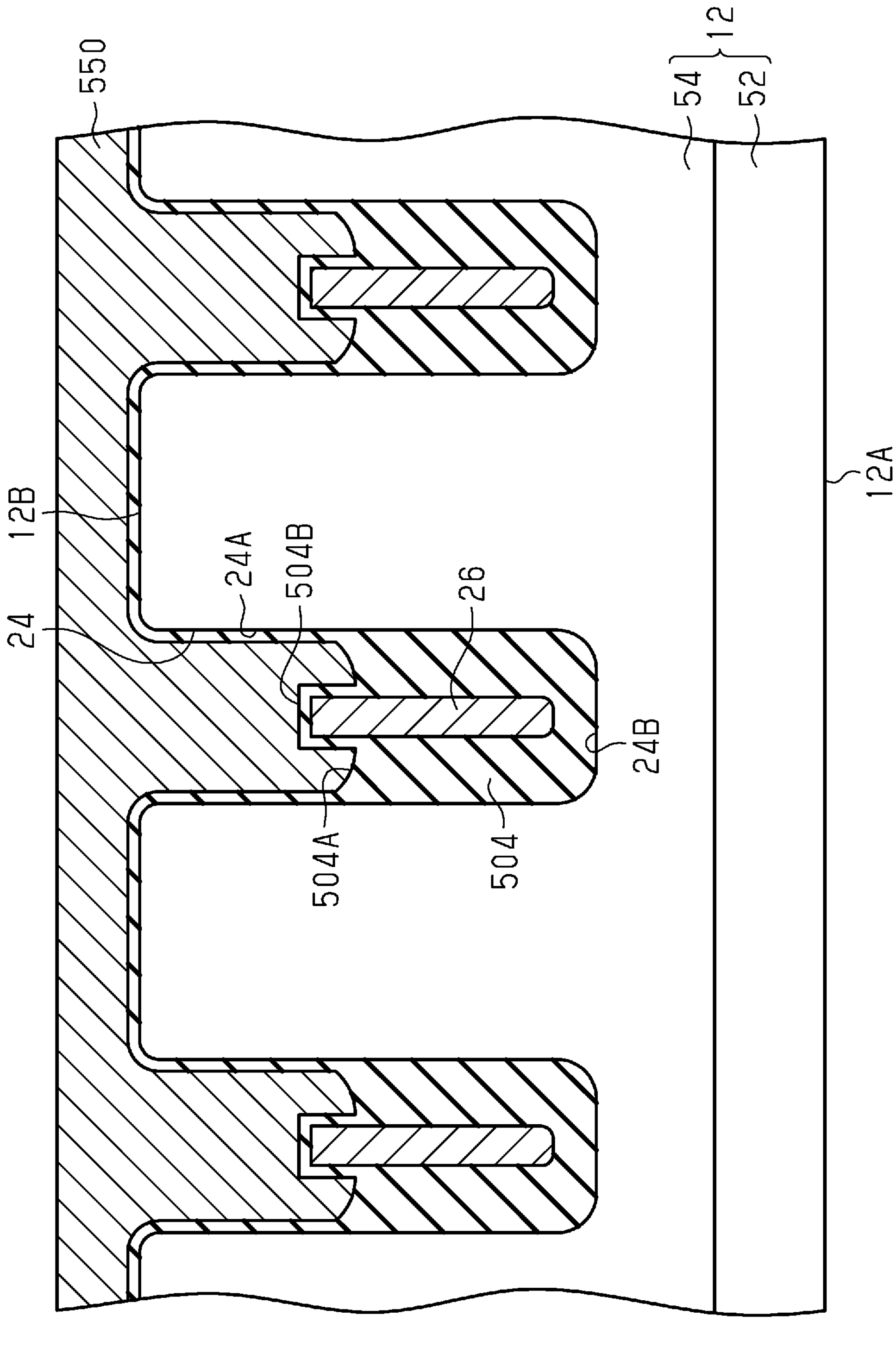
FIG. 34 is a schematic cross-sectional view showing an exemplary manufacturing step of the semiconductor device shown in FIG. 33.

FIG. 34 is a schematic cross-sectional view illustrating a manufacturing step following the step of FIG. 23. The first insulation layer 56 and the second insulation layer 450 of FIG. 23 form the insulation layer 504 of the present embodiment. As shown in FIG. 34, a second conductive layer 550 is formed on the insulation layer 504. The second conductive layer 550 may be formed from, for example, polysilicon, which is conductive. The second conductive layer 550 is embedded in each trench 24 on the insulation layer 504, which includes a curved surface 504A. The surface 504A of the insulation layer 504 includes a projection 504B. The projection 504B is located upward from the field plate electrode 26.

Figure 35:
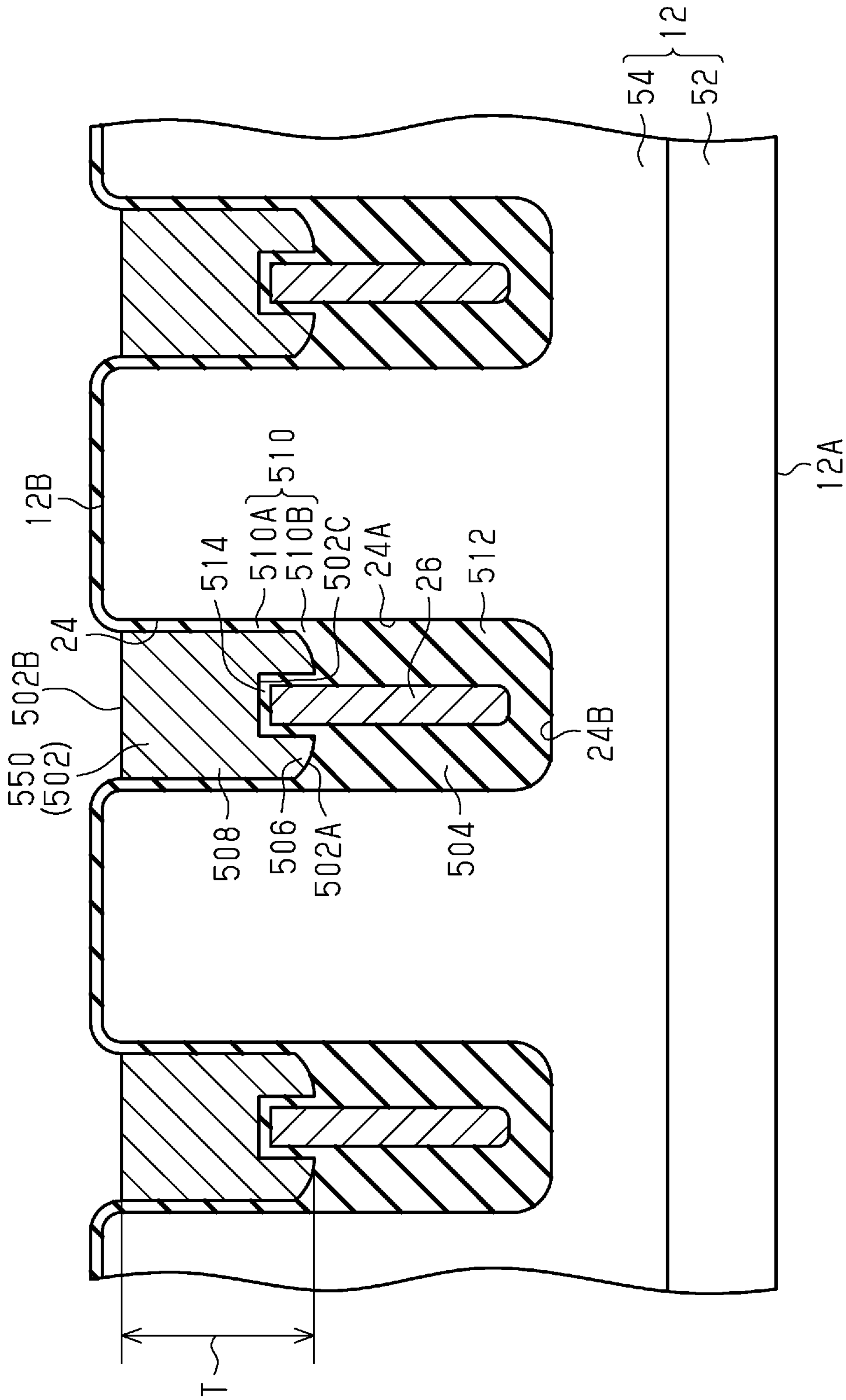
FIG. 35 is a schematic cross-sectional view illustrating a manufacturing step following the step of FIG. 34.

FIG. 35 is a schematic cross-sectional view illustrating a manufacturing step following the step of FIG. 34. As shown in FIG. 35, parts of the second conductive layer 550 are removed. The second conductive layer 550 is etched to expose the insulation layer 504 that covers the second surface 12B of the semiconductor layer 12, and arrange the upper surface 502B of the gate electrode 502 downward from the second surface 12B of the semiconductor layer 12. As a result, the gate electrode 502 is formed in each trench 24. As described above, the insulation layer 504 includes the curved surface 504A in each trench 24 (refer to FIG. 34). Thus, the gate electrode 502 is formed so that the bottom portion 506 is narrower than the main portion 508. Further, the insulation layer 504 includes the projection 504B (refer to FIG. 34) in each trench 24. Thus, the bottom surface 502A of the gate electrode 502 includes the recess 502C.

Figure 36:
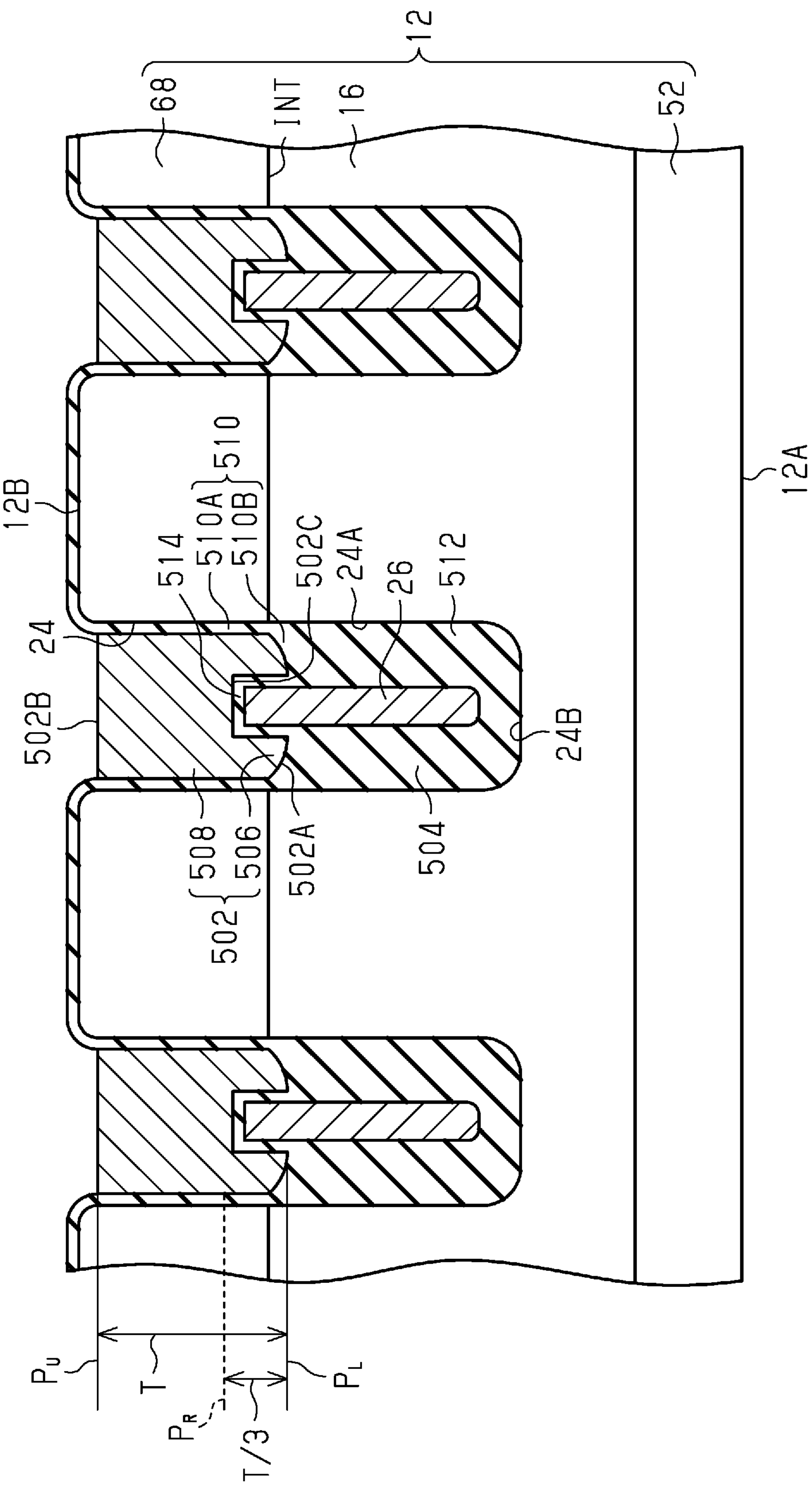
FIG. 36 is a schematic cross-sectional view illustrating a manufacturing step following the step of FIG. 35.

FIG. 36 is a schematic cross-sectional view illustrating a manufacturing step following the step of FIG. 35. As shown in FIG. 36, the p-type region 68 and the drift region 16 are formed in the epitaxial layer 54. In further detail, ion implantation is performed with an ion implantation mask (not shown) to implant a p-type impurity from the surface of the epitaxial layer 54 (n-type Si layer), or the second surface 12B of semiconductor layer 12, to form the p-type region 68 in an outer portion of the epitaxial layer 54. The remaining portion of the epitaxial layer 54 forms the n-type drift region 16. The ion implantation that forms the p-type region 68 is performed in steps by varying the acceleration energy.

The p-type region 68 ultimately becomes the body region 18 (refer to FIG. 33). The interface of the drift region 16 and the p-type region 68 corresponds to the interface INT of the drift region 16 and the body region 18 shown in FIG. 33. Accordingly, in this step, the p-type region 68 (body region 18) is formed so that the interface of the drift region 16 and the p-type region 68 (body region 18) lies between the lower end position $P_L$ of the gate electrode 502 and the reference position PR that is located upward from the lower end position $P_L$ by ⅓ the thickness T of the gate electrode 502 in the depth direction of the trench 24.

Figure 37:
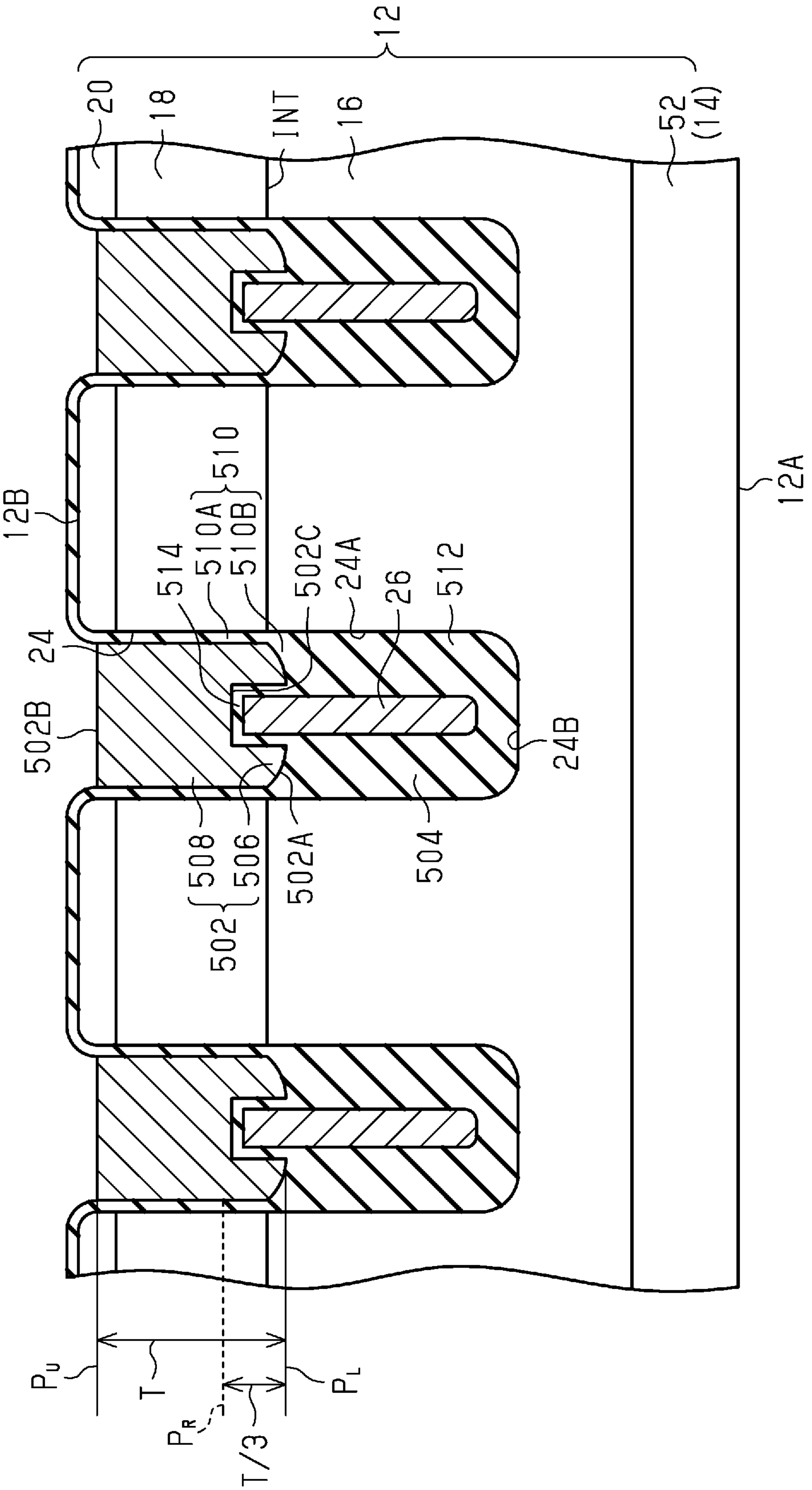
FIG. 37 is a schematic cross-sectional view illustrating a manufacturing step following the step of FIG. 36.

FIG. 37 is a schematic cross-sectional view illustrating a manufacturing step following the step of FIG. 36. As shown in FIG. 37, the source region 20 and the body region 18 are formed in the p-type region 68. In further detail, ion implantation is performed with an ion implantation mask (not shown) to implant an n-type impurity from the surface of the p-type region 68, or the second surface 12B of the semiconductor layer 12, to form the n-type source region 20 in the outer portion of the p-type region 68. The remaining portion of the p-type region 68 forms the p-type body region 18. The semiconductor substrate 52 corresponds to the drain region 14 of FIG. 33. This forms the semiconductor layer 12 that includes the drain region 14, the drift region 16, the body region 18, and the source region 20.

Figure 38:
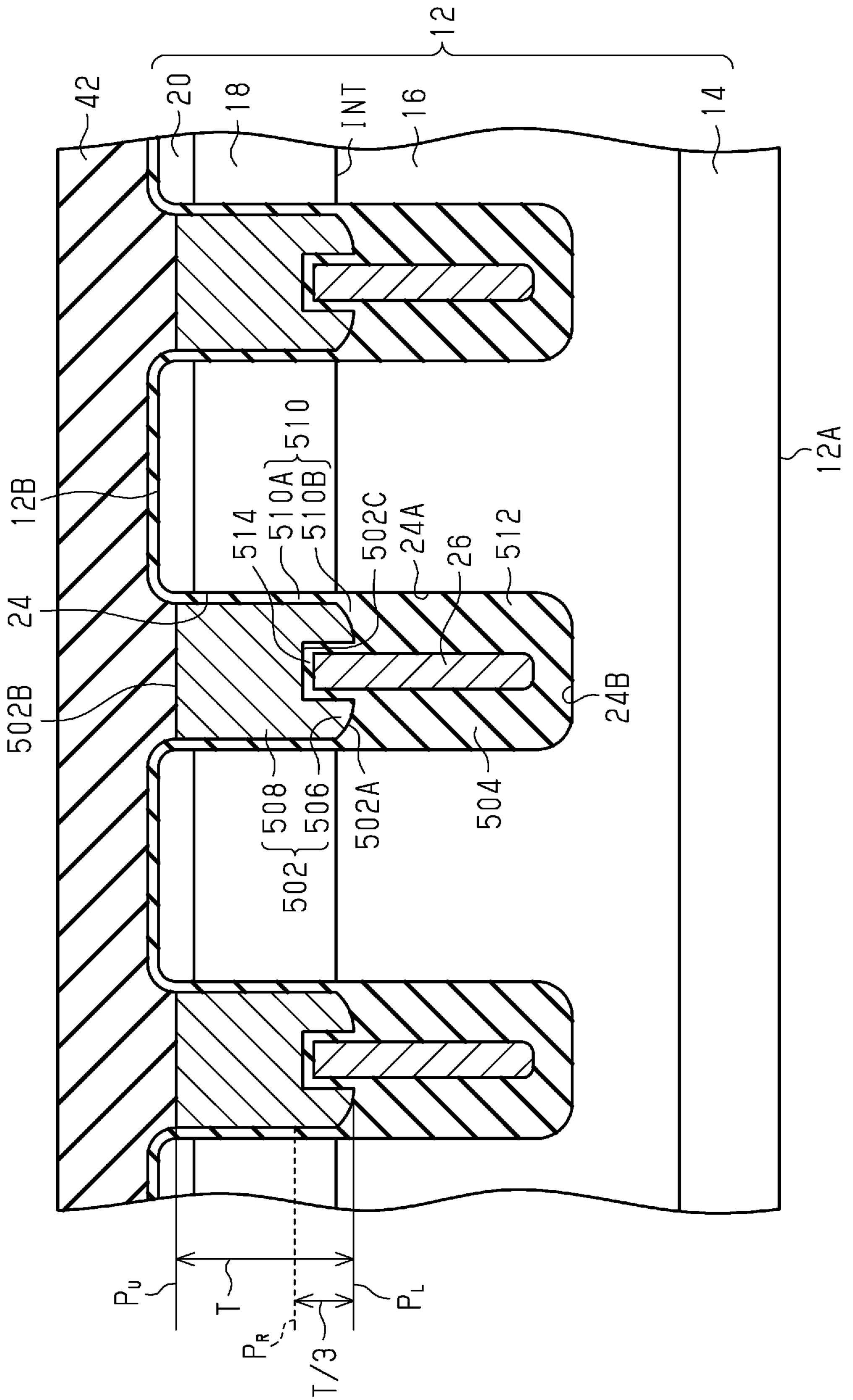
FIG. 38 is a schematic cross-sectional view illustrating a manufacturing step following the step of FIG. 37.

FIG. 38 is a schematic cross-sectional view illustrating a manufacturing step following the step of FIG. 37. As shown in FIG. 38, the interlayer insulation layer 42 is formed covering the insulation layer 504 and the gate electrode 502. In one example, the interlayer insulation layer 42 may be formed through CVD.

Then, the contact trenches 44, the contact region 46, the source contacts 48, the source interconnect 50, and the drain electrode 22 shown in FIG. 33 are formed. First, parts of the interlayer insulation layer 42 are selectively removed to form the contact trenches 44. Then, ion implantation is performed to implant a p-type impurity from the bottom surface of each contact trench 44 and form the contact region 46. The source contact 48 is embedded in each contact trench 44 in contact with the contact region 46. The source interconnect 50 is formed on the interlayer insulation layer 42 and electrically connected to the source contacts 48. The drain electrode 22 is formed on the first surface 12A of the semiconductor layer 12. Consequently, the semiconductor device 500 is obtained.

Operation

The operation of the semiconductor device 500 in accordance with the present embodiment will now be described.

In the semiconductor device 500 in accordance with the present embodiment, the interface INT of the drift region 16 and the body region 18 lies between the lower end position $P_L$ of the gate electrode 502 and the reference position PR that is located upward from the lower end position $P_L$ by ⅓ the thickness T of the gate electrode 502 in the depth direction of the trench 24. In this manner, the interface INT of the drift region 16 and the body region 18 is located near the lower end position $P_L$ of the gate electrode 502 to decrease the area of the region where the gate electrode 502 and the drift region 16 face each other. The region where the gate electrode 502 and the drift region 16 face each other through the gate insulator 510 has a relatively large effect on the gate-drain capacitance $C_{gd}$. Accordingly, the interface INT of the drift region 16 and the body region 18 located between the lower end position $P_L$ and the reference position PR reduces the gate-drain capacitance Co. Additionally, the electric field applied to the insulation layer 504 is reduced between the gate electrode 502 and the drift region 16.

Further, in the semiconductor device 500 in accordance with the present embodiment, the gate electrode 502 includes the bottom portion 506 and the main portion 508, which is formed on the bottom portion 506. The bottom portion 506 is narrower than the main portion 508 in the second direction. Accordingly, in the gate insulator 510 that covers the side wall 24A of the trench 24, the second portion 510B, which is adjacent to the bottom portion 506 of the gate electrode 502, is thicker than the first portion 510A, which is located between the main portion 508 of the gate electrode 502 and the body region 18. The second portion 510B of the gate insulator 510 that is adjacent to the bottom portion 506 of the gate electrode 502 and thicker than the first portion 510A increases the distance between the gate electrode 502 and the drift region 16 in the vicinity of the lower end position $P_L$ of the gate electrode 502. As a result, even though the interface INT of the drift region 16 and the body region 18 is located upward from the lower end position $P_L$ of the gate electrode 502, increases in the gate-drain capacitance $C_{gd}$ are limited.

As described above, the gate-drain capacitance $C_{gd}$ becomes lower as the interface INT of the drift region 16 and the body region 18 becomes closer to the lower end position $P_L$ of the gate electrode 502 in the depth direction of the trench 24. However, the on resistance may rise suddenly if, for example, processing variations cause the interface INT of the drift region 16 and the body region 18 to be arranged downward from the lower end position $P_L$ of the gate electrode 502.

To avoid such sudden rise of the on resistance, the interface INT of the drift region 16 and the body region 18 may be located upward from the lower end position $P_L$. In this case, the gate electrode 502 and the drift region 16 face each other through at least part of the second portion 510B of the gate insulator 510 (in the example of FIG. 33, the entire second portion 36B) and increases the gate-drain capacitance $C_{gd}$ at this portion. However, in the present embodiment, the second portion 510B of the gate insulator 510, which is adjacent to the bottom portion 506 of the gate electrode 502, is thicker than the first portion 510A. Thus, the increase in the gate-drain capacitance $C_{gd}$ is relatively small. Further, the second portion 510B of the gate insulator 510 becomes thicker on the side wall 24A of the trench 24 as the bottom wall 24B of the trench 24 becomes closer. This limits sudden rises in the on resistance even if processing variations change the location of the interface INT of the drift region 16 and the body region 18. In this manner, the semiconductor device 500 in accordance with the present embodiment limits sudden rises in the on resistance caused by processing variations without excessively increasing the gate-drain capacitance $C_{gd}$.

Advantages

The semiconductor device 500 in accordance with the present embodiment has the advantages described below.

(3-1) The interface INT of the drift region 16 and the body region 18 lies between the lower end position $P_L$ of the gate electrode 502 and the reference position PR that is located upward from the lower end position $P_L$ by ⅓ the thickness T of the gate electrode 502 in the depth direction of the trench 24.

This configuration decreases the area of the region where the gate electrode 502 and the drift region 16 face each other. Accordingly, the gate-drain capacitance $C_{gd}$ is reduced, and the electric field applied to the insulation layer 504, which is located between the gate electrode 502 and the drift region 16, is reduced.

(3-2) The gate electrode 502 includes the bottom portion 506, which includes the bottom surface 502A, and the main portion 508, which is formed on the bottom portion 506. The bottom portion 506 is narrower in the second direction than the main portion 508. The gate insulator 510 includes the first portion 510A, which is located between the body region 18 and the main portion 508 of the gate electrode 502, and the second portion 510B, which is adjacent to the bottom portion 506 of the gate electrode 502. The second portion 510B is thicker than the first portion 510A on the side wall 24A of the trench 24.

This configuration increases the distance between the gate electrode 502 and the drift region 16 in the vicinity of the lower end position $P_L$ of the gate electrode 502. Accordingly, even though the interface INT of the drift region 16 and the body region 18 is located upward from the lower end position $P_L$ of the gate electrode 502, increases in the gate-drain capacitance $C_{gd}$ are limited.

(3-3) The second portion 510B of the gate insulator 510 becomes thicker on the side wall 24A of the trench 24 as the bottom wall 24B of the trench 24 becomes closer.

This configuration limits sudden rises in the on resistance caused by processing variations.

(3-4) The interface INT of the drift region 16 and the body region 18 is located at the same position as the upper end of the bottom portion 506 in the depth direction of the trench 24, and the second portion 510B of the gate insulator 510 is adjacent to the drift region 16 but not adjacent to the body region 18.

In this configuration, the body region 18, in which the channel is formed, is not adjacent to the second portion 510B, which is thicker than the first portion 510A. This limits increases in the on resistance.

Modified Examples of Formation Pattern of Semiconductor Device

Figure 39:
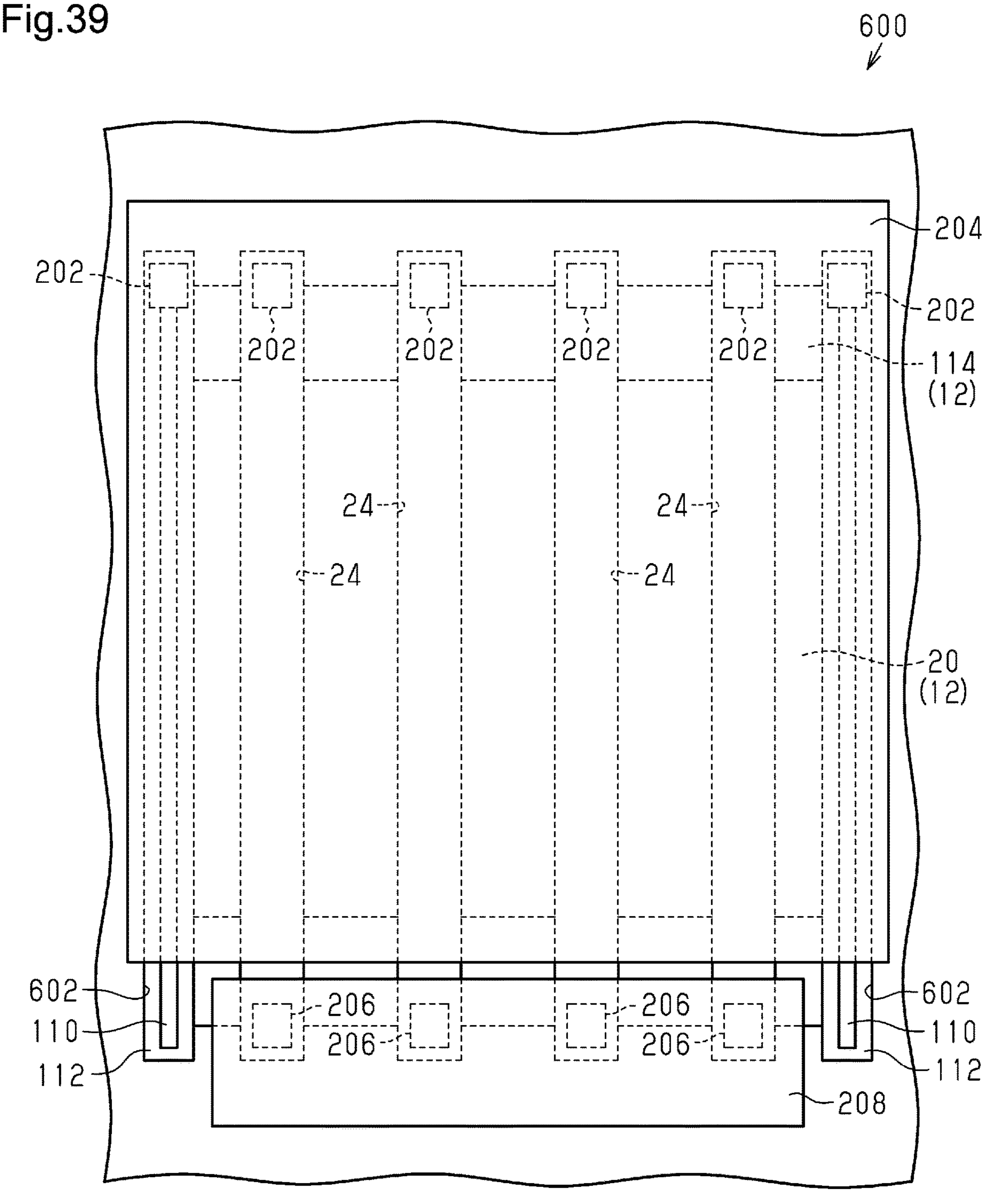
FIG. 39 is a schematic top view showing a modified example of the formation pattern in the semiconductor device of FIG. 1.
Figure 40:
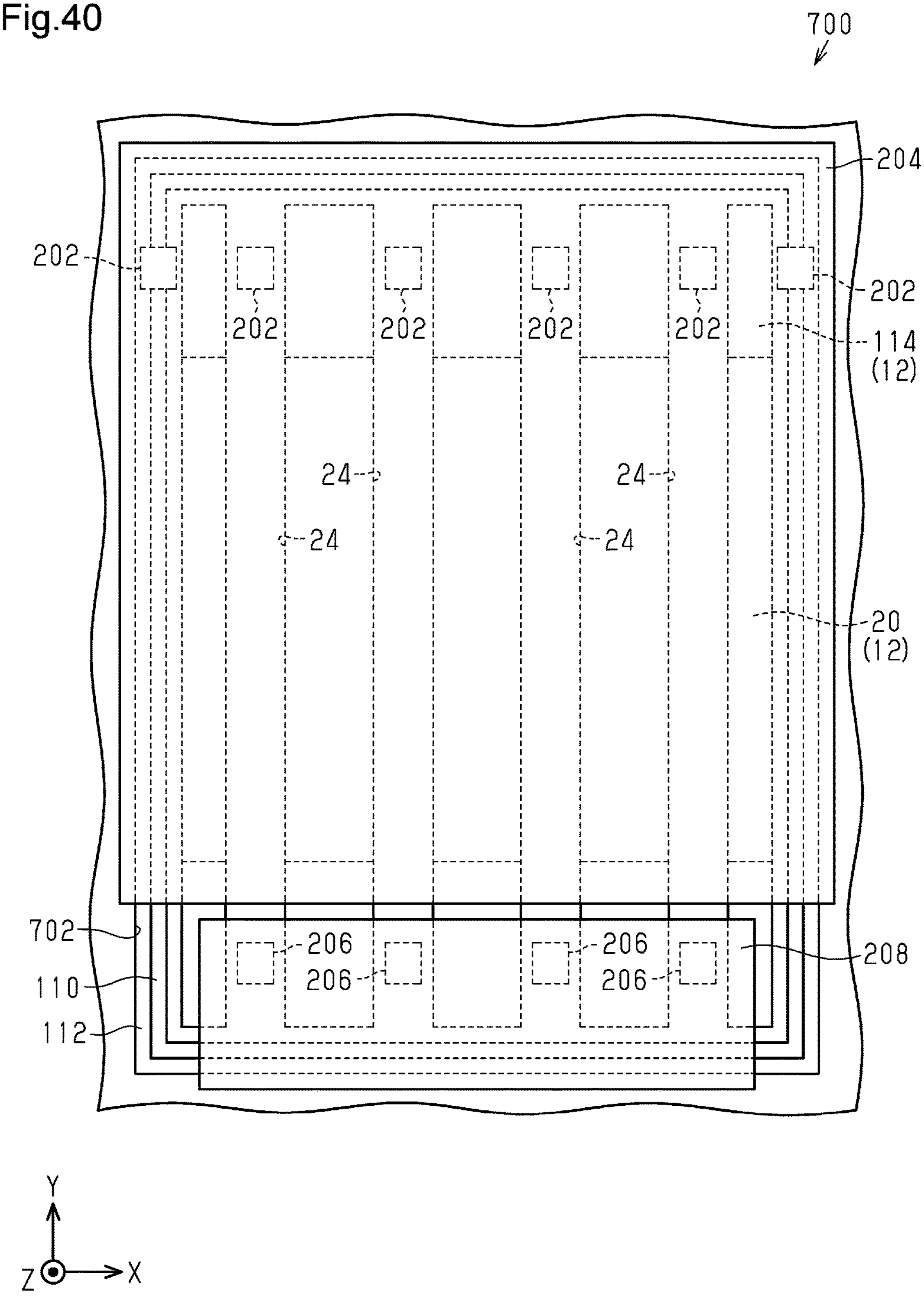
FIG. 40 is a schematic top view showing a modified example of the formation pattern in the semiconductor device of FIG. 1.

FIGS. 39 and 40 are schematic top plan views showing modified examples of the formation pattern in the semiconductor device 10 shown in FIG. 1. To facilitate understanding, in FIGS. 39 and 40, same reference characters are given to those elements that are the same as the corresponding elements shown in FIGS. 1 and 2. Further, elements located below the source interconnect 204 and the gate interconnect 208 and an interconnect insulation layer formed between the source interconnect 204 and the gate interconnect 208 are not shown in the drawings for the sake of brevity.

FIG. 39 shows a formation pattern 600 including the trenches 24, which are in a striped array, and two trenches 602. The two trenches 602 extend in the same direction as the trenches 24 (Y-axis direction in FIG. 39). Accordingly, the trenches 24 may be parallel to the trenches 602. The trenches 24 are located between the two trenches 602. In the example of FIG. 39, one of the two trenches 602, the trenches 24, and the other one of the two trenches 602 are arranged in order in the X-axis direction. Each of the two trenches 602 may have substantially the same length as the trenches 24. The trenches 24 and the two trenches 602 are partially covered by the source interconnect 204 and the gate interconnect 208, which is separated from the source interconnect 204. The source interconnect 204 may be arranged to at least cover the entire source region 20. The first electrode 106 (refer to FIG. 2), which is located toward one of the ends in each trench 24, is connected by a source contact 202 to the source interconnect 204. In the same manner, the second electrode 110 in the trenches 602 is also connected by the source contacts 202 to the source interconnect 204. The gate electrode 28 (refer to FIGS. 1 and 2) that is located toward the other one of the ends in each trench 24 is connected by the gate contact 206 to the gate interconnect 208.

FIG. 40 shows a formation pattern 700 including the trenches 24, which are in a striped array, and a trench 702, which surrounds the trenches 24. The trench 702 may have the form of a rectangular frame surrounding the trenches 24 in plan view. In this case, the trench 702 may include two portions that extend in the X-axis direction and two portions that extend in the Y-axis direction and connect the two portions extending in the X-axis direction. The two ends of each trench 24 are connected to the trench 702 (specifically, the two portions extending in X-axis direction). The trenches 24 and the trench 702 are partially covered by the source interconnect 204 and the gate interconnect 208, which is separated from the source interconnect 204. The source interconnect 204 may be arranged to at least cover the entire source region 20. The first electrode 106 (refer to FIG. 2), which is located toward one of the ends in each trench 24, is connected by a source contact 202 to the source interconnect 204. In the same manner, the second electrode 110 in the trenches 702 is also connected by the source contacts 202 to the source interconnect 204. The gate electrode 28 (refer to FIGS. 1 and 2) that is located toward the other one of the ends in each trench 24 is connected by the gate contact 206 to the gate interconnect 208.

The formation patterns 100, 200, 600, and 700 respectively illustrated in FIGS. 2, 3, 39, and 40 may be applied to the semiconductor devices 300, 400, and 500 in accordance with the other embodiments.

Other Modified Examples

The above embodiments may be modified as described below. The above-described embodiments and the modified examples described below may be combined as long as there is no technical contradiction.

In each of the above embodiments, the conductive type of each region in the semiconductor layer 12 may be reversed. That is, a p-type region may be changed to an n-type region, and an n-type region may be changed to a p-type region.

In the first embodiment or the second embodiment, the bottom surface 28A of the gate electrode 28 or the bottom surface 402A of the gate electrode 402 may include a recess.

In the first embodiment or the second embodiment, the bottom surface 28A of the gate electrode 28 or the bottom surface 402A of the gate electrode 402 may be curved to bulge upwardly. In this case, the upper end of the field plate electrode 26 may be located upward from the lower end position $P_L$ of the gate electrode 28 or 402 or be overlapped in the depth direction of the trench 24 with the curved bottom surface 28A or 402A.

In the first embodiment, the side surface 32A of the bottom portion 32 of the gate electrode 28 may be substantially orthogonal to the bottom surface 28A. In this case, the bottom portion 32 may have a substantially constant width in the depth direction of the trench 24. The side surface 32A of the bottom portion 32 does not have to be continuous with the side surface of the main portion 34, and the bottom portion 32 and the main portion 34 that differ in width may form a step in the gate electrode 28.

In this specification, the word "on" includes the meaning of "above" in addition to the meaning of "on" unless otherwise described in the context. Accordingly, the phrase of "first layer formed on second layer" may mean that the first layer is formed directly contacting the second layer in one embodiment and that the first layer is arranged above the second layer without contacting the second layer in another embodiment. Thus, the word "on" will also allow for a structure in which another layer is arranged between the first layer and the second layer.

The Z-axis direction referred to in this specification does not necessarily have to be the vertical direction and does not necessarily have to fully coincide with the vertical direction. Accordingly, in the structures disclosed above (e.g., structure shown in FIG. 1), upward and downward in the Z-axis direction as referred to in this specification is not limited to upward and downward in the vertical direction. For example, the X-axis direction may be the vertical direction. Alternatively, the Y-axis direction may be the vertical direction.

EMBODIMENTS

Technical concepts that can be understood from each of the above embodiments and modified examples will now be described. Reference characters shown in parenthesis in the embodiments described below denote corresponding elements of the embodiments described above. The reference characters are given as examples to aid understanding and not intended to limit elements to the elements denoted by the reference characters.

Embodiment A1

A semiconductor device, including:

- a semiconductor layer (12) including a first surface (12A) and a second surface (12B) opposite to the first surface (12A);
- a trench (24) that is formed in the second surface (12B) of the semiconductor layer (12), includes a side wall (24A) and a bottom wall (24B), and extends in a first direction in plan view;
- a field plate electrode (26) formed in the trench (24);
- a gate electrode (28) formed in the trench (24), where the gate electrode (28) includes a bottom surface (28A) at least partially facing the field plate electrode (26) and having a thickness (T) in a depth direction of the trench (24); and
- an insulation layer (30) that isolates the field plate electrode (26) and the gate electrode (28) from each other and covers the side wall (24A) and the bottom wall (24B) in the trench (24), where:
- the semiconductor layer (12) includes
  - a drift region (16) of a first conductive type, and
  - a body region (18) of a second conductive type formed on the drift region (16); and
- an interface (INT) of the drift region (16) and the body region (18) lies between a lower end position ($P_L$) of the gate electrode (28) and a reference position (PR) that is located upward from the lower end position ($P_L$) by ⅓ the thickness (T) of the gate electrode (28) in the depth direction.

Embodiment A2

The semiconductor device according to embodiment A1, where the interface (INT) of the drift region (16) and the body region (18) is aligned with the lower end position ($P_L$) of the gate electrode (28) in the depth direction.

Embodiment A3

The semiconductor device according to embodiment A1 or A2, where the gate electrode (402) has a rectangular cross section.

Embodiment A4

The semiconductor device according to embodiment A1 or A2, where:

- the gate electrode (28) has a width in a second direction that is orthogonal to both of the depth direction and the first direction and includes a bottom portion (32) including the bottom surface (28A) of the gate electrode (28) and a main portion (34) formed on the bottom portion (32); and
- the bottom portion (32) is narrower than the main portion (34).

Embodiment A5

The semiconductor device according to any one of embodiments A1 to A4, where the bottom surface (502A) of the gate electrode (502) includes a recess (502C), and the field plate electrode (26) is partially accommodated in the recess (502C).

Embodiment A6

The semiconductor device according to any one of embodiments A1 to A5, where:

the bottom surface (28A) of the gate electrode (28) is a flat surface that is orthogonal to the depth direction; and the lower end position ($P_L$) of the gate electrode (28) is where the bottom surface (28A) of the gate electrode (28) is located.

Embodiment A7

The semiconductor device according to any one of embodiments A1 to A5, where:

the bottom surface (502A) of the gate electrode (502) is curved; and the lower end position ($P_L$) of the gate electrode (502) is where the bottom surface (502A) is the closest to the bottom wall (24B) of the trench (24) in the depth direction.

Embodiment A8

The semiconductor device according to any one of embodiments A1 to A7, where the semiconductor layer (12) further includes a source region (20) of the first conductive type formed on the body region (18), and the source region (20) includes the second surface (12B) of the semiconductor layer (12).

Embodiment A9

The semiconductor device according to embodiment A8, where the trench (24) extends through the source region (20) and the body region (18) to the drift region (16).

Embodiment A10

The semiconductor device according to embodiment A8 or A9, where a potential at the field plate electrode (26) is the same as that at the source region (20).

Embodiment A11

A method for manufacturing a semiconductor device, the method including:

forming a semiconductor layer (12) including a first surface (12A) and a second surface (12B) opposite to the first surface (12A);

forming a trench (24) in the second surface (12B) of the semiconductor layer (12) that includes a side wall (24A) and a bottom wall (24B) and extends in a first direction in plan view;

forming a field plate electrode (26) in the trench (24);

forming a gate electrode (28) in the trench (24) that includes a bottom surface (28A) at least partially facing the field plate electrode (26) and has a thickness (T) in a depth direction of the trench (24); and forming an insulation layer (30) that isolates the field plate electrode (26) and the gate electrode (28) from each other and covers the side wall (24A) and the bottom wall (24B) in the trench (24), where:

the forming the semiconductor layer (12) includes forming a drift region (16) of a first conductive type, and forming a body region (18) of a second conductive type on the drift region (16); and the forming the body region (18) includes forming the body region (18) so that an interface (INT) of the drift region (16) and the body region (18) lies between a lower end position ($P_L$) of the gate electrode (28) and a reference position (PR) that is located upward from the lower end position ($P_L$) by ⅓ the thickness (T) of the gate electrode (28) in the depth direction.

Embodiment A12

The method according to embodiment A9, where the forming the body region (18) includes forming the body region (18) so that the interface (INT) of the drift region (16) and the body region (18) is aligned with the lower end position ($P_L$) in the depth direction.

Embodiment B1

A semiconductor device, including:

a semiconductor layer (12) including a first surface (12A) and a second surface (12B) opposite to the first surface (12A);

a trench (24) that is formed in the second surface (12B) of the semiconductor layer (12), includes a side wall (24A) and a bottom wall (24B), and extends in a first direction in plan view;

a field plate electrode (26) formed in the trench (24);

a gate electrode (28) formed in the trench (24), where the gate electrode (28) includes a bottom surface (28A) at least partially facing the field plate electrode (26); and an insulation layer (30) that isolates the field plate electrode (26) and the gate electrode (28) from each other and covers the side wall (24A) and the bottom wall (24B) in the trench (24), where:

the semiconductor layer (12) includes a drift region (16) of a first conductive type, and a body region (18) of a second conductive type formed on the drift region (16); and the gate electrode (28) has a width in a second direction that is orthogonal to both of a depth direction of the trench (24) and the first direction and includes a bottom portion (32) including the bottom surface (28A) of the gate electrode (28) and a main portion (34) formed on the bottom portion (32);

the insulation layer (30) includes a gate insulator (36) that is located between the gate electrode (28) and the semiconductor layer (12) and covers the side wall (24A) in the trench (24);

the gate insulator (36) includes a first portion (36A) located between the body region (18) and the main portion (34) of the gate electrode (28), and a second portion (36B) adjacent to the bottom portion (32) of the gate electrode (28); and the bottom portion (32) is narrower than the main portion (34), and the second portion (36B) is thicker than the first portion (36A) on the side wall (24A) of the trench (24).

Embodiment B2

The semiconductor device according to embodiment B 1, where the second portion (36B) is formed on the side wall (24A) of the trench (24) to be thicker as the bottom wall (24B) of the trench (24) becomes closer.

Embodiment B3

The semiconductor device according to embodiment B1 or B2, where the bottom portion (32) of the gate electrode (28) is narrower as the bottom wall (24B) of the trench (24) becomes closer.

Embodiment B4

The semiconductor device according to any one of embodiments B1 to B3, where the bottom portion (32) of the gate electrode (28) includes a side surface (32A) that is continuous with the bottom surface (28A), and the side surface (32A) is angled at 115° or greater and 155° or less from the bottom surface (28A).

Embodiment B5

The semiconductor device according to any one of embodiments B1 to B4, where the first portion (36A) has a constant thickness on the side wall (24A) of the trench (24).

Embodiment B6

The semiconductor device according to any one of embodiments B1 to B5, where:

- the gate electrode (28) has a thickness (T) in the depth direction; and
- an interface (INT) of the drift region (16) and the body region (18) lies between a lower end position ($P_L$) of the gate electrode (28) and a reference position (PR) that is located upward from the lower end position ($P_L$) by ⅓ the thickness (T) of the gate electrode (28) in the depth direction.

Embodiment B7

The semiconductor device according to embodiment B6, where

- the bottom surface (28A) of the gate electrode (28) is a flat surface that is orthogonal to the depth direction; and
- the lower end position ($P_L$) of the gate electrode (28) is where the bottom surface (28A) of the gate electrode (28) is located.

Embodiment B8

The semiconductor device according to embodiment B6, where

- the bottom surface (502A) of the gate electrode (502) is curved; and
- the lower end position ($P_L$) of the gate electrode (502) is where the bottom surface (502A) is the closest to the bottom wall (24B) of the trench (24) in the depth direction.

Embodiment B9

The semiconductor device according to any one of embodiments B1 to B8, where the bottom portion (32) of the gate electrode (28) includes a side surface (32A) that is continuous with the bottom surface (28A), and an interface (INT) of the drift region (16) and the body region (18) is located at the same position as an upper end of the side surface (32A) in the depth direction.

Embodiment B10

The semiconductor device according to any one of embodiments B1 to B8, where the bottom portion (32) of the gate electrode (28) includes a side surface (32A) that is continuous with the bottom surface (28A), and an interface (INT) of the drift region (16) and the body region (18) is located downward from an upper end of the side surface (32A) in the depth direction.

Embodiment B11

The semiconductor device according to any one of embodiments B6 to B8, where the interface (INT) of the drift region (16) and the body region (18) is aligned with the lower end position ($P_L$) of the gate electrode (28) in the depth direction.

Embodiment B12

The semiconductor device according to any one of embodiments B1 to B11, where the bottom surface (502A) of the gate electrode (502) includes a recess (502C), and the field plate electrode (26) is partially accommodated in the recess (502C).

Embodiment B13

The semiconductor device according to any one of embodiments B1 to B12, where the semiconductor layer (12) further includes a source region (20) of the first conductive type formed on the body region (18), and the source region (20) includes the second surface (12B) of the semiconductor layer (12).

Embodiment B14

The semiconductor device according to embodiment B13, where the trench (24) extends through the source region (20) and the body region (18) to the drift region (16).

Embodiment B15

The semiconductor device according to embodiment B13 or B14, where a potential at the field plate electrode (26) is the same as that at the source region (20).

Embodiment B16

A method for manufacturing a semiconductor device, the method including:

- forming a semiconductor layer (12) including a first surface (12A) and a second surface (12B) opposite to the first surface (12A);
- forming a trench (24) in the second surface (12B) of the semiconductor layer (12) that includes a side wall (24A) and a bottom wall (24B) and extends in a first direction in plan view;
- forming a field plate electrode (26) in the trench (24);
- forming a gate electrode (28) including a bottom surface (28A) at least partially facing the field plate electrode (26) in the trench (24);
- forming an insulation layer (30) that isolates the field plate electrode (26) and the gate electrode (28) from each other and covers the side wall (24A) and the bottom wall (24B) in the trench (24), where:

the forming the semiconductor layer (12) includes forming a drift region (16) of a first conductive type, and forming a body region (18) of a second conductive type on the drift region (16);

the forming the gate electrode (28) includes forming the gate electrode (28) that includes a bottom portion (32) including the bottom surface (28A) of the gate electrode (28) and a main portion (34) formed on the bottom portion (32), the gate electrode (28) having a width in a second direction that is orthogonal to both of a depth direction of the trench (24) and the first direction;

the forming the insulation layer (30) includes forming a gate insulator (36) that is located between the gate electrode (28) and the semiconductor layer (12) and covers the side wall (24A) in the trench (24);

the gate insulator (36) includes a first portion (36A) formed between the body region (18) and the main portion (34) of the gate electrode (28), and a second portion (36B) adjacent to the bottom portion (32) of the gate electrode (28); and the bottom portion (32) is narrower than the main portion (34), and the second portion (36B) is thicker than the first portion (36A) on the side wall (24A) of the trench (24).

Embodiment B17

The method according to embodiment B16, where the forming the insulation layer (30) includes:

embedding a first insulation layer (56) and a second insulation layer (60) that differ in etch rate in the trench (24); and etching the first insulation layer (56) and the second insulation layer (60) so that the second portion (36B) of the gate insulator (36) is thicker than the first portion (36A) on the side wall (24A) of the trench (24).

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A semiconductor device, comprising:

a semiconductor layer including a first surface and a second surface opposite to the first surface;

a trench that is formed in the second surface of the semiconductor layer, includes a side wall and a bottom wall, and extends in a first direction in plan view;

a field plate electrode formed in the trench;

a gate electrode formed in the trench, where the gate electrode includes a bottom surface at least partially facing the field plate electrode and having a thickness in a depth direction of the trench; and an insulation layer that isolates the field plate electrode and the gate electrode from each other and covers the side wall and the bottom wall in the trench, wherein:

the semiconductor layer includes a drift region of a first conductive type, and a body region of a second conductive type formed on the drift region; and an interface of the drift region and the body region lies between a lower end position of the gate electrode and a reference position that is located upward from the lower end position by ⅓ the thickness of the gate electrode in the depth direction.

2. The semiconductor device according to claim 1, wherein the interface of the drift region and the body region is aligned with the lower end position of the gate electrode in the depth direction.

3. The semiconductor device according to claim 1, wherein the gate electrode has a rectangular cross section.

4. The semiconductor device according to claim 1, wherein:

the gate electrode has a width in a second direction that is orthogonal to both of the depth direction and the first direction and includes a bottom portion including the bottom surface of the gate electrode and a main portion formed on the bottom portion; and the bottom portion is narrower than the main portion.

5. The semiconductor device according to claim 1, wherein the bottom surface of the gate electrode includes a recess, and the field plate electrode is partially accommodated in the recess.

6. The semiconductor device according to claim 1, wherein:

the bottom surface of the gate electrode is a flat surface that is orthogonal to the depth direction; and the lower end position of the gate electrode is where the bottom surface of the gate electrode is located.

7. The semiconductor device according to claim 1, wherein:

the bottom surface of the gate electrode is curved; and the lower end position of the gate electrode is where the bottom surface is the closest to the bottom wall of the trench in the depth direction.

8. The semiconductor device according to claim 1, wherein the semiconductor layer further includes a source region of the first conductive type formed on the body region, and the source region includes the second surface of the semiconductor layer.

9. The semiconductor device according to claim 8, wherein the trench extends through the source region and the body region to the drift region.

10. The semiconductor device according to claim 8, wherein a potential at the field plate electrode is the same as that at the source region.

11. A method for manufacturing a semiconductor device, the method comprising:

forming a semiconductor layer including a first surface and a second surface opposite to the first surface;

forming a trench in the second surface of the semiconductor layer that includes a side wall and a bottom wall and extends in a first direction in plan view;

forming a field plate electrode in the trench;

forming a gate electrode in the trench that includes a bottom surface at least partially facing the field plate electrode and has a thickness in a depth direction of the trench; and forming an insulation layer that isolates the field plate electrode and the gate electrode from each other and covers the side wall and the bottom wall in the trench, wherein:

the forming the semiconductor layer includes forming a drift region of a first conductive type, and forming a body region of a second conductive type on the drift region; and the forming the body region includes forming the body region so that an interface of the drift region and the body region lies between a lower end position of the gate electrode and a reference position that is located upward from the lower end position by ⅓ the thickness of the gate electrode in the depth direction.

12. The method according to claim 11, wherein the forming the body region includes forming the body region so that the interface of the drift region and the body region is aligned with the lower end position in the depth direction.

* * * * *